United States Patent
Kagawa et al.

(10) Patent No.: US 12,514,018 B2
(45) Date of Patent: Dec. 30, 2025

(54) IMAGING DEVICE

(71) Applicant: SONY SEMICONDUCTOR SOLUTIONS CORPORATION, Kanagawa (JP)

(72) Inventors: Yoshihisa Kagawa, Kanagawa (JP); Hiroshi Horikoshi, Kanagawa (JP); Masaki Haneda, Kanagawa (JP); Hiroshi Nakazawa, Kanagawa (JP); Takatoshi Kameshima, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 423 days.

(21) Appl. No.: 18/004,484

(22) PCT Filed: Jul. 8, 2021

(86) PCT No.: PCT/JP2021/025802
§ 371 (c)(1),
(2) Date: Jan. 6, 2023

(87) PCT Pub. No.: WO2022/014461
PCT Pub. Date: Jan. 20, 2022

(65) Prior Publication Data
US 2023/0282666 A1    Sep. 7, 2023

(51) Int. Cl.
*H01L 21/78* (2006.01)
*H10F 39/00* (2025.01)

(52) U.S. Cl.
CPC ......... *H10F 39/811* (2025.01); *H10F 39/809* (2025.01)

(58) Field of Classification Search
CPC .. H10F 39/811; H10F 39/809; H10F 39/8037; H10F 39/813; H10F 39/80;
(Continued)

(56) References Cited

U.S. PATENT DOCUMENTS 7,741,228 B2 * 6/2010 Ueki ................... H01L 21/7682
257/E21.573
8,674,425 B2 * 3/2014 Hwang ............. H01L 21/76834
257/315

(Continued)

FOREIGN PATENT DOCUMENTS

| JP | H10135442 A | 5/1998 |
| JP | 2008-193104 | 8/2008 |

(Continued)

OTHER PUBLICATIONS

International Search Report and Written Opinion prepared by the Japan Patent Office on Sep. 3, 2021, for International Application No. PCT/JP2021/025802, 3 pgs.

*Primary Examiner* — Vu A Vu
(74) *Attorney, Agent, or Firm* — SHERIDAN ROSS P.C.

(57) ABSTRACT

An imaging device according to an embodiment of the present disclosure includes: a first wiring layer; a first insulating film; and a second insulating film. The first wiring layer includes a plurality of first wiring lines that extends in one direction. The plurality of first wiring lines each has a notch at at least one of ends of one surface in a cross section orthogonal to an extending direction. The first insulating film covers a surface of the first wiring layer. The second insulating film is stacked on the first insulating film. The second insulating film forms a gap between the plurality of adjacent first wiring lines.

23 Claims, 57 Drawing Sheets

(58) Field of Classification Search
CPC ........... H01L 21/7682; H01L 21/76832; H01L 21/76834; H01L 23/5283; H04N 25/778; H04N 25/79; H04N 25/77; H04N 25/78
USPC ........................................................ 257/431
See application file for complete search history.

(56) References Cited

U.S. PATENT DOCUMENTS

| | | | |
|---|---|---|---|
| 9,105,693 B2* | 8/2015 | Edelstein | H01L 21/76852 |
| 9,123,727 B2* | 9/2015 | Fischer | H01L 21/764 |
| 9,287,198 B2* | 3/2016 | Yang | H01L 21/7682 |
| 9,390,966 B2* | 7/2016 | You | H01L 21/76849 |
| 9,401,305 B2* | 7/2016 | Takahashi | H01L 23/53266 |
| 9,514,981 B1* | 12/2016 | Badami | H01L 23/53209 |
| 9,929,099 B2* | 3/2018 | Nguyen | H01L 21/7682 |
| 10,658,232 B2* | 5/2020 | Chen | H01L 21/7682 |
| 11,018,085 B2* | 5/2021 | Inoue | H01L 23/5226 |
| 2009/0302473 A1 | 12/2009 | Shibata et al. | |
| 2013/0207267 A1* | 8/2013 | Rho | H01L 21/0217 257/E23.079 |
| 2016/0372415 A1 | 12/2016 | Siew | |
| 2019/0181178 A1 | 6/2019 | Takase | |
| 2020/0194301 A1 | 6/2020 | Wu et al. | |

FOREIGN PATENT DOCUMENTS

| | | |
|---|---|---|
| JP | 2009-123840 | 6/2009 |
| JP | 2009-188250 | 8/2009 |
| JP | 2019-110350 | 7/2019 |
| JP | 2020-096225 | 6/2020 |

\* cited by examiner

FIG. 14
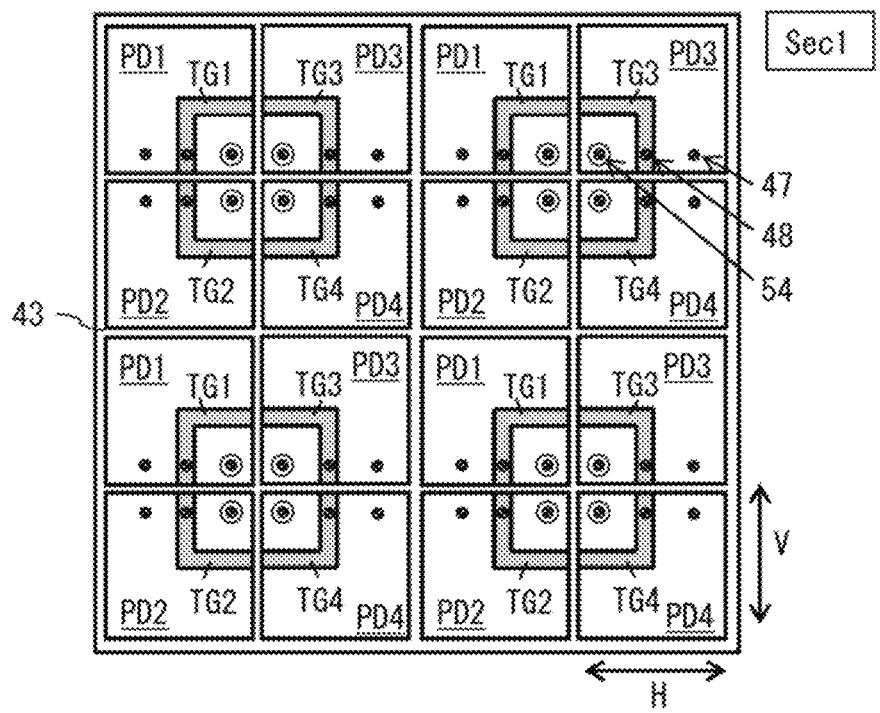
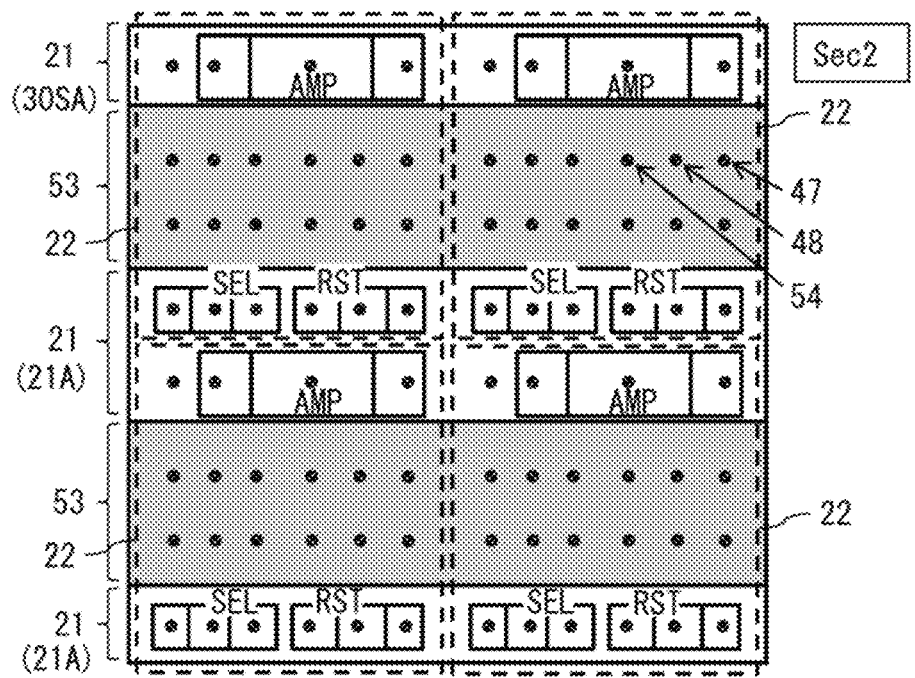

FIG. 36
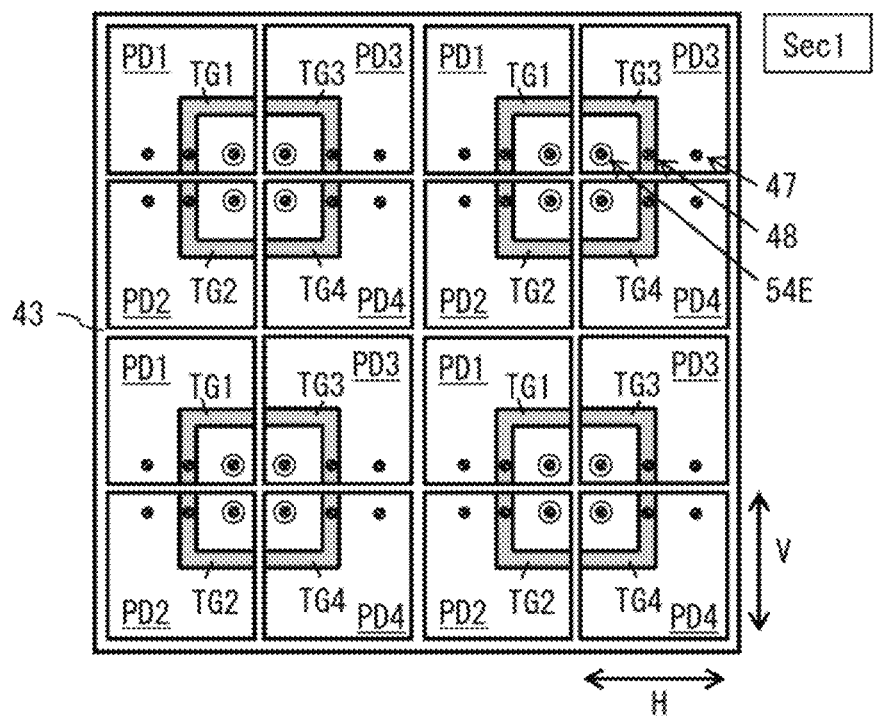
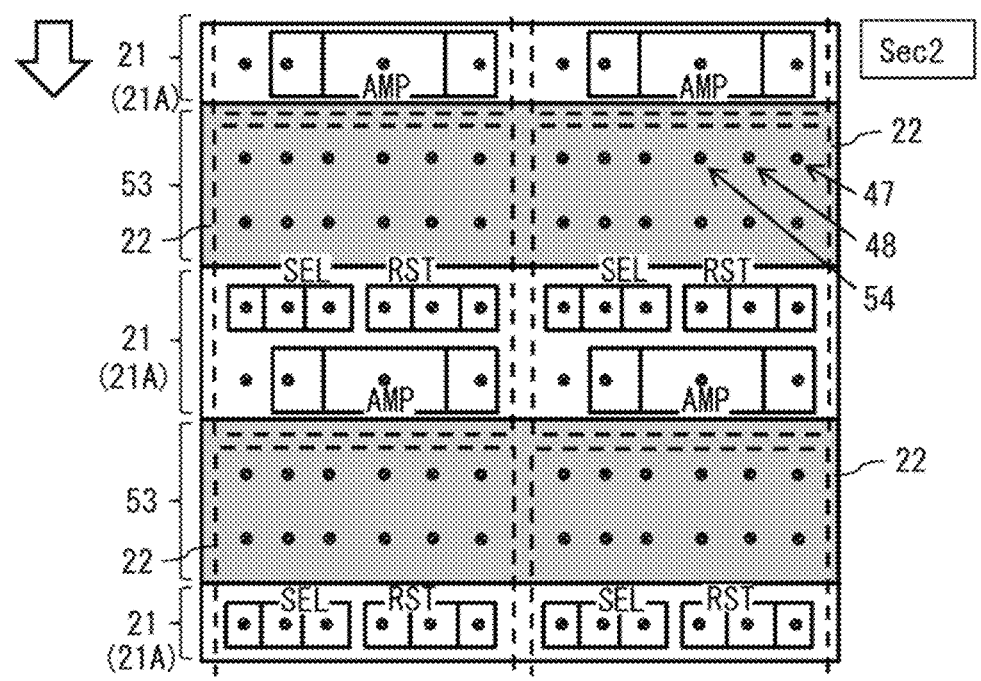

FIG. 37
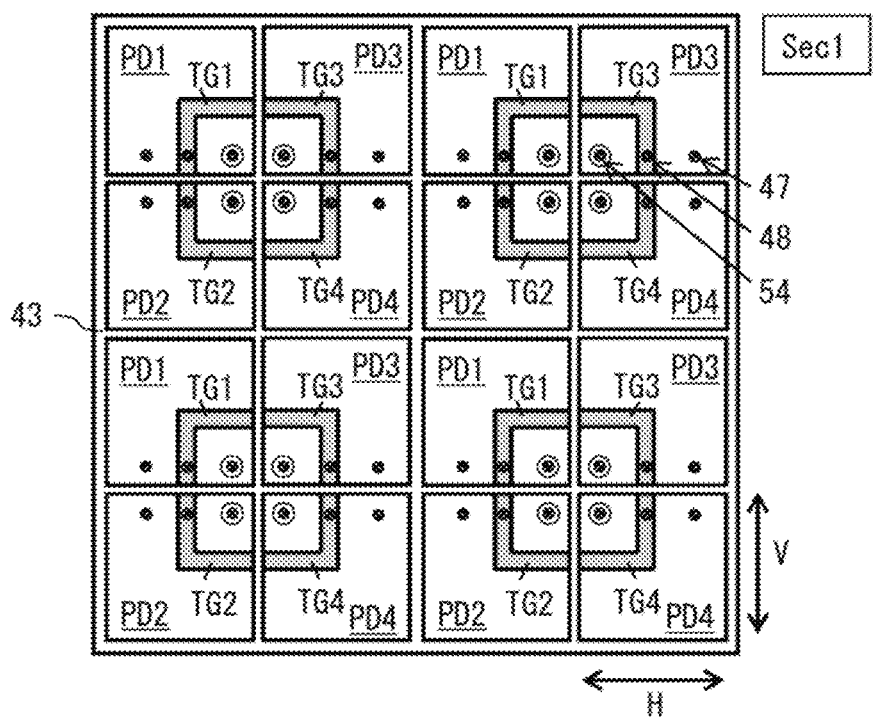
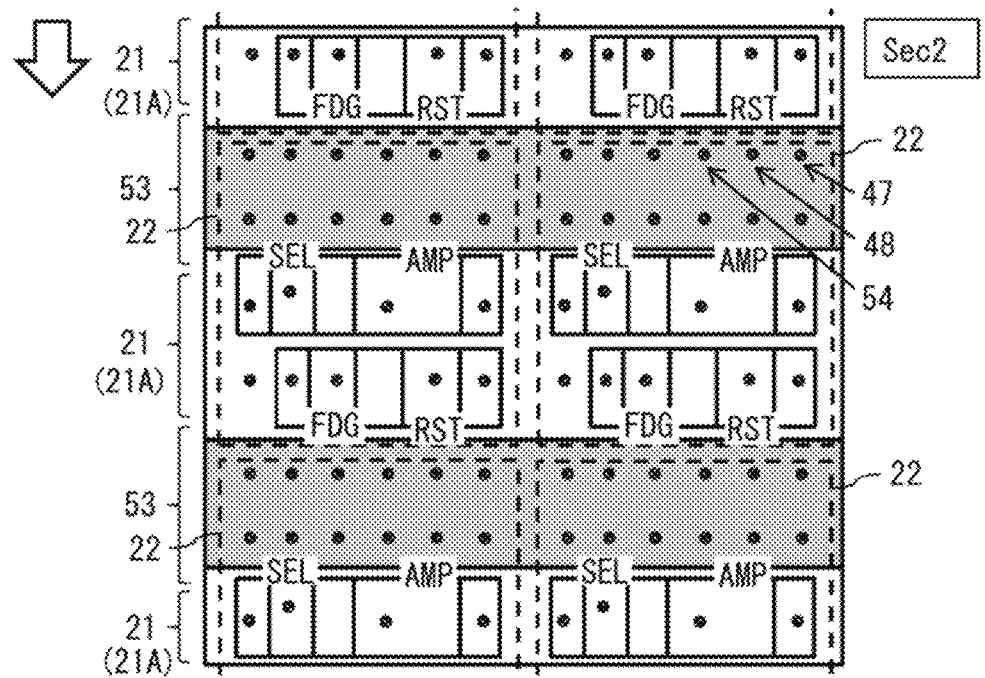

IMAGING DEVICE

CROSS REFERENCE TO RELATED APPLICATIONS

This application is a national stage application under 35 U.S.C. 371 and claims the benefit of PCT Application No. PCT/JP2021/025802, having an international filing date of 8 Jul. 2021, which designated the United States, which PCT application claimed the benefit of Japanese Patent Application No. 2020-121737, filed 15 Jul. 2020, the entire disclosures of each of which are incorporated herein by reference.

TECHNICAL FIELD

The present disclosure relates, for example, to an imaging device having a gap between wiring lines.

BACKGROUND ART

As finer semiconductor integrated circuit elements are made, the intervals between the elements and the intervals between wiring lines that connect the elements have been narrower in semiconductor devices. With respect to this, for example, PTL 1 discloses a semiconductor device having the capacitance reduced between wiring lines by forming a gap (air gap) between the wiring lines.

CITATION LIST

Patent Literature

PTL 1: Japanese Unexamined Patent Application Publication No. 2008-193104

SUMMARY OF THE INVENTION

Incidentally, in recent years, stacked image sensors have been gaining widespread use and it has been requested to increase reliability.

It is desirable to provide an imaging device that is allowed to have increased reliability.

An imaging device according to an embodiment of the present disclosure includes: a first wiring layer; a first insulating film; and a second insulating film. The first wiring layer includes a plurality of first wiring lines that extends in one direction. The plurality of first wiring lines each has a notch at at least one of ends of one surface in a cross section orthogonal to an extending direction. The first insulating film covers a surface of the first wiring layer. The second insulating film is stacked on the first insulating film. The second insulating film forms a gap between the plurality of adjacent first wiring lines.

The imaging device according to the embodiment of the present disclosure is provided with the notch at at least one of the ends of the one surface of each of the plurality of first wiring lines in the cross section orthogonal to the extending direction. The plurality of first wiring lines is included in the first wiring layer. The plurality of first wiring lines extends in the one direction. This increases the coverage of the first insulating film that covers the surface of the first wiring layer.

BRIEF DESCRIPTION OF DRAWING

FIG. 14 is a diagram illustrating an example of the cross-sectional configuration of the imaging device illustrated in FIG. 5 in the horizontal direction.

FIG. 36 is a diagram illustrating an example of a cross-sectional configuration of an imaging device according to a modification example 6 of the present disclosure in the horizontal direction.

FIG. 37 is a diagram illustrating another example of the cross-sectional configuration of the imaging device according to the modification example 6 of the present disclosure in the horizontal direction.

MODES FOR CARRYING OUT THE INVENTION

Figure 1:
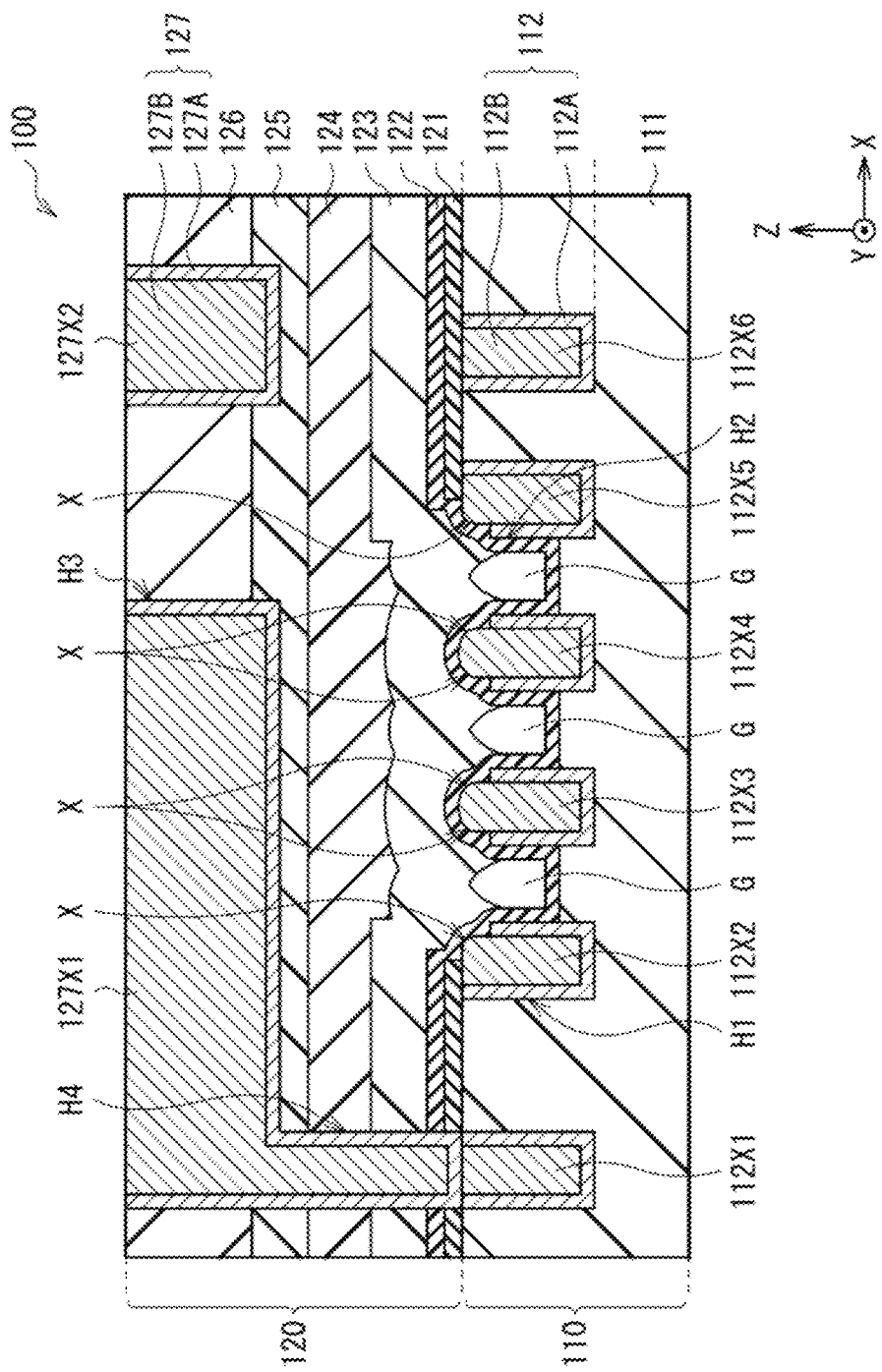
FIG. 1 is a schematic diagram illustrating an example of a cross-sectional configuration of a wiring structure according to a first embodiment of the present disclosure in a vertical direction.
Figure 2A:
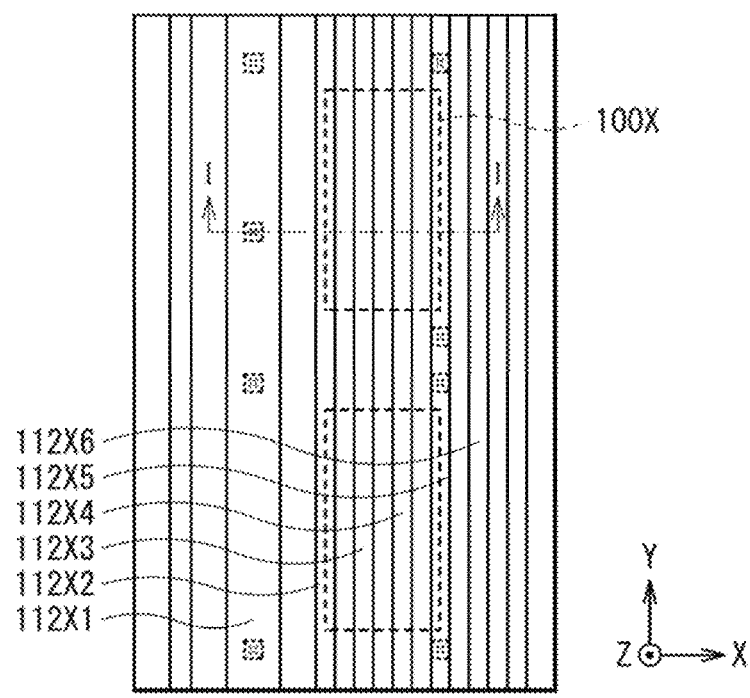
FIG. 2A is a schematic diagram illustrating an example of a cross-sectional configuration of the wiring structure illustrated in FIG. 1 in a horizontal direction.
Figure 2B:
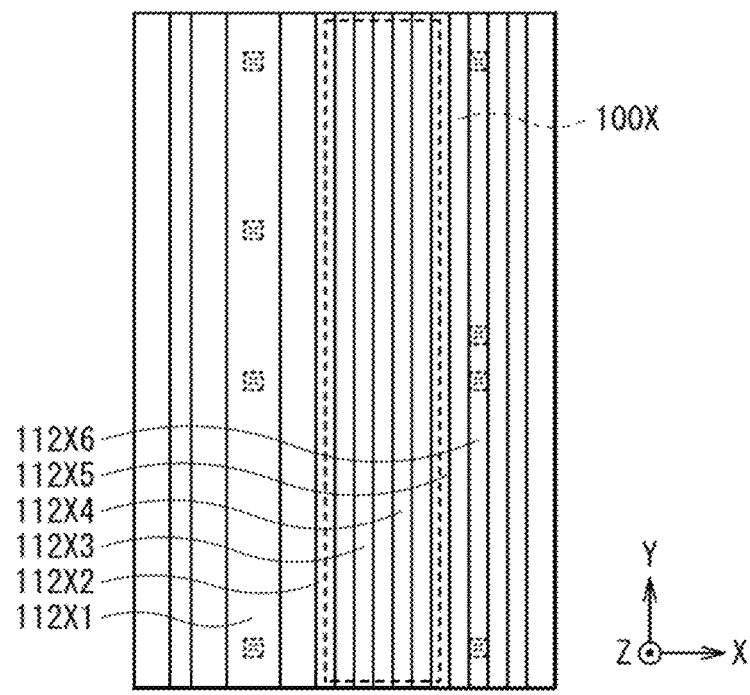
FIG. 2B is a schematic diagram illustrating another example of the cross-sectional configuration of the wiring structure illustrated in FIG. 1 in the horizontal direction.

The following describes an embodiment of the present disclosure in detail with reference to the drawings. The following description is a specific example of the present disclosure, but the present disclosure is not limited to the following modes. In addition, the present disclosure is not also limited to the disposition, dimensions, dimension ratios, and the like of the respective components illustrated in the respective diagrams. It is to be noted that description is given in the following order.
1. First Embodiment (An example of an imaging device having notches in upper surface sections of a plurality of wiring lines extending in one direction and having a gap between adjacent wiring lines)
   1-1. Configuration of Wiring Structure
   1-2. Method of Manufacturing Wiring Structure
   1-3. Configuration of Imaging Device
   1-4. Method of Manufacturing Imaging Device
   1-5. Workings and Effects
2. Modification Examples
   2-1. Modification Example 1 (Another example of a shape of a gap between wiring lines)
   2-2. Modification Example 2 (Another example of a shape of a gap between wiring lines)
   2-3. Modification Example 3 (Another example of a shape of a gap between wiring lines)
3. Second Embodiment (An example of an imaging device having a gap shape corresponding to a wiring interval)
4. Third Embodiment (An example of an imaging device in which a thickness of an insulating film between wiring lines is different in accordance with a wiring interval)
5. Modification Examples
   5-1. Modification Example 4 (An example in which planar TG is used)
   5-2. Modification Example 5 (An example in which Cu—Cu junction is used at a panel outer edge)
   5-3. Modification Example 6 (An example in which an offset is provided between a sensor pixel and a readout circuit)
   5-4. Modification Example 7 (An example in which a silicon substrate provided with a readout circuit has an island shape)
   5-5. Modification Example 8 (An example in which a silicon substrate provided with a readout circuit has an island shape)
   5-6. Modification Example 9 (An example in which FD is shared by eight sensor pixels)
   5-7. Modification Example 10 (An example in which a column signal processing circuit includes a typical column ADC circuit)
   5-8. Modification Example 11 (An example in which an imaging unit includes seven substrates that are stacked)
   5-9. Modification Example 12 (An example in which a logic circuit is provided on a first substrate and a second substrate)
   5-10. Modification Example 13 (An example in which a logic circuit is provided on a seventh substrate)
6. Application Examples
7. Practical Application Examples 1. First Embodiment FIG. 1 schematically illustrates an example of a cross-sectional configuration of a wiring structure (wiring structure 100) according to a first embodiment of the present disclosure in the vertical direction. FIG. 2A schematically illustrates an example of a cross-sectional configuration of the wiring structure 100 illustrated in FIG. 1 in the horizontal direction. FIG. 2B schematically illustrates another example of the cross-sectional configuration of the wiring structure 100 illustrated in FIG. 1 in the horizontal direction. In addition, FIG. 1 corresponds to a cross section taken along the I-I line illustrated in FIG. 2A. The wiring structure 100 has, for example, a multilayer wiring structure in which a plurality of wiring layers is stacked. The wiring structure 100 is applicable, for example, to an imaging device 1 described below.

In the wiring structure 100, an insulating film 123 and an insulating film 124 are stacked in this order on a wiring layer 112 including a plurality of wiring lines (e.g., a wiring line 112X1 to a wiring line 112X6) extending in one direction (e.g., the Y axis direction). The insulating film 123 forms respective gaps G, for example, between the adjacent wiring line 112X2 and wiring line 112X3, between the adjacent wiring line 112X3 and wiring line 112X4, and between the adjacent wiring line 112X4 and wiring line 112X5. The insulating film 124 has a planar surface.

In the wiring structure 100 according to the present embodiment, a notch X is formed in the upper surface section of the cross section (e.g., the cross section in the X axis direction) of a wiring line adjacent to the gap G out of a plurality of wiring lines (e.g., the wiring line 112X1 to the wiring line 112X6). The cross section (e.g., the cross section in the X axis direction) is orthogonal to the extending direction. If described in more detail, the notches X are formed at ends of the upper surfaces of the wiring lines 112X2 to 112X5 having the gaps G formed at the adjacent positions out of the wiring line 112X1 to the wiring line 112X6 in the wiring structure 100 according to the present embodiment. The upper surfaces and the side surfaces of these wiring lines 112X2 to 112X5 are structured to be covered with a continuous insulating film 122. The plurality of these wiring lines 112X1 to 112X6 and the wiring layer 112 respectively correspond to specific examples of a "first wiring line" and a "first wiring layer" according to the present disclosure. The insulating film 122 corresponds to a specific example of a "first insulating film" according to the present disclosure and the insulating film 123 corresponds to a specific example of a "second insulating film" according to the present disclosure.

1-1. Configuration of Wiring Structure

The wiring structure 100 has a configuration in which a first layer 110 and a second layer 120 are stacked in this order, for example on a silicon substrate (not illustrated) or the like. The first layer 110 includes an insulating film 111 and the wiring layer 112. The wiring layer 112 includes a plurality of wiring lines (e.g., the wiring line 112X1 to the wiring line 112X6) formed to be buried in the insulating film 111. The second layer 120 includes, for example, insulating films 121 to 126 and an electrically conducive film 127. The electrically conducive film 127 is buried, for example, in the insulating film 126 and a portion of the insulating film 125.

In the first layer 110, the wiring layer 112 including a plurality of wiring lines (e.g., the wiring line 112X1 to the wiring line 112X6) in the insulating film 111 is formed to be buried.

The insulating film 111 is formed by using, for example, a low dielectric constant material (Low-k material) having a relative dielectric constant (k) of 3.0 or less. Specifically, examples of a material of the insulating film 111 include SiOC, SiOCH, porous silica, SiOF, inorganic SOG, organic SOG, and organic polymers such as polyallyl ether.

The wiring layer 112 includes, for example, a plurality of wiring lines extending in one direction. The wiring layer 112 includes, for example, the wiring line 112X1 to the wiring line 112X6 extending in the Y axis direction. The wiring line 112X1 to the wiring line 112X6 are formed in parallel, for example, with Line (L)/Space (S)=40 to 200 nm/40 to 200 nm satisfied. The wiring line 112X1 to the wiring line 112X6 are formed to fill, for example, an opening H1 provided in the insulating film 111. The wiring line 112X1 to the wiring line 112X6 each include, for example, a barrier metal 112A formed on the side surfaces and the bottom surface of the opening H1 and a metal film 112B with which the opening H1 is filled. Examples of a material of the barrier metal 112A include Ti (titanium) or Ta (tantalum) alone, nitride, alloy thereof, or the like. Examples of a material of the metal film 112B include a metal material mainly including a low resistance metal such as Cu (copper), W (tungsten), or aluminum (Al).

The first layer 110 is further provided with openings H2 in the insulating film 111 between adjacent wiring lines. The respective gaps G described above are formed in the openings H2. Specifically, the first layer 110 is further provided with the openings H2 in the insulating film 111, for example, between the wiring line 112X2 and the wiring line 112X3, between the wiring line 112X3 and the wiring line 112X4, and between a wiring line 112V4 and the wiring line 112X5.

In the present embodiment, as described above, the notches X are formed in the upper surface sections of cross sections of a plurality of wiring lines (e.g., the wiring line 112X2 to wiring line 112X5) in the wiring layer 112 unlike the plurality of other wiring lines (e.g., the wiring lines 112X1 and 112X6). The cross sections of the plurality of wiring lines (e.g., the wiring line 112X2 to wiring line 112X5) are orthogonal to the extending direction. The plurality of wiring lines (e.g., the wiring line 112X2 to wiring line 112X5) has the above-described gaps G formed between a plurality of adjacent wiring lines. In other words, the wiring lines 112X1 and 112X6 having no gaps G formed at the adjacent positions each have a substantially rectangular shape as the shape of the cross section (the cross section in the X axis direction) orthogonal to the extending direction. In contrast, the wiring line 112X2 to the wiring line 112X5 having the gaps G formed at the adjacent positions each have a shape whose upper surface has a receding end on the side on which the gap G is formed. In other words, in a case where description is given by using the wiring structure illustrated in FIG. 1 as an example, the notches X are formed at both ends of the upper surfaces of the wiring lines 112X3 and 112X4 each having the gaps G formed on both sides. The notch X is formed on only one (the side on which the gap G is formed) of the sides of the upper surface of each of the wiring lines 112X2 and 112X5 each having a gap formed on only one of the sides. This increases the coverage of the insulating film 122 described below. For example, the occurrence of an electromigration defect is thus suppressed.

Figure 3A:
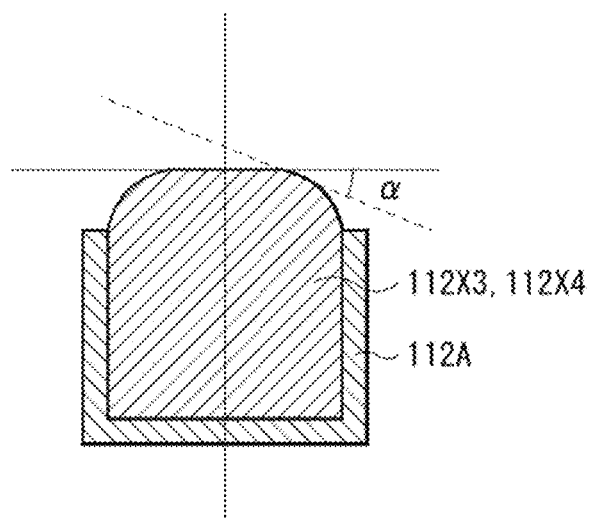
FIG. 3A is a diagram describing an example of a cross-sectional shape of a wiring line illustrated in FIG. 1.
Figure 3B:
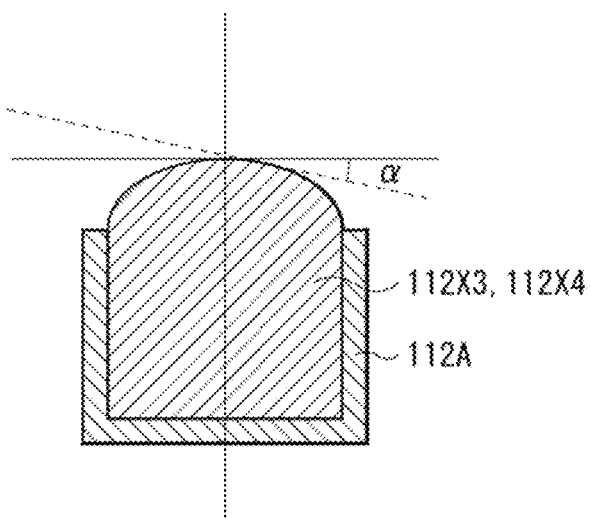
FIG. 3B is a diagram describing another example of the cross-sectional shape of the wiring line illustrated in FIG. 1.

Each of FIGS. 3A and 3B illustrates an example of the cross-sectional shape of each of wiring lines (wiring lines 112X3 and 112X4) having the notches X formed at both ends of the upper surface. It is sufficient as the shape of each of the notches X of each of the wiring lines 112X3 and 112X4 if the angle (a) formed between the planar direction (e.g., X axis direction) of the upper surface section orthogonal to the direction (Y axis direction) in which the wiring lines 112X3 and 112X4 stand and the tangent line of the notch X is greater than 0°. In other words, the cross-sectional shape of each of the wiring lines 112X3 and 112X4 each having the gaps G formed on both sides may be a shape having, on the top, a flat section that is parallel with the X axis direction, for example, as illustrated in FIG. 3A. Alternatively, the cross-sectional shape of each of the wiring lines 112X3 and 112X4 having the gaps G formed on both sides may be a substantially semicircular shape having the top, for example, in the middle of the wiring line, for example, as illustrated in FIG. 3B. In any of the cases, the insulating film 122 has increased coverage over the ends of the wiring lines 112X3 and 112X4.

It is to be noted that the notches X described above are formed in the metal films 112B included in the wiring line 112X2 to the wiring line 112X5. The barrier metal 112A that covers the side surfaces of each of the metal films 112B recedes to a point lower than or equal to the starting point of the notch X formed in the metal film 112B on the side surface side.

In the second layer 120, a plurality of insulating films (insulating films 121 to 126) is stacked and the electrically conducive film 127 is formed to be buried, for example, in the insulating film 126 that is the uppermost layer. Specifically, the insulating film 121, the insulating film 122, the insulating film 123, the insulating film 124, the insulating film 125, and the insulating film 126 are stacked in this order from the first layer 110 side. The openings H2 described above that are provided between the wiring line 112X2 and the wiring line 112X3, between the wiring line 112X3 and the wiring line 112X4, and between the wiring line 112V4 and the wiring line 112X5 are closed by the insulating film 123 included in the second layer 120. This forms the respective gaps G between the wiring line 112X2 and the wiring line 112X3, between the wiring line 112X3 and the wiring line 112X4, and between the wiring line 112V4 and the wiring line 112X5. The gaps G reduce the capacitance between wiring lines extending side by side. For example, as illustrated in FIGS. 2A and 2B, the gaps G are formed over partial regions or the entire regions between the wiring line 112X2 and the wiring line 112X3, between the wiring line 112X3 and the wiring line 112X4, and between the wiring line 112V4 and the wiring line 112X5 (gap formation regions 100X).

For example, in a case where the wiring line 112X1 to the wiring line 112X6 are formed by using copper (Cu), the insulating film 121 is for preventing the diffusion of the copper (Cu). The insulating film 121 is provided to cover the insulating film 111 except for the openings H2 described above, the wiring line 112X1 and the wiring line 112X6 that are formed to be buried, and portions of the wiring line 112X2 and the wiring line 112X5 that are provided with the opening H2 between the wiring lines. The insulating film 121 is formed by using, for example, silicon nitride ($SiN_x$), silicon carbide (SiC), $SiC_xN_y$, or the like.

For example, in a case where the wiring line 112X1 to the wiring line 112X6 are formed by using copper (Cu), the insulating film 122 is for preventing the diffusion of the copper (Cu) as with the insulating film 121. The insulating film 122 is provided on the insulating film 121. Further, the insulating film 122 is formed to extend and cover the side surfaces and the bottom surfaces of the openings H2. As described above, it is possible to form the insulating film 122 by using an insulating material that prevents the diffusion of copper (Cu) in a manufacturing method which is excellent in step difference coverage. Specifically, the insulating film 122 is formed by using, for example, silicon nitride ($SiN_x$), silicon carbide (SiC), $SiC_xN_y$, or the like, for example, in an ALD (Atomic Layer Deposition) method.

The insulating film 123 is provided on the insulating film 122. The insulating film 123 is for forming the gaps G in the openings H2. The insulating film 123 has low coverage and is formed by using, for example, a Low-k material having a relative dielectric constant (k) of 3.0 or less. Specifically, examples of a material of an insulating film 132A include SiOC, SiOCH, porous silica, SiOF, inorganic SOG, organic SOG, and organic polymers such as polyallyl ether.

The insulating film 124 is provided on the insulating film 123. The irregularities of the insulating film 123 above the gaps G are filled with the insulating film 124. Although described in detail below, the insulating film 124 is for forming a planar surface above the gaps G to allow a device to be stacked thereon by using hybrid bonding such as Cu—Cu junction. It is preferable to use a material that has, for example, a higher polishing rate than that of the insulating film 123 and has, for example, a relative dielectric constant (k) near 4.0 as a material of the insulating film 124. Examples of such a material include silicon oxide ($SiO_x$), SiOC, SiOF, SiON, and the like. It is to be noted that the insulating film 124 may be a single layer film including any one of the materials described above or may be formed as a stacked film including two or more of the materials described above.

The insulating film 125 is for reducing warpage brought about by stress generated in a case where the electrically conductive film 127 described below is formed. The insulating film 125 is formed, for example, in a CVD (Chemical vapor deposition) method. For example, it is possible to form the insulating film 125 by using, for example, silicon oxide ($SiO_x$), silicon nitride ($SiN_x$), or the like that has a relative dielectric constant (k) of 7.0 or more.

The insulating film 126 is provided on the insulating film 125. The insulating film 126 forms, for example, the junction surface between a second substrate 20 and a third substrate 30 of the imaging device 1 described below. It is preferable to use a material that has, for example, a higher polishing rate than that of the insulating film 123 and has, for example, a relative dielectric constant (k) near 4.0 as a material of the insulating film 126 to allow the junction surface to be planarized. Examples of such a material include silicon oxide ($SiO_x$), SiOC, SiOF, SiON, and the like. It is to be noted that the insulating film 126 may be a single layer film including any one of the materials described above or may be formed as a stacked film including two or more of the materials described above.

The electrically conductive film 127 is a wiring layer that is provided right above the wiring layer 112 including, for example, the wiring line 112X1 to the wiring line 112X6 extending in one direction. For example, the electrically conductive film 127 is formed to fill an opening H3 therewith. The electrically conductive film 127 forms a plane flush with the insulating film 126. The opening H3 is provided in the insulating film 126 and a portion of the insulating film 125. This electrically conductive film 127 corresponds to a specific example of a "first electrically conductive film" according to the present disclosure.

The electrically conductive film 127 includes a plurality of electrically conductive films (e.g., an electrically conductive film 127X1 and an electrically conductive film 127X2). For example, a portion of the electrically conductive film 127 is provided to extend in one direction and be right opposed to at least a portion of the wiring line 112X1 to the wiring line 112X6. As an example, in FIG. 1, the electrically conductive film 127X1 is formed, for example, at a position right opposed to the wiring line 112X2, the wiring line 112X3, and the wiring line 112X4 to extend in the Y axis direction, for example, as with the wiring line 112X2 and the wiring line 112X3. The wiring line 112X2, the wiring line 112X3, and the wiring line 112X4 have the gaps G between the wiring lines. In addition, there is provided an opening H4 in the opening H3. The opening H4 extends through the insulating film 121 to the insulating film 125 and reaches the wiring line 112X1. This opening H4 is also filled with the electrically conductive film 127X1 and the electrically conductive film 127X1 is electrically coupled to the wiring line 112X1. Although described below in detail, this makes it possible to use, for example, the electrically conductive film 127X1 as a shield wiring line.

The electrically conductive film 127 includes a barrier metal 127A formed on the side surfaces and the bottom surfaces of the opening H3 and the opening H4 and a metal film 127B with which the opening H3 and the opening H4 are filled. Examples of a material of the barrier metal 127A include Ti (titanium) or Ta (tantalum) alone, nitride, alloy thereof, or the like. Examples of a material of the metal film 127B include a metal material mainly including a low resistance metal such as Cu (copper), W (tungsten), or aluminum (Al).

1-2. Method of Manufacturing Wiring Structure

Figure 4A:
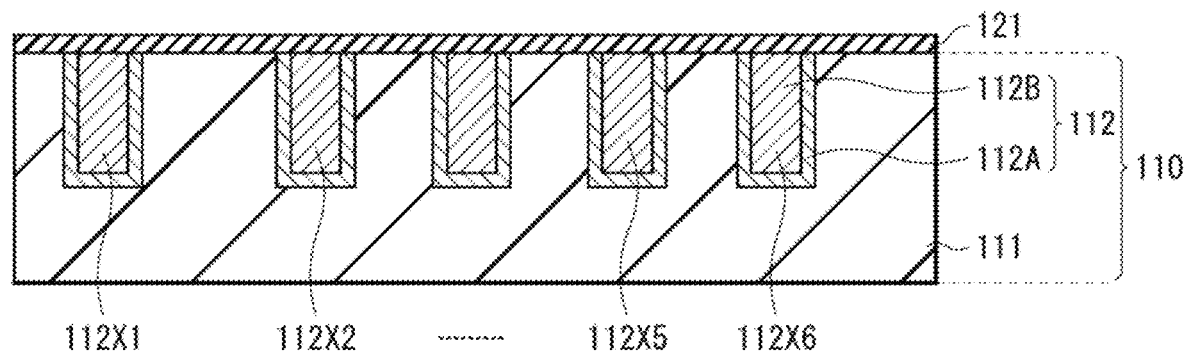
FIG. 4A is a cross-sectional schematic diagram illustrating an example of a process of manufacturing the wiring structure illustrated in FIG. 1.

First, the wiring layer 112 including the wiring line 112X1 to the wiring line 112X6 is formed to be buried in the insulating film 111 and a surface thereof is then polished by using, for example, a CMP (Chemical Mechanical Polishing) method to form the first layer 110. Subsequently, as illustrated in FIG. 4A, the insulating film 121 is formed on the first layer 110 by using, for example, a PVD (Physical Vapor Deposition) method or a CVD (Chemical Vapor Deposition) method to have, for example, a thickness of 5 nm to 250 nm.

Figure 4B:
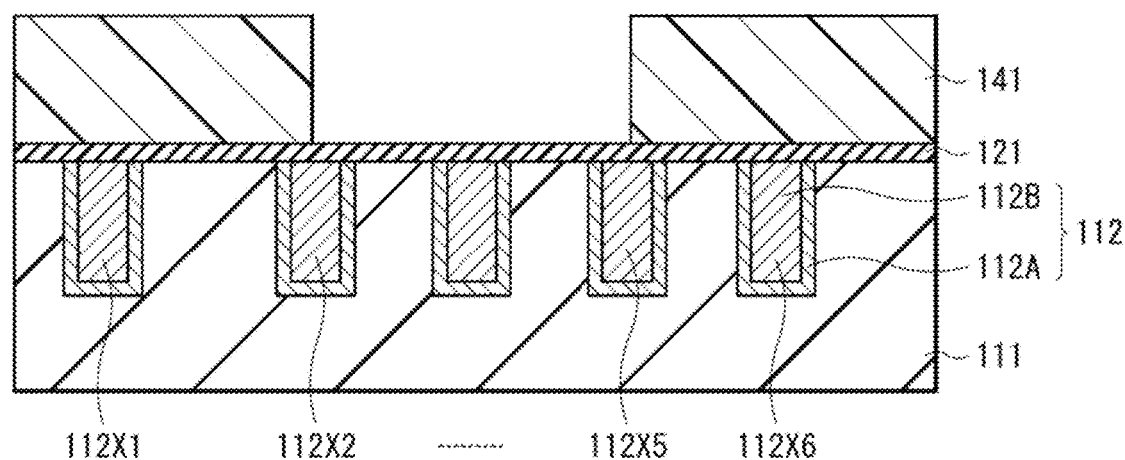
FIG. 4B is a cross-sectional schematic diagram illustrating an example of a manufacturing process subsequent to FIG. 4A.
Figure 4C:
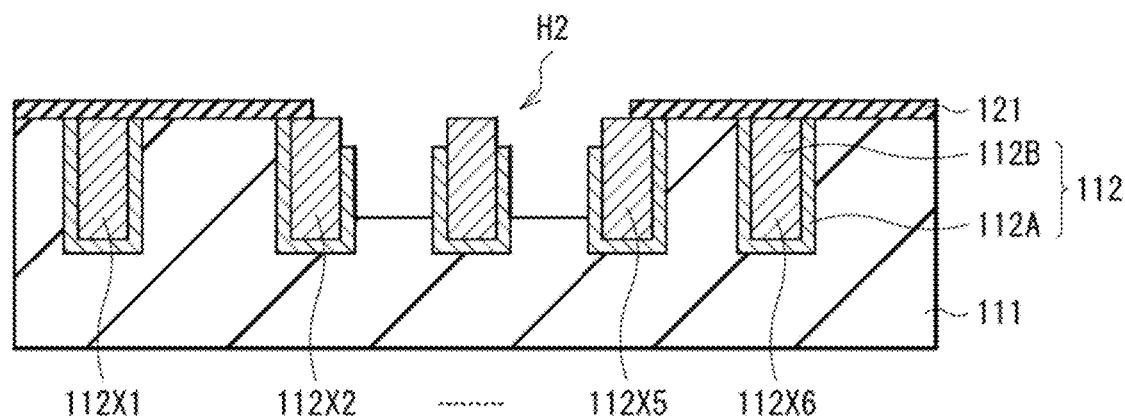
FIG. 4C is a cross-sectional schematic diagram illustrating an example of a manufacturing process subsequent to FIG. 4B.

Next, as illustrated in FIG. 4B, a resist film 141 having an opening at a position corresponding to the wiring line 112X2 to the wiring line 112X5 is patterned on the insulating film 121 by using a photolithography technology. Subsequently, as illustrated in FIG. 4C, the insulating film 121, portions of the wiring line 112X2 to the wiring line 112X5, and the insulating film 111 exposed from the resist film 141 are subjected, for example, to dry etching to form the openings H2.

Figure 4D:
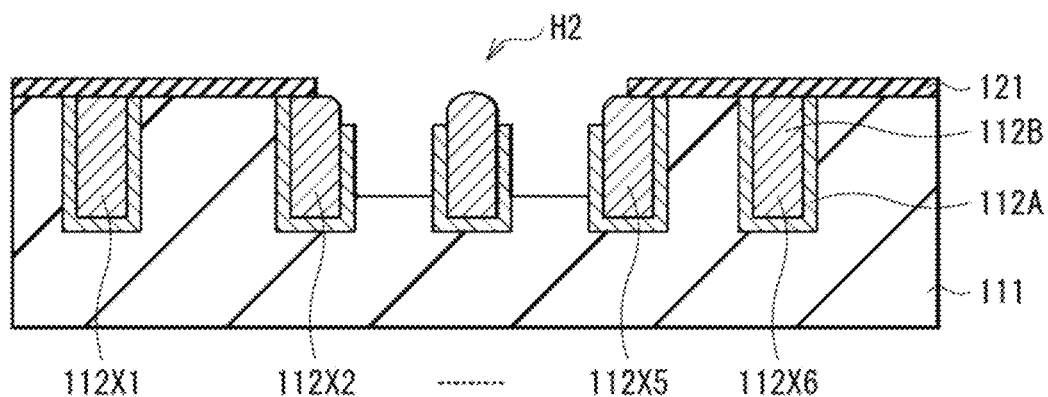
FIG. 4D is a cross-sectional schematic diagram illustrating an example of a manufacturing process subsequent to FIG. 4C.

Next, as illustrated in FIG. 4D, the damaged portions of a wiring line 121X2 to the wiring line 112X5 caused by the dry etching described above are removed by wet etching in which, for example, an etching solution is used such as hydrofluoric acid, fluoro-nitric acid, ammonium fluoride, or aqueous alkaline hydrogen peroxide. This forms the notches X as illustrated in FIG. 1 or the like at ends of the upper surfaces of the wiring line 121X2 to the wiring line 112X5. It is to be noted that it is possible to remove these damaged portions by using dry etching in which the surfaces are sputtered by using, for example, an inert gas such as argon (Ar) in addition to the wet etching.

Figure 4E:
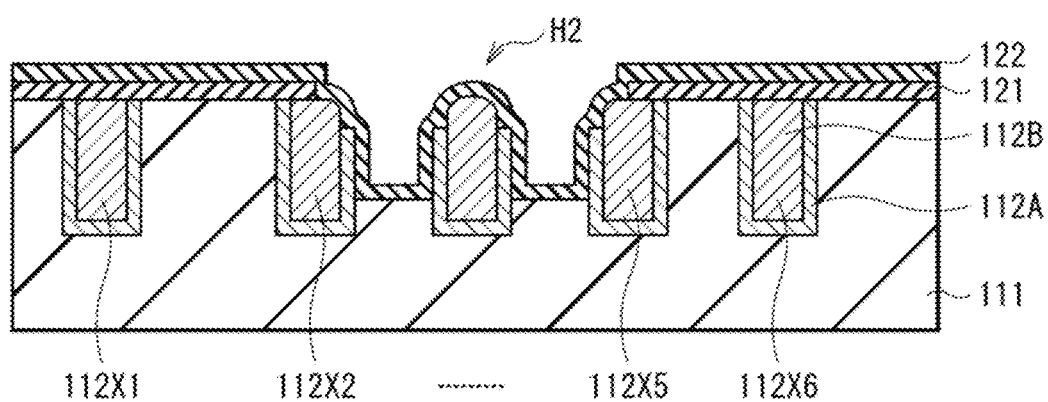
FIG. 4E is a cross-sectional schematic diagram illustrating an example of a manufacturing process subsequent to FIG. 4D.
Figure 4F:
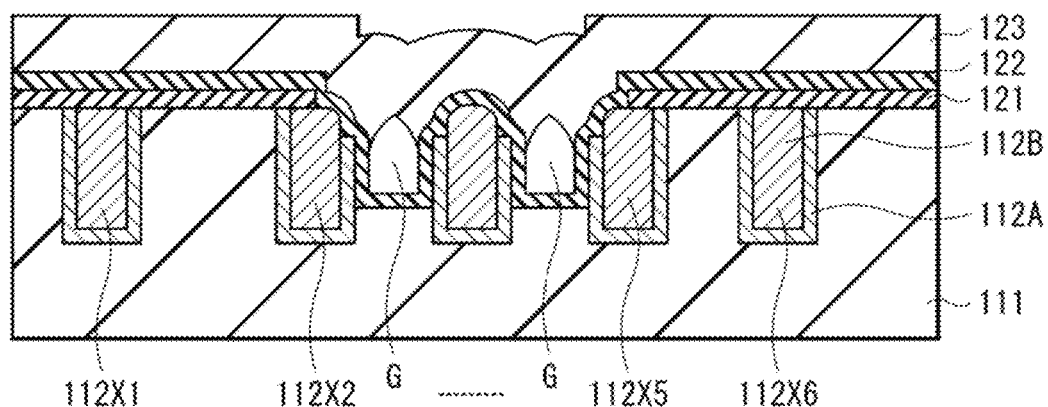
FIG. 4F is a cross-sectional schematic diagram illustrating an example of a manufacturing process subsequent to FIG. 4E.

Next, the resist film 141 is removed and the insulating film 122 that covers the top of the insulating film 121 and the side surfaces and the bottom surface of each of the openings H2 is then formed by using, for example, an ALD method as illustrated in FIG. 4E to have, for example, a thickness of 0.5 nm or 15 nm. Subsequently, as illustrated in FIG. 4F, the insulating film 123 having, for example, a film thickness of 100 nm to 500 nm is formed by using, for example, a CVD method. The insulating film 123 includes, for example, SiOC or silicon nitride. This closes the openings H2 and forms the gaps G between the wiring line 112X2 and the wiring line 112X3, between the wiring line 112X3 and the wiring line 112X4, and between the wiring line 112X4 and a wiring line 112V5.

Figure 4G:
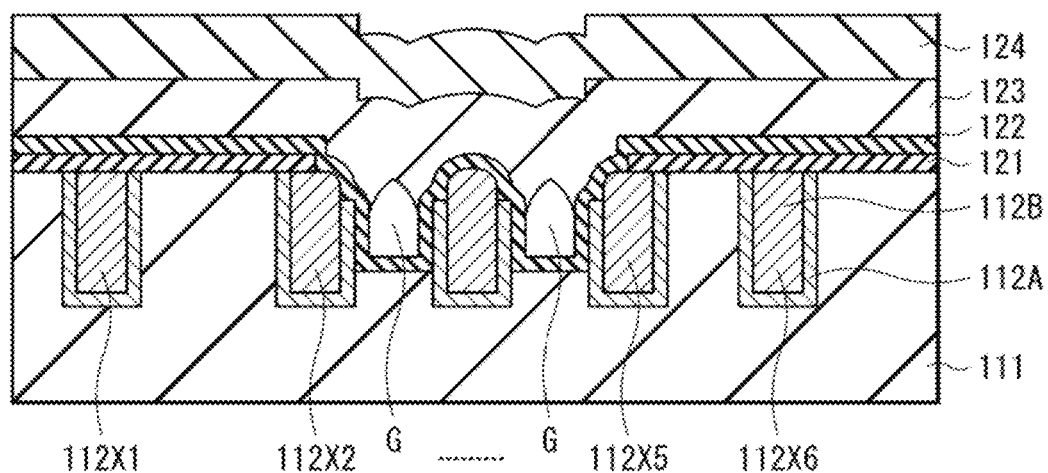
FIG. 4G is a cross-sectional schematic diagram illustrating an example of a manufacturing process subsequent to FIG. 4F.
Figure 4H:
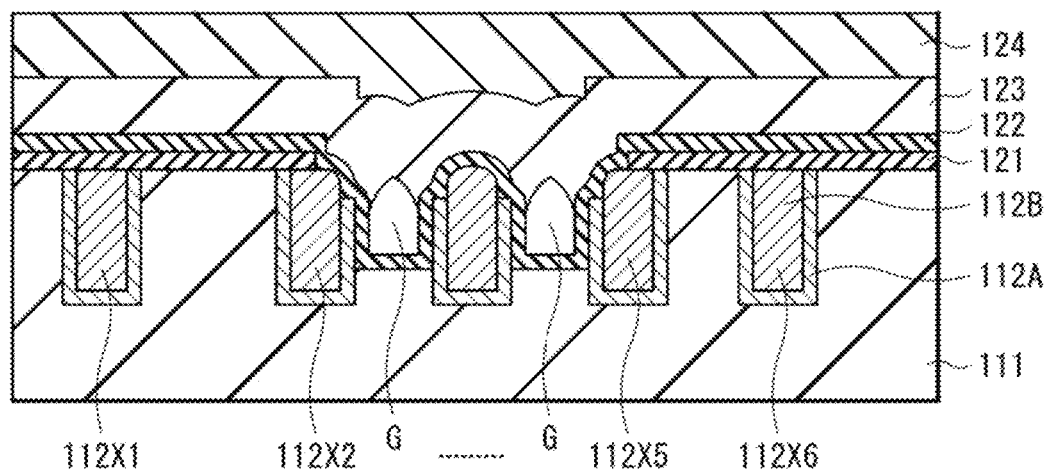
FIG. 4H is a cross-sectional schematic diagram illustrating an example of a manufacturing process subsequent to FIG. 4G.

Next, as illustrated in FIG. 4G, the insulating film 124 is formed on the insulating film 123 by using, for example, a CVD method. The insulating film 124 includes, for example, $SiO_x$. The insulating film 124 has, for example, a film thickness of 200 nm to 300 nm. Subsequently, the insulating film 124 is polished by using, for example, a CMP method as illustrated in FIG. 4H and a surface thereof is planarized.

Next, the insulating film 125 is formed on the insulating film 124 by using, for example, a CVD method to have, for example, a thickness of 50 nm to 500 nm and the insulating film 126 is then formed on the insulating film 125, for example, in a CVD method to have, for example, a thickness of 100 nm to 2 μm. Subsequently, the insulating film 126 and a portion of the insulating film 125 are subjected, for example, to dry etching to form the opening H3 by using a method similar to that of the opening H2 and then the opening H4 is further formed in the opening H3. The opening H4 extends through the insulating film 121 to the insulating film 125 and reaches the wiring line 112X1. After that, the barrier metal 127A is formed on the side surfaces and the bottom surfaces of the opening H3 and the opening H4 by using, for example, sputtering and the metal film 127B is then formed in the opening H3 and the opening H4 by using, for example, plating. Finally, the barrier metal 127A and the metal film 127B formed on the insulating film 126 are polished and removed to form a planar surface that causes the insulating film 126 and the electrically conducive film 127 to have a flush plane. As described above, the wiring structure 100 illustrated in FIG. 1 is completed.

1-3. Configuration of Imaging Device

Figure 5:
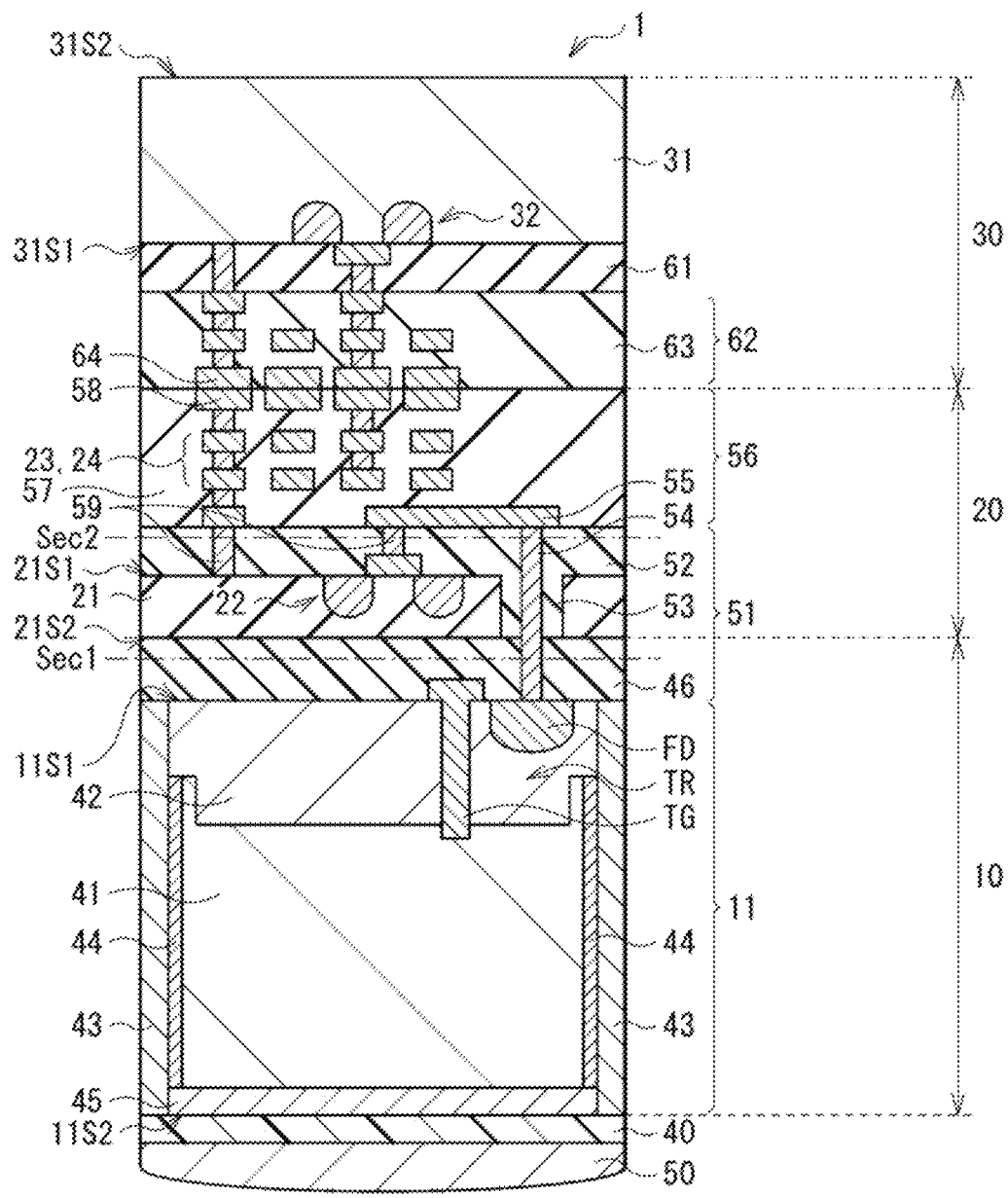
FIG. 5 is a diagram illustrating an example of a cross-sectional configuration of an imaging device according to the first embodiment of the present disclosure in the vertical direction.
Figure 6:
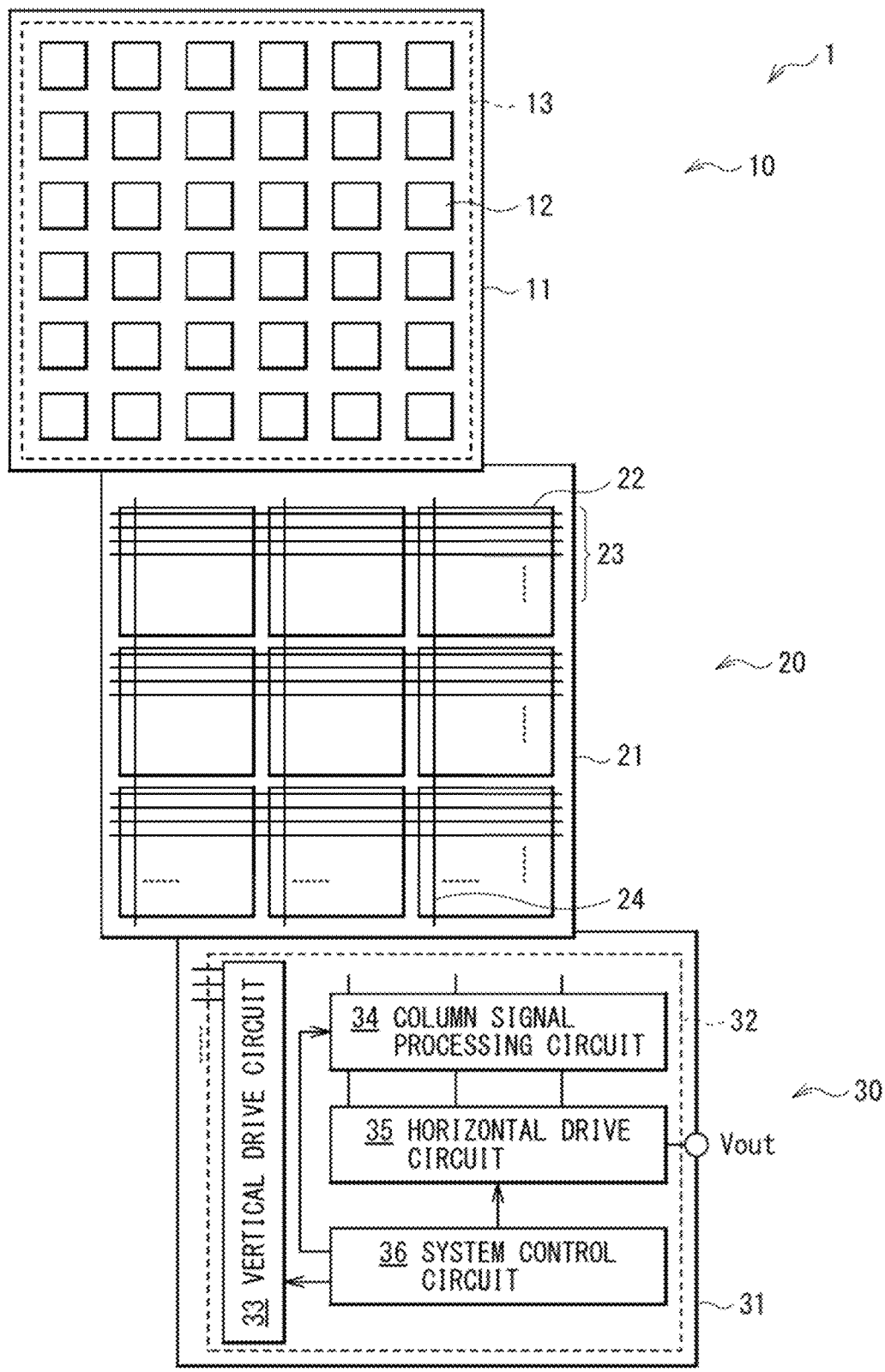
FIG. 6 is a diagram illustrating an example of a schematic configuration of the imaging device illustrated in FIG. 5.
Figure 7:
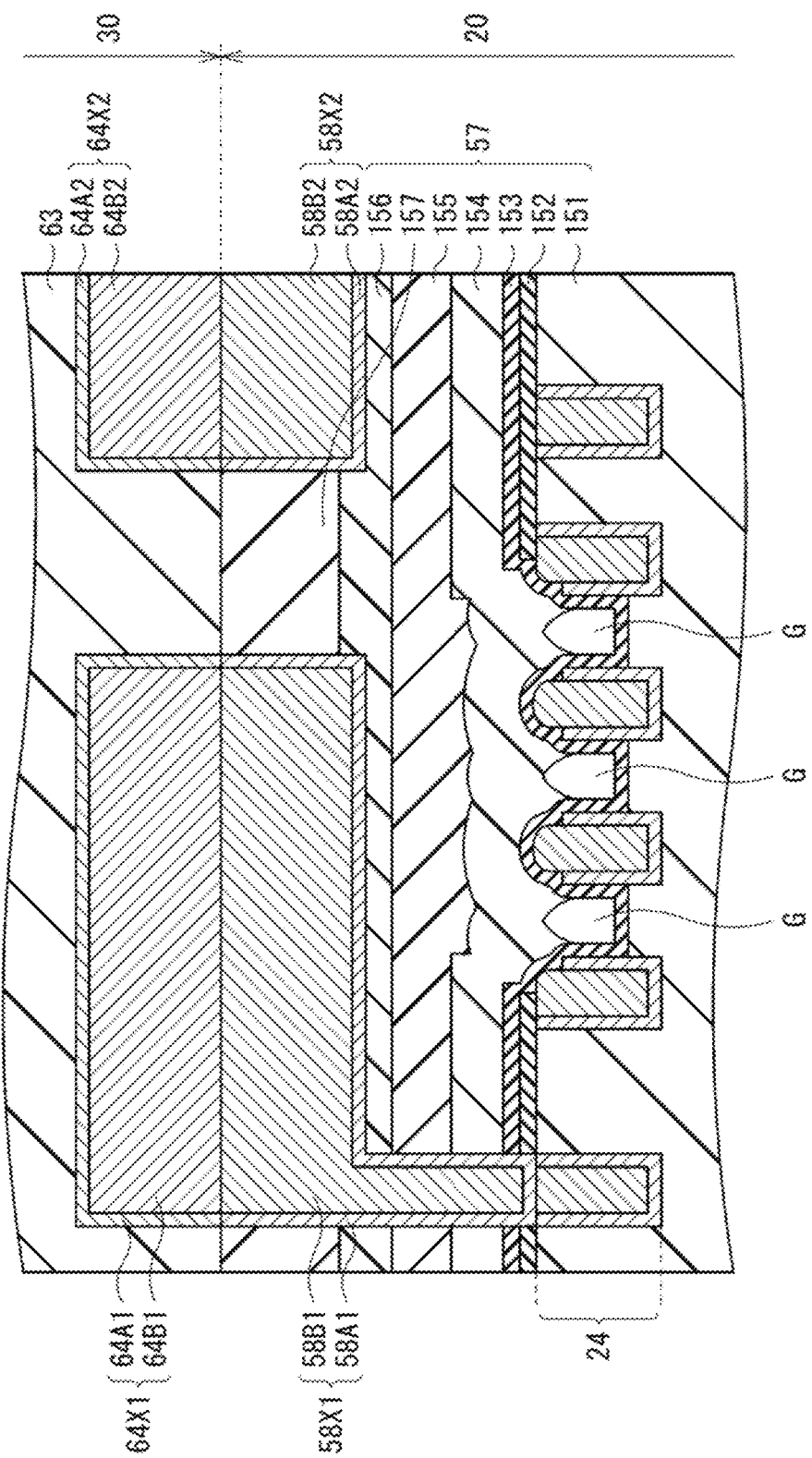
FIG. 7 is a diagram for application of the wiring structure illustrated in FIG. 1 to the imaging device illustrated in FIG. 5.

FIG. 5 illustrates an example of a cross-sectional configuration of an imaging device (imaging device 1) according to an embodiment of the present disclosure in the vertical direction. FIG. 6 illustrates an example of a schematic configuration of the imaging device 1 illustrated in FIG. 5. The imaging device 1 is an imaging device having a three-dimensional structure in which a first substrate 10, the second substrate 20, and the third substrate 30 are stacked. The first substrate 10 includes a sensor pixel 12 on a semiconductor substrate 11. The sensor pixel 12 performs photoelectric conversion. The second substrate 20 includes a readout circuit 22 on a semiconductor substrate 21. The readout circuit 22 outputs an image signal based on electric charge outputted from the sensor pixel 12. The third substrate 30 includes a logic circuit 32 on a semiconductor substrate 31. The logic circuit 32 processes a pixel signal. For example, as illustrated in FIG. 7, the wiring structure 100 is applied to a wiring structure (e.g., a vertical signal line 24) near the junction surface of the second substrate 20 that is joined to the third substrate 30.

As described above, the first substrate 10 includes the plurality of sensor pixels 12 on the semiconductor substrate 11. Each of the plurality of sensor pixels 12 performs photoelectric conversion. The semiconductor substrate 11 corresponds to a specific example of a "first semiconductor substrate" according to the present disclosure. The plurality of sensor pixels 12 is provided in a matrix in a pixel region 13 on the first substrate 10. The second substrate 20 includes the one readout circuit 22 for every four sensor pixels 12 on the semiconductor substrate 21. The readout circuit 22 outputs a pixel signal based on electric charge outputted from each of the sensor pixels 12. The semiconductor substrate 21 corresponds to a specific example of a "second semiconductor substrate" according to the present disclosure. The second substrate 20 includes a plurality of pixel drive lines 23 extending in the row direction and a plurality of vertical signal lines 24 extending in the column direction. The third substrate 30 includes a logic circuit 32 on a semiconductor substrate 31. The logic circuit 32 processes a pixel signal. The semiconductor substrate 31 corresponds to a specific example of a "third semiconductor substrate" according to the present disclosure. The logic circuit 32 includes, for example, a vertical drive circuit 33, a column signal processing circuit 34, a horizontal drive circuit 35, and a system control circuit 36. The logic circuit 32 (specifically, the horizontal drive circuit 35) outputs an output voltage Vout for each of the sensor pixels 12 to the outside. In the logic circuit 32, for example, a low resistance region that includes a silicide and is formed by using a Salicide (Self Aligned Silicide) process such as $CoSi_2$ and NiSi may be formed on the surface of an impurity diffusion region in contact with a source electrode and a drain electrode.

The vertical drive circuit 33 selects, for example, the plurality of sensor pixels 12 row by row in order. The column signal processing circuit 34 performs, for example, a correlated double sampling (Correlated Double Sampling: CDS) process on a pixel signal outputted from each of the sensor pixels 12 in a row selected by the vertical drive circuit 33. The column signal processing circuit 34 performs, for example, the CDS process, thereby extracting the signal level of the pixel signal. The column signal processing circuit 34 holds pixel data corresponding to the amount of light received by each of the sensor pixels 12. The horizontal drive circuit 35 outputs, for example, the pieces of pixel data held in the column signal processing circuit 34 to the outside in order. The system control circuit 36 controls, for example, the driving of each of the blocks (the vertical drive circuit 33, the column signal processing circuit 34, and the horizontal drive circuit 35) in the logic circuit 32.

Figure 8:
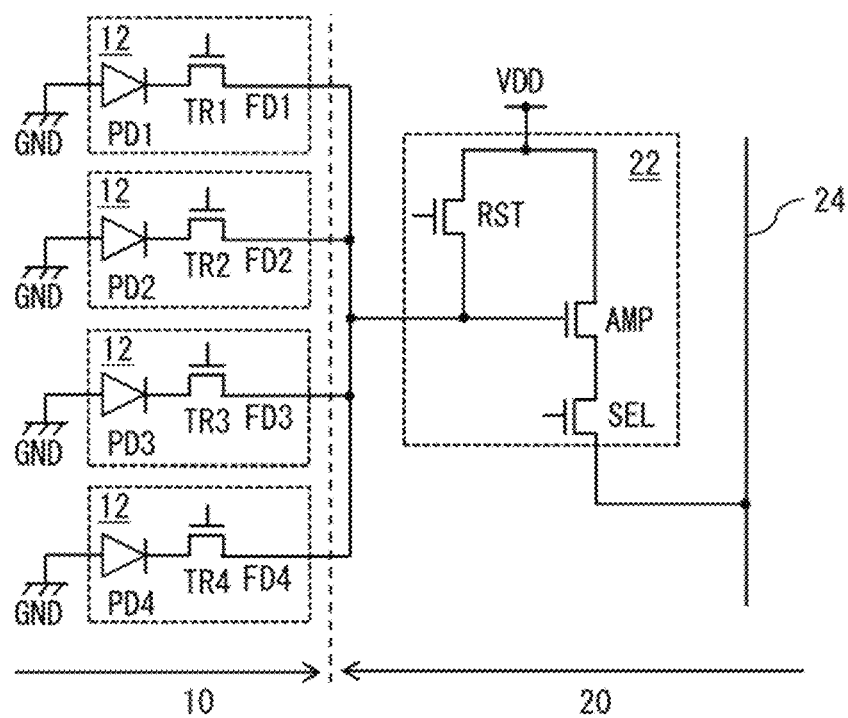
FIG. 8 is a diagram illustrating an example of a sensor pixel and a readout circuit illustrated in FIG. 6.

FIG. 8 illustrates examples of the sensor pixel 12 and the readout circuit 22. The following describes a case where the four sensor pixels 12 share the one readout circuit 22 as illustrated in FIG. 8. Here, the "share" means that outputs of the four sensor pixels 12 are inputted to the common readout circuit 22.

Each of the sensor pixels 12 includes mutually common components. In FIG. 8, to distinguish components of the respective sensor pixels 12 from each other, an identification number (1, 2, 3, or 4) is assigned to the end of the symbol of a component of each of the sensor pixels 12. In a case where the components of the respective sensor pixels 12 have to be distinguished from each other, the following assigns an identification number at the end of the symbol of a component of each of the sensor pixels 12. However, in a case where there is no need to distinguish the components of the respective sensor pixels 12 from each other, an identification number at the end of the symbol of a component of each of the sensor pixels 12 is omitted.

Each of the sensor pixels 12 includes, for example, a photodiode PD, a transfer transistor TR electrically coupled to the photodiode PD, and a floating diffusion FD that temporarily holds electric charge outputted from the photodiode PD through the transfer transistor TR. The photodiode PD performs photoelectric conversion to generate electric charge corresponding to the amount of received light. The cathode of the photodiode PD is electrically coupled to the source of the transfer transistor TR and the anode of the photodiode PD is electrically coupled to a reference potential line (e.g., the ground). The drain of the transfer transistor TR is electrically coupled to the floating diffusion FD and the gate of the transfer transistor TR is electrically coupled to the pixel drive line 23. The transfer transistor TR is, for example, a CMOS (Complementary Metal Oxide Semiconductor) transistor.

The floating diffusions FD of the respective sensor pixels 12 that share the one readout circuit 22 are electrically coupled to each other and are electrically coupled to the input end of the common readout circuit 22. The readout circuit 22 includes, for example, a reset transistor RST, a selection transistor SEL, and an amplification transistor AMP. It is to be noted that the selection transistor SEL may be omitted as necessary. The source of the reset transistor RST (the input end of the readout circuit 22) is electrically coupled to the floating diffusion FD and the drain of the reset transistor RST is electrically coupled to a power supply line VDD and the drain of the amplification transistor AMP. The gate of the reset transistor RST is electrically coupled to the pixel drive line 23. The source of the amplification transistor AMP is electrically coupled to the drain of the selection transistor SEL and the gate of the amplification transistor AMP is electrically coupled to the source of the reset transistor RST. The source of the selection transistor SEL (the output end of the readout circuit 22) is electrically coupled to the vertical signal line 24 and the gate of the selection transistor SEL is electrically coupled to the pixel drive line 23.

In a case where the transfer transistor TR is turned on, the transfer transistor TR transfers the electric charge of the photodiode PD to the floating diffusion FD. The gate (transfer gate TG) of the transfer transistor TR extends to penetrate a p-well layer 42 from the surface of the semiconductor substrate 11 to such a depth as to reach PD 41, for example, as illustrated in FIG. 5. The reset transistor RST resets the electric potential of the floating diffusion FD to a predetermined electric potential. In a case where the reset transistor RST is turned on, the electric potential of the floating diffusion FD is reset to the electric potential of the power supply line VDD. The selection transistor SEL controls the timing of outputting a pixel signal from the readout circuit 22. The amplification transistor AMP generates, as a pixel signal, a signal of a voltage corresponding to the level of electric charge held in the floating diffusion FD. The amplification transistor AMP is included in a source-follower type amplifier and outputs a pixel signal of a voltage corresponding to the level of electric charge generated in the photodiode PD. In a case where the selection transistor SEL is turned on, the amplification transistor AMP amplifies the electric potential of the floating diffusion FD and outputs a voltage corresponding to the electric potential to the column signal processing circuit 34 through the vertical signal line 24. The reset transistor RST, the amplification transistor AMP, and the selection transistor SEL are, for example, CMOS transistors.

Figure 9:
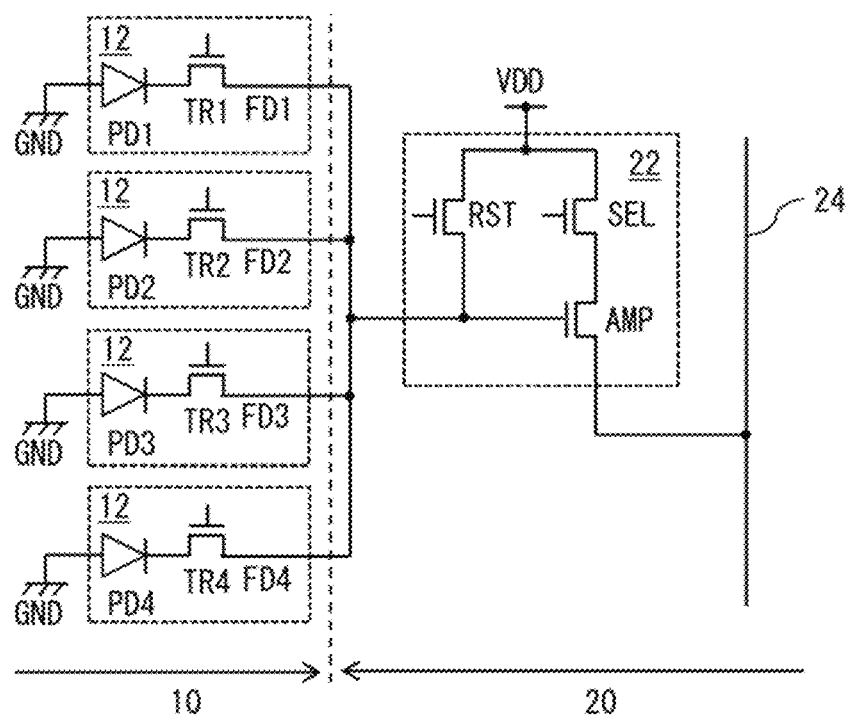
FIG. 9 is a diagram illustrating an example of the sensor pixel and the readout circuit illustrated in FIG. 6.
Figure 10:
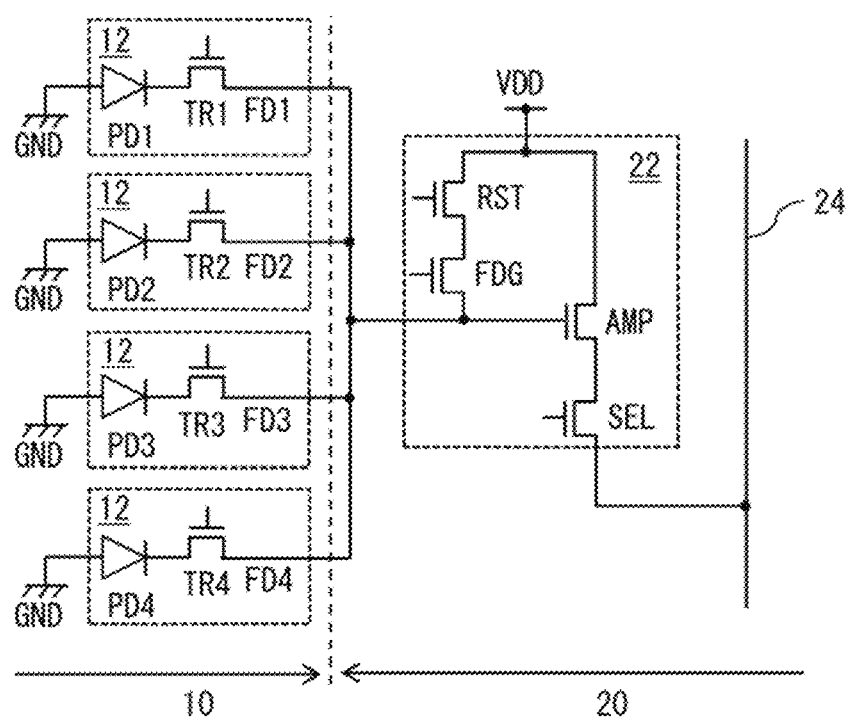
FIG. 10 is a diagram illustrating an example of the sensor pixel and the readout circuit illustrated in FIG. 6.
Figure 11:
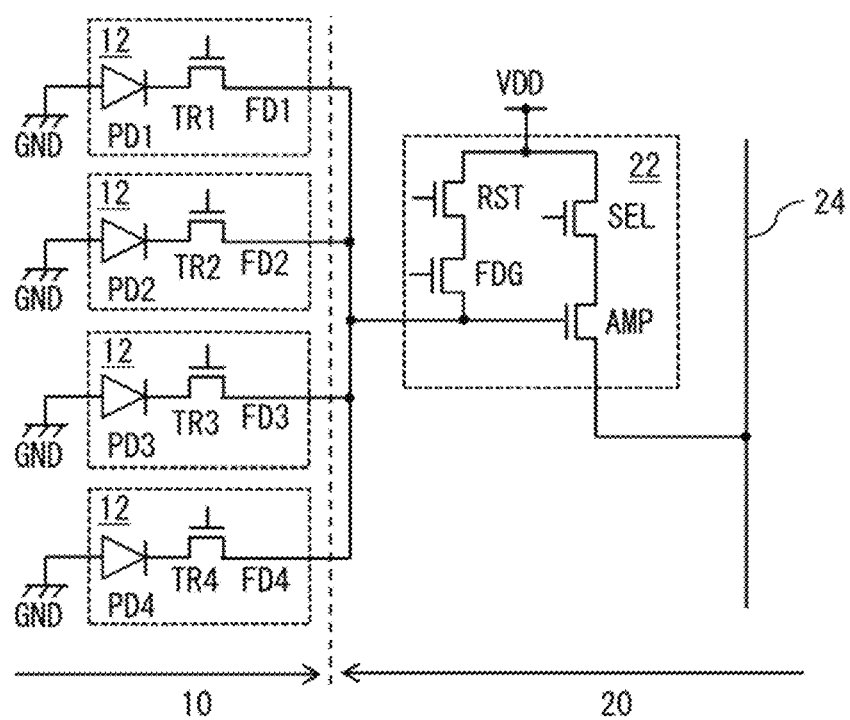
FIG. 11 is a diagram illustrating an example of the sensor pixel and the readout circuit illustrated in FIG. 6.

It is to be noted that, as illustrated in FIG. 9, the selection transistor SEL may be provided between the power supply line VDD and the amplification transistor AMP. In this case, the drain of the reset transistor RST is electrically coupled to the power supply line VDD and the drain of the selection transistor SEL. The source of the selection transistor SEL is electrically coupled to the drain of the amplification transistor AMP and the gate of the selection transistor SEL is electrically coupled to the pixel drive line 23. The source of the amplification transistor AMP (the output end of the readout circuit 22) is electrically coupled to the vertical signal line 24 and the gate of the amplification transistor AMP is electrically coupled to the source of the reset transistor RST. In addition, as illustrated in FIGS. 10 and 11, the FD transfer transistor FDG may be provided between the source of the reset transistor RST and the gate of the amplification transistor AMP.

The FD transfer transistor FDG is used to switch the conversion efficiency. In general, a pixel signal is small in shooting in a dark place. In a case where electric charge-voltage conversion is performed on the basis of Q=CV, the floating diffusion FD having larger capacitance (FD capacitance C) results in smaller V that is obtained in a case of conversion to a voltage by the amplification transistor AMP. Meanwhile, a bright place offers a large pixel signal. It is therefore not possible for the floating diffusion FD to receive the electric charge of the photodiode PD unless the FD capacitance C is large. Further, the FD capacitance C has to be large to prevent V from being too large (i.e., to make V small) in a case of conversion to a voltage by the amplification transistor AMP. Taking these into consideration, in a case where the FD transfer transistor FDG is turned on, the gate capacitance for the FD transfer transistor FDG is increased. This causes the whole FD capacitance C to be large. Meanwhile, in a case where the FD transfer transistor FDG is turned off, the whole FD capacitance C becomes small. In this way, switching the FD transfer transistor FDG on and off enables the FD capacitance C to be variable. This makes it possible to switch the conversion efficiency.

Figure 12:
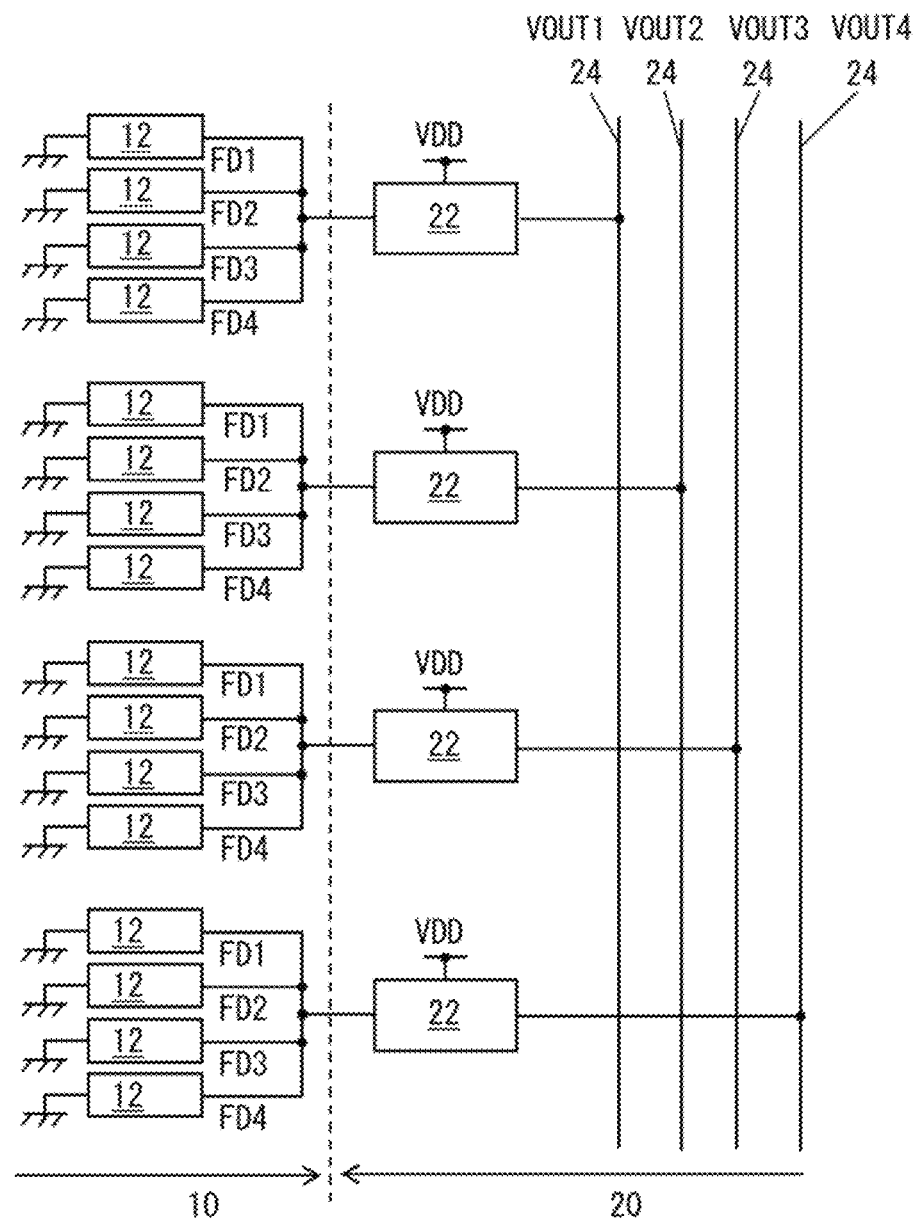
FIG. 12 is a diagram illustrating an example of a coupling mode between a plurality of readout circuits and a plurality of vertical signal lines.

FIG. 12 illustrates an example of a coupling mode between the plurality of readout circuits 22 and the plurality of vertical signal lines 24. In a case where the plurality of readout circuits 22 is disposed side by side in the direction in which the vertical signal lines 24 extend (e.g., the column direction), the plurality of vertical signal lines 24 may be assigned one by one for the respective readout circuits 22. In a case where the four readout circuits 22 are disposed side by side in the direction in which the vertical signal lines 24 extend (e.g., column direction), for example, as illustrated in FIG. 12, the four vertical signal lines 24 may be assigned one by one for the respective readout circuits 22. It is to be noted that, in FIG. 12, to distinguish the vertical signal lines 24 from each other, an identification number (1, 2, 3, or 4) is assigned to the end of the sign of each of the vertical signal lines 24.

Next, a cross-sectional configuration of the imaging device 1 in the vertical direction is described with reference to FIG. 5. As described above, the imaging device 1 has a configuration in which the first substrate 10, the second substrate 20, and the third substrate 30 are stacked in this order and further includes a color filter 40 and a light receiving lens 50 on the back surface (light incidence surface) side of the first substrate 10. The color filter 40 and the light receiving lens 50 are each provided one by one, for example, for each of the sensor pixels 12. In other words, the imaging device 1 is a back-illuminated imaging device.

The first substrate 10 includes an insulating layer 46 that is stacked on the front surface (surface 11S1) of the semiconductor substrate 11. The first substrate 10 includes the insulating layer 46 as a portion of an interlayer insulating film 51. The insulating layer 46 is provided between the semiconductor substrate 11 and the semiconductor substrate 21 described below. The semiconductor substrate 11 includes a silicon substrate. The semiconductor substrate 11 includes, for example, the p-well layer 42 in a portion of the front surface and near the front surface and includes the PD 41 of an electric conductivity type different from that of the p-well layer 42 in another region (a region deeper than the p-well layer 42). The p-well layer 42 includes a p-type semiconductor region. The PD 41 includes a semiconductor region of an electric conductivity type (specifically, n-type) different from that of the p-well layer 42. The semiconductor substrate 11 includes, in the p-well layer 42, the floating diffusion FD as a semiconductor region of an electric conductivity type (specifically, n-type) different from that of the p-well layer 42.

The first substrate 10 includes the photodiode PD, the transfer transistor TR, and the floating diffusion FD for each of the sensor pixels 12. The first substrate 10 has a configuration in which the transfer transistor TR and the floating diffusion FD are provided on a portion of the semiconductor substrate 11 on the surface 11S1 side (the opposite side to the light incidence surface or the second substrate 20 side). The first substrate 10 includes an element separation section 43 that separates the sensor pixels 12 from each other. The element separation section 43 is formed to extend in the normal direction of the semiconductor substrate 11 (the direction vertical to the front surface of the semiconductor substrate 11). The element separation section 43 is provided between the two sensor pixels 12 adjacent to each other. The element separation section 43 electrically separates the adjacent sensor pixels 12 from each other. The element separation section 43 includes, for example, silicon oxide. The element separation section 43 penetrates, for example, the semiconductor substrate 11. The first substrate 10 further includes, for example, a p-well layer 44 that is the side surface of the element separation section 43 and is in contact with the surface on the photodiode PD side. The p-well layer 44 includes a semiconductor region of an electric conductivity type (specifically, p-type) different from that of the photodiode PD. The first substrate 10 further includes, for example, a fixed electric charge film 45 that is in contact with the back surface (a surface 11S2 or the other surface) of the semiconductor substrate 11. The fixed electric charge film 45 has negative fixed electric charge to suppress the generation of a dark current due to the interface state of the semiconductor substrate 11 on the light receiving surface side. The fixed electric charge film 45 is formed by using, for example, an insulating film having negative fixed electric charge. Examples of a material of such an insulating film include hafnium oxide, zircon oxide, aluminum oxide, titanium oxide, and tantalum oxide. An electric field induced by the fixed electric charge film 45 forms a hole accumulation layer at the interface of the semiconductor substrate 11 on the light receiving surface side. This hole accumulation layer suppresses the generation of electrons from the interface. The color filter 40 is provided on the back surface side of the semiconductor substrate 11. The color filter 40 is provided, for example, in contact with the fixed electric charge film 45 and is provided at a position opposed to the sensor pixel 12 with the fixed electric charge film 45 interposed in between. The light receiving lens 50 is provided, for example, in contact with the color filter 40 and is provided at a position opposed to the sensor pixel 12 with the color filter 40 and the fixed electric charge film 45 interposed in between.

The second substrate 20 includes an insulating layer 52 that is stacked on the semiconductor substrate 21. The insulating layer 52 and the second substrate 20 each include the insulating layer 52 as a portion of the interlayer insulating film 51. The insulating layer 52 is provided between the semiconductor substrate 21 and the semiconductor substrate 31. The semiconductor substrate 21 includes a silicon substrate. The second substrate 20 includes the one readout circuit 22 for every four sensor pixels 12. The second substrate 20 has a configuration in which the readout circuit 22 is provided on a portion of the semiconductor substrate 21 on the front surface (a surface 21S1 opposed to the third substrate 30 or one surface) side. The second substrate 20 is bonded to the first substrate 10 with the back surface (surface 21S2) of the semiconductor substrate 21 opposed to the front surface (surface 11S1) of the semiconductor substrate 11. In other words, the second substrate 20 is bonded to the first substrate 10 in a face-to-back manner. The second substrate 20 further includes an insulating layer 53 in the same layer as the semiconductor substrate 21. The insulating layer 53 penetrates the semiconductor substrate 21. The second substrate 20 includes the insulating layer 53 as a portion of the interlayer insulating film 51. The insulating layer 53 is provided to cover the side surface of a through wiring line 54 described below.

A stacked body including the first substrate 10 and the second substrate 20 includes the interlayer insulating film 51 and the through wiring line 54 provided in the interlayer insulating film 51. The stacked body described above includes the one through wiring line 54 for each of the sensor pixels 12. The through wiring line 54 extends in the normal direction of the semiconductor substrate 21 and is provided to penetrate a portion of the interlayer insulating film 51 that includes the insulating layer 53. The first substrate 10 and the second substrate 20 are electrically coupled to each other by the through wiring line 54. Specifically, the through wiring line 54 is electrically coupled to the floating diffusion FD and a coupling wiring line 55 described below.

The stacked body including the first substrate 10 and the second substrate 20 further includes through wiring lines 47 and 48 (see FIG. 13 described below) provided in the interlayer insulating film 51. The stacked body described above includes the one through wiring line 47 and the one through wiring line 48 for each of the sensor pixels 12. Each of the through wiring lines 47 and 48 extends in the normal direction of the semiconductor substrate 21 and is provided to penetrate a portion of the interlayer insulating film 51 that includes the insulating layer 53. The first substrate 10 and the second substrate 20 are electrically coupled to each other by the through wiring lines 47 and 48. Specifically, the through wiring line 47 is electrically coupled to the p-well layer 42 of the semiconductor substrate 11 and to a wiring line in the second substrate 20. The through wiring line 48 is electrically coupled to the transfer gate TG and the pixel drive line 23.

The second substrate 20 includes, for example, a plurality of coupling sections 59 in the insulating layer 52. The plurality of coupling sections 59 is electrically coupled to the readout circuit 22 and the semiconductor substrate 21. The second substrate 20 further includes, for example, the wiring layer 56 on the insulating layer 52. The wiring layer 56 includes, for example, an insulating layer 57 and the plurality of pixel drive lines 23 and the plurality of vertical signal lines 24. The plurality of pixel drive lines 23 and the plurality of vertical signal lines 24 are provided in the insulating layer 57. The wiring layer 56 further includes, for example, the plurality of coupling wiring lines 55 in the insulating layer 57. The one coupling wiring line 55 is provided for every four sensor pixels 12. The coupling wiring line 55 electrically couples the respective through wiring lines 54 to each other. The through wiring lines 54 are electrically coupled to the floating diffusions FD included in the four sensor pixels 12 that share the readout circuit 22. Here, the total number of through wiring lines 54 and 48 is larger than the total number of sensor pixels 12 included in the first substrate 10 and is twice as large as the total number of sensor pixels 12 included in the first substrate 10. In addition, the total number of through wiring lines 54, 48, and 47 is larger than the total number of sensor pixels 12 included in the first substrate 10 and is three times as large as the total number of sensor pixels 12 included in the first substrate 10.

The wiring layer 56 further includes, for example, the plurality of pad electrodes 58 in the insulating layer 57. Each of the pad electrodes 58 is formed by using, for example, a metal such as Cu (copper), tungsten (W), and Al (aluminum). Each of the pad electrodes 58 is exposed from the surface of the wiring layer 56. Each of the pad electrodes 58 is used to electrically couple the second substrate 20 and the third substrate 30 and bond the second substrate 20 and the third substrate 30 together. The plurality of pad electrodes 58 is provided one by one, for example, for the respective pixel drive lines 23 and the respective vertical signal lines 24. Here, the total number of pad electrodes 58 (or the total number of junctions between the pad electrode 58 and a pad electrode 64 (described below) is smaller than, for example, the total number of sensor pixels 12 included in the first substrate 10.

FIG. 7 schematically illustrates a cross-sectional configuration in which the wiring structure 100 described above is applied to the imaging device 1. In the present embodiment, for example, the plurality of vertical signal lines 24 corresponds to the wiring line 112X3 and the wiring line 112X4 in the wiring structure 100 described above and power supply lines VSS correspond to the wiring line 112X2 and the wiring line 112X5 in the wiring structure 100 described above. Although not illustrated in FIG. 5, the insulating layer 57 includes a plurality of insulating films 151 to 157 as illustrated in FIG. 7. The insulating film 154 among them forms the gaps G between the power supply lines VSS and the vertical signal lines 24 that extend side by side and between the wiring lines of the plurality of vertical signal lines 24. The respective pad electrodes 58 exposed on the surface of the wiring layer 56 correspond to the electrically conducive film 127X1 and the electrically conducive film 127X2 in the wiring structure 100 described above.

A portion (pad electrode 58X1) of the respective pad electrodes 58 is electrically coupled to a ground line (wiring line 112X1). Although not illustrated, the ground line is coupled, for example, to a p-well of the semiconductor substrate 11 or the ground (GND). This makes it possible to use the pad electrode 58X1 as a shield wiring line for the stack direction of the vertical signal lines 24 and reduce noise that occurs in the vertical signal lines 24.

Further, the pad electrode 58X1 that functions as a shield wiring line is joined to a pad electrode 64X1 on the third substrate 30 side described below. This makes it possible to reduce the impedance of the shield wiring line as compared with the shield wiring line formed by using the pad electrode 58X1 alone. In addition, the pad electrode 58X1 that functions as a shield wiring line is provided to vertically extend through the pixel region 13, for example, as with the vertical signal lines 24 and terminates near the periphery of the pixel region 13 beyond the region end.

The third substrate 30 includes, for example, an interlayer insulating film 61 that is stacked on the semiconductor substrate 31. It is to be noted that, as described below, the third substrate 30 is bonded to the second substrate 20 on the front surfaces. Therefore, in a case where the components in the third substrate 30 are described, the vertical relationship to be described is opposite to the vertical direction in the diagram. The semiconductor substrate 31 includes a silicon substrate. The third substrate 30 has a configuration in which the logic circuit 32 is provided on a portion of the semiconductor substrate 31 on the front surface (surface 31S1) side. The third substrate 30 further includes, for example, a wiring layer 62 on the interlayer insulating film 61. The wiring layer 62 includes, for example, an insulating layer 63 and the plurality of pad electrodes 64 (e.g., the pad electrode 64X1 and the pad electrode 64X2) that is provided in the insulating layer 63. The plurality of pad electrodes 64 is electrically coupled to the logic circuit 32. Each of the pad electrodes 64 is formed by using, for example, Cu (copper). Each of the pad electrodes 64 is exposed from the surface of the wiring layer 62. Each of the pad electrodes 64 is used to electrically couple the second substrate 20 and the third substrate 30 and bond the second substrate 20 and the third substrate 30 together. In addition, the pad electrode 64 does not necessarily have to be a plurality of pad electrodes. Even one pad electrode is able to be electrically coupled to the logic circuit 32. The second substrate 20 and the third substrate 30 are electrically coupled to each other by bonding the pad electrodes 58 and 64 to each other. In other words, the gate (transfer gate TG) of the transfer transistor TR is electrically coupled to the logic circuit 32 through the through wiring line 54 and the pad electrodes 58 and 64. The third substrate 30 is bonded to the second substrate 20 with the front surface (surface 31S1) of the semiconductor substrate 31 opposed to the front surface (surface 21S1) side of the semiconductor substrate 21. In other words, the third substrate 30 is bonded to the second substrate 20 in a face-to-face manner.

Figure 13:
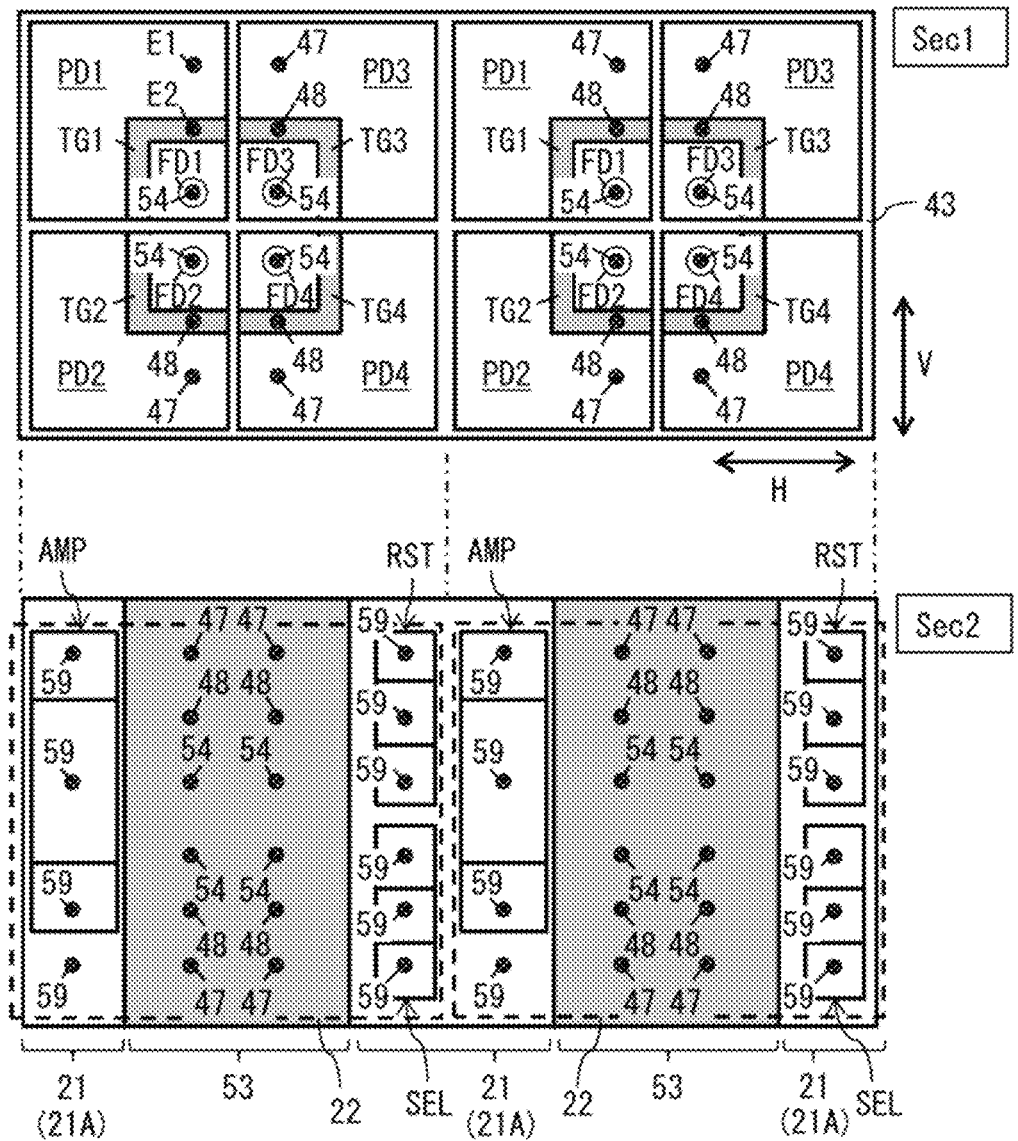
FIG. 13 is a diagram illustrating an example of a cross-sectional configuration of the imaging device illustrated in FIG. 5 in the horizontal direction.

Each of FIGS. 13 and 14 illustrates an example of a cross-sectional configuration of the imaging device 1 in the horizontal direction. The diagram on the upper side of each of FIGS. 13 and 14 is a diagram illustrating an example of a cross-sectional configuration taken along a cross section Sec1 in FIG. 1 and the diagram on the lower side of each of FIGS. 13 and 14 is a diagram illustrating an example of a cross-sectional configuration taken along a cross section Sec2 in FIG. 1. FIG. 13 exemplifies a configuration in which two sets of 2×2 or four sensor pixels 12 are arranged in a second direction H and FIG. 14 exemplifies a configuration in which four sets of 2×2 or four sensor pixels 12 are arranged in a first direction V and the second direction H. It is to be noted that a diagram illustrating an example of the front surface configuration of the semiconductor substrate 11 is superimposed on a diagram illustrating the example of the cross-sectional configuration taken along the cross section Sec1 in FIG. 1 and the insulating layer 46 is omitted in the cross-sectional view on the upper side of each of FIGS. 13 and 14. In addition, a diagram illustrating an example of the front surface configuration of the semiconductor substrate 21 is superimposed on a diagram illustrating the example of the cross-sectional configuration taken along the cross section Sec2 in FIG. 1 in the cross-sectional view on the lower side of each of FIGS. 13 and 14.

As illustrated in FIGS. 13 and 14, the plurality of through wiring lines 54, the plurality of through wiring lines 48, and the plurality of through wiring lines 47 are disposed side by side in a strip shape in the first direction V (the up/down direction in FIG. 13 and the left/right direction in FIG. 14) within the plane of the first substrate 10. It is to be noted that each of FIGS. 13 and 14 exemplifies a case where the plurality of through wiring lines 54, the plurality of through wiring lines 48, and the plurality of through wiring lines 47 are disposed side by side in two rows in the first direction V. The first direction V is parallel with one (e.g., the column direction) of two arrangement directions (e.g., the row direction and the column direction) of the plurality of sensor pixels 12 disposed in a matrix. In the four sensor pixels 12 that share the readout circuit 22, the four floating diffusions FD are disposed close to each other, for example, with the element separation section 43 interposed in between. In the four sensor pixels 12 that share the readout circuit 22, the four transfer gates TG are disposed to surround the four floating diffusions FD and the four transfer gates TG form, for example, an annular shape.

The insulating layer 53 includes a plurality of blocks extending in the first direction V. The semiconductor substrate 21 extends in the first direction V and includes the plurality of island-shaped blocks 21A disposed side by side in the second direction H orthogonal to the first direction V with the insulating layer 53 interposed in between. Each of the blocks 21A is provided, for example, with a plurality of sets of reset transistors RST, amplification transistors AMP, and selection transistors SEL. The one readout circuit 22 shared by the four sensor pixels 12 includes, for example, the reset transistor RST, the amplification transistor AMP, and the selection transistor SEL in a region opposed to the four sensor pixels 12. The one readout circuit 22 shared by the four sensor pixels 12 includes, for example, the amplification transistor AMP in the left adjacent block 21A of the insulating layer 53 and the reset transistor RST and the selection transistor SEL in the right adjacent block 21A of the insulating layer 53.

Each of FIGS. 15, 16, 17, and 18 illustrates an example of a wiring line layout of the imaging device 1 within the horizontal plane. Each of FIGS. 15 to 18 exemplifies a case where the one readout circuit 22 shared by the four sensor pixels 12 is provided in a region opposed to the four sensor pixels 12. The wiring lines illustrated in FIGS. 15 to 18 are provided, for example, in layers different from each other in the wiring layer 56.

Figure 15:
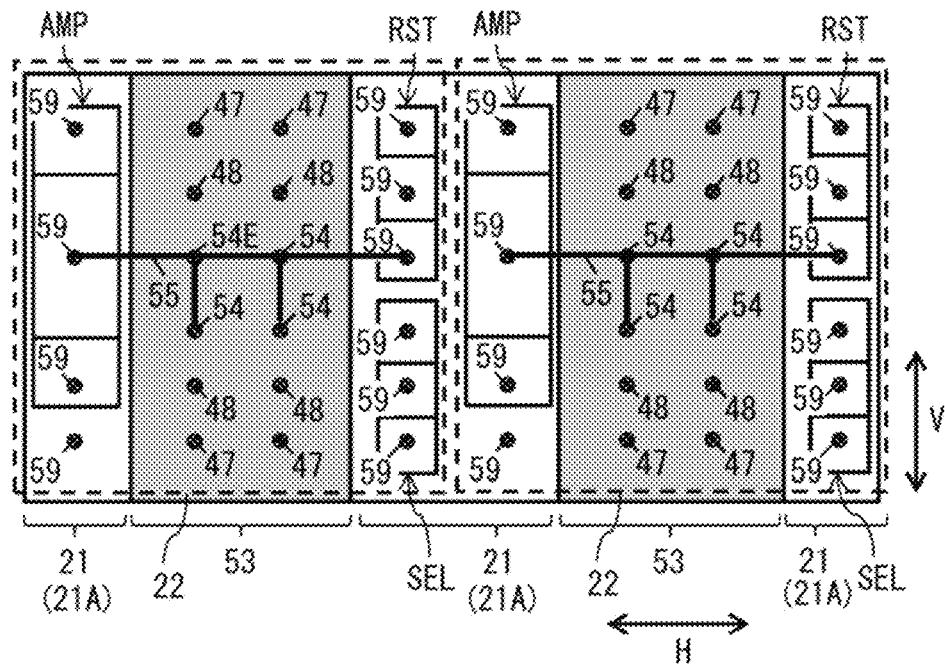
FIG. 15 is a diagram illustrating an example of a wiring line layout of the imaging device illustrated in FIG. 5 within a horizontal plane.

The four through wiring lines 54 adjacent to each other are electrically coupled to the coupling wiring line 55, for example, as illustrated in FIG. 15. The four through wiring lines 54 adjacent to each other are further electrically coupled to the gate of the amplification transistor AMP included in the left adjacent block 21A of the insulating layer 53 and the gate of the reset transistor RST included in the right adjacent block 21A of the insulating layer 53 through the coupling wiring line 55 and the coupling section 59, for example, as illustrated in FIG. 15.

Figure 16:
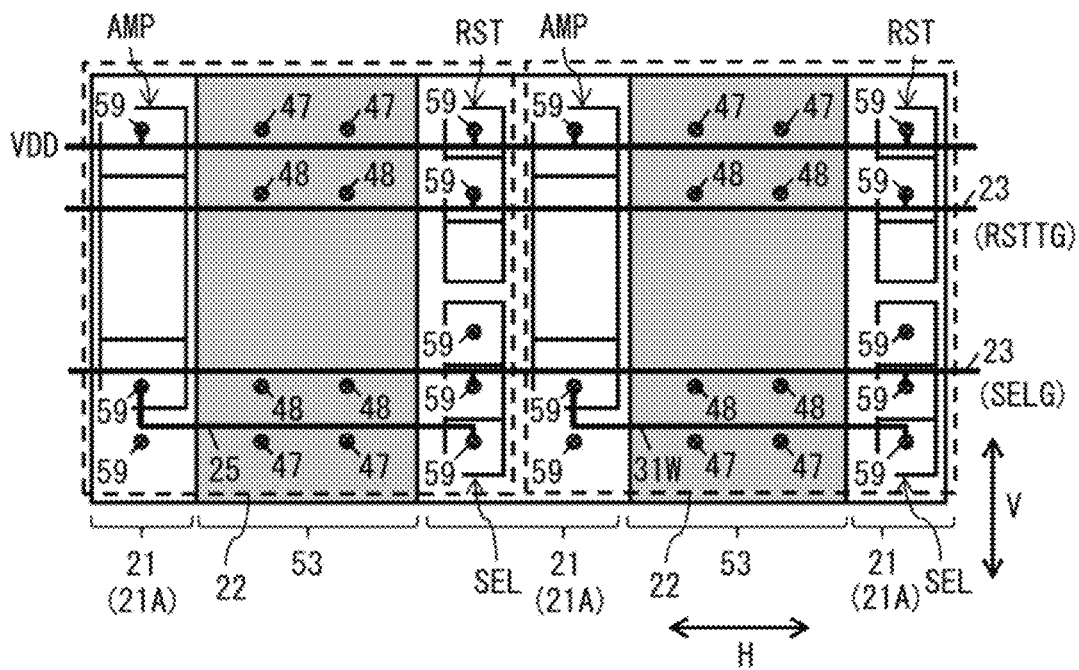
FIG. 16 is a diagram illustrating an example of the wiring line layout of the imaging device illustrated in FIG. 5 within the horizontal plane.

The power supply line VDD is disposed at a position opposed to the readout circuits 22 disposed side by side in the second direction H, for example, as illustrated in FIG. 16. The power supply line VDD is electrically coupled to the drain of the amplification transistor AMP and the drain of the reset transistor RST of each of the readout circuits 22 disposed side by side in the second direction H through the coupling section 59, for example, as illustrated in FIG. 16. The two pixel drive line 23 are disposed at positions opposed to the readout circuits 22 disposed side by side in the second direction H, for example, as illustrated in FIG. 16. One (second control line) of the pixel drive lines 23 is a wiring line RSTG electrically coupled to the gate of the reset transistor RST of each of the readout circuits 22 disposed side by side in the second direction H, for example, as illustrated in FIG. 16. The other (third control line) of the pixel drive lines 23 is a wiring line SELG electrically coupled to the gate of the selection transistor SEL of each of the readout circuits 22 disposed side by side in the second direction H, for example, as illustrated in FIG. 16. In each of the readout circuits 22, the source of the amplification transistor AMP and the drain of the selection transistor SEL are electrically coupled to each other through a wiring line 25, for example, as illustrated in FIG. 16.

Figure 17:
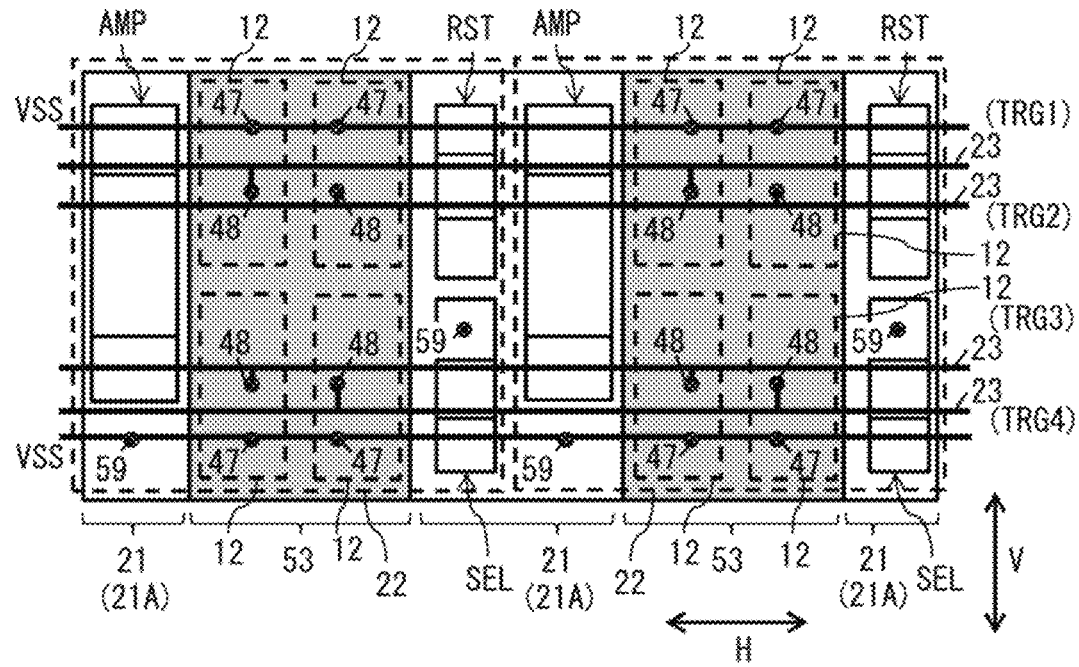
FIG. 17 is a diagram illustrating an example of the wiring line layout of the imaging device illustrated in FIG. 5 within the horizontal plane.

The two power supply line VSS are disposed at positions opposed to the readout circuits 22 disposed side by side in the second direction H, for example, as illustrated in FIG. 17. Each of the power supply lines VSS is electrically coupled to the plurality of through wiring lines 47 at a position opposed to the respective sensor pixels 12 disposed side by side in the second direction H, for example, as illustrated in FIG. 17. The four pixel drive lines 23 are disposed at positions opposed to the readout circuits 22 disposed side by side in the second direction H, for example, as illustrated in FIG. 17. Each of the four pixel drive lines 23 is a wiring line TRG electrically coupled to the through wiring line 48 of the one sensor pixel 12 of the four sensor pixels 12 corresponding to each of the readout circuits 22 disposed side by side in the second direction H, for example, as illustrated in FIG. 17. In other words, the four pixel drive lines 23 (first control lines) are each electrically coupled to the gate (transfer gate TG) of the transfer transistor TR of each of the sensor pixels 12 disposed side by side in the second direction H. In FIG. 17, to distinguish the wiring lines TRG from each other, an identifier (1, 2, 3, or 4) is assigned to the end of each of the wiring lines TRG.

Figure 18:
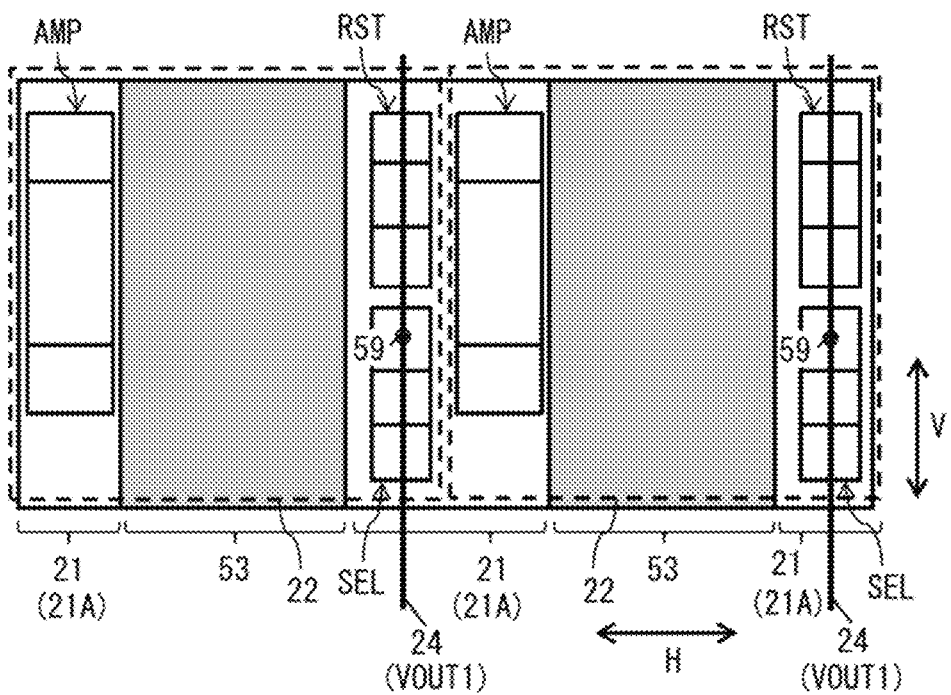
FIG. 18 is a diagram illustrating an example of the wiring line layout of the imaging device illustrated in FIG. 5 within the horizontal plane.

The vertical signal line 24 is disposed at a position opposed to the readout circuits 22 disposed side by side in the first direction V, for example, as illustrated in FIG. 18. The vertical signal line 24 (output line) is electrically coupled to the output end (the source of the amplification transistor AMP) of each of the readout circuits 22 disposed side by side in the first direction V, for example, as illustrated in FIG. 18.

1-4. Method of Manufacturing Imaging Device

Next, a method of manufacturing the imaging device 1 is described. Each of FIGS. 19A to 19G illustrates an example of a process of manufacturing the imaging device 1.

Figure 19A:
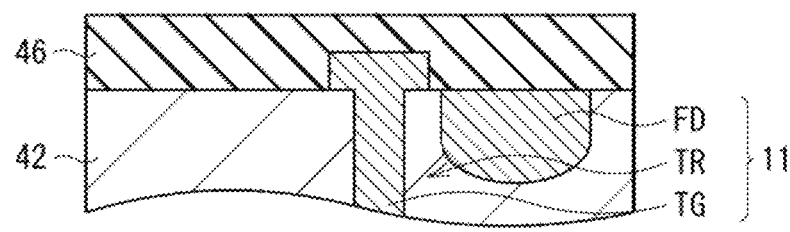
FIG. 19A is a diagram illustrating an example of the process of manufacturing the imaging device illustrated in FIG. 5.

First, the p-well layer 42, the element separation section 43, and the p-well layer 44 are formed on the semiconductor substrate 11. Next, the photodiode PD, the transfer transistor TR, and the floating diffusion FD are formed on the semiconductor substrate 11 (FIG. 19A). This forms the sensor pixel 12 on the semiconductor substrate 11. In this case, it is preferable to prevent a material having low heat resistance such as $CoSi_2$ and NiSi by a Salicide process from being used as an electrode material to be used for the sensor pixel 12. Rather, it is preferable to use a material having high heat resistance as an electrode material to be used for the sensor pixel 12. Examples of the material having high heat resistance include polysilicon. After that, the insulating layer 46 is formed on the semiconductor substrate 11 (FIG. 19A). In this way, the first substrate 10 is formed.

Figure 19B:
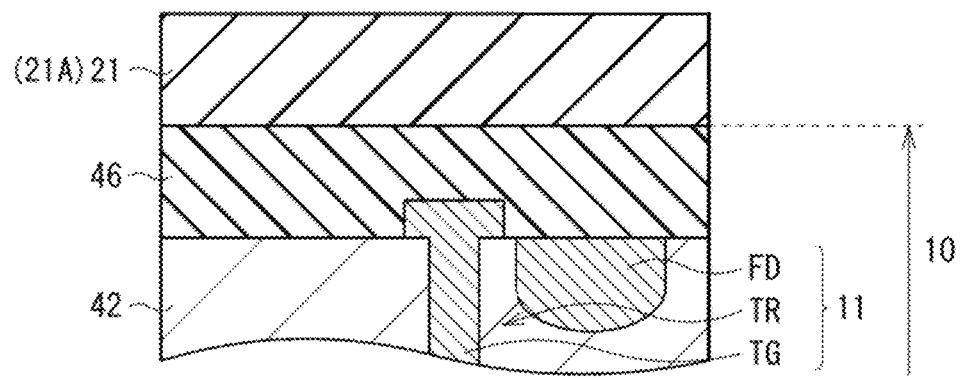
FIG. 19B is a diagram illustrating an example of a manufacturing process subsequent to FIG. 19A.

Next, the semiconductor substrate 21 is bonded onto the first substrate 10 (insulating layer 46B) (FIG. 19B). After that, the semiconductor substrate 21 is thinned as necessary. In this case, the thickness of the semiconductor substrate 21 is set at a film thickness necessary to form the readout circuit 22. The thickness of the semiconductor substrate 21 is typically about several hundreds of nm. However, an FD (Fully Depletion) type is also available depending on the concept of the readout circuit 22. In that case, the semiconductor substrate 21 may have a thickness within a range from several nm to several μm.

Figure 19C:
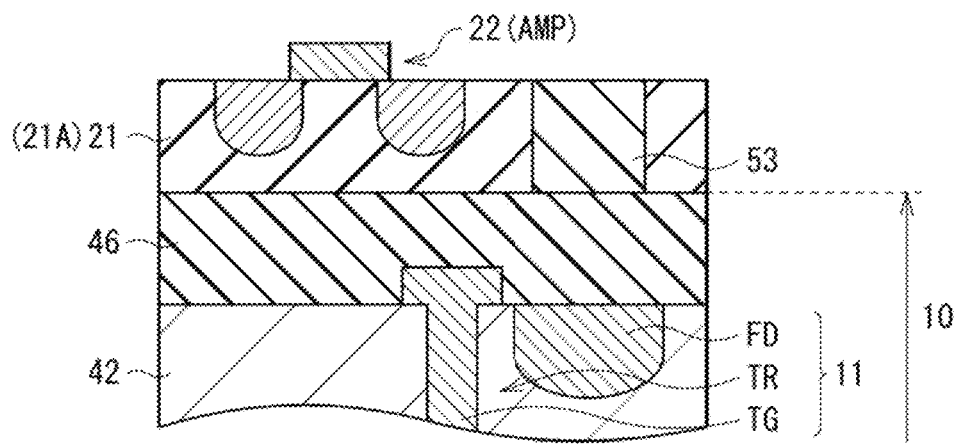
FIG. 19C is a diagram illustrating an example of a manufacturing process subsequent to FIG. 19B.

Subsequently, the insulating layer 53 is formed in the same layer as the semiconductor substrate 21 (FIG. 19C). The insulating layer 53 is formed, for example, at a position opposed to the floating diffusion FD. For example, a slit (opening 21H) that penetrates the semiconductor substrate 21 is formed in the semiconductor substrate 21 to separate the semiconductor substrate 21 into the plurality of blocks 21A. After that, the insulating layer 53 is formed to fill the slit. After that, the readout circuit 22 including the amplification transistor AMP and the like is formed in each of the blocks 21A of the semiconductor substrate 21 (FIG. 19C). In this case, in a case where a metal material having high heat resistance is used as an electrode material of the sensor pixel 12, it is possible to form the gate insulating film of the readout circuit 22 by thermal oxidation.

Figure 19D:
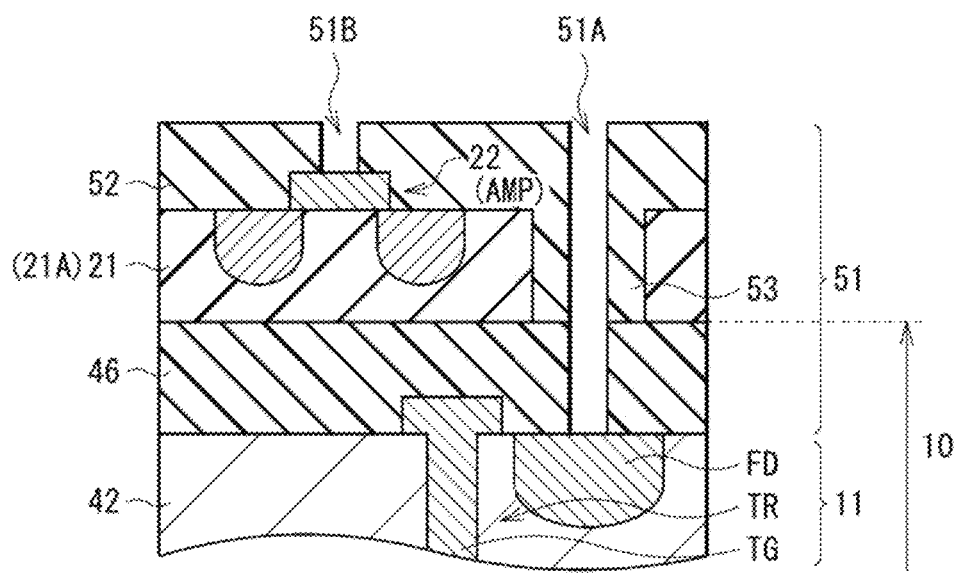
FIG. 19D is a diagram illustrating an example of a manufacturing process subsequent to FIG. 19C.

Next, the insulating layer 52 is formed on the semiconductor substrate 21. In this way, the interlayer insulating film 51 including the insulating layers 46, 52, and 53 is formed. Subsequently, through holes 51A and 51B are formed in the interlayer insulating film 51 (FIG. 19D). Specifically, the through hole 51B that extends through the insulating layer 52 is formed in a portion of the insulating layer 52 that is opposed to the readout circuit 22. In addition, the through hole 51A that extends through the interlayer insulating film 51 is formed in a portion of the interlayer insulating film 51 that is opposed to the floating diffusion FD (i.e., a portion opposed to the insulating layer 53).

Figure 19E:
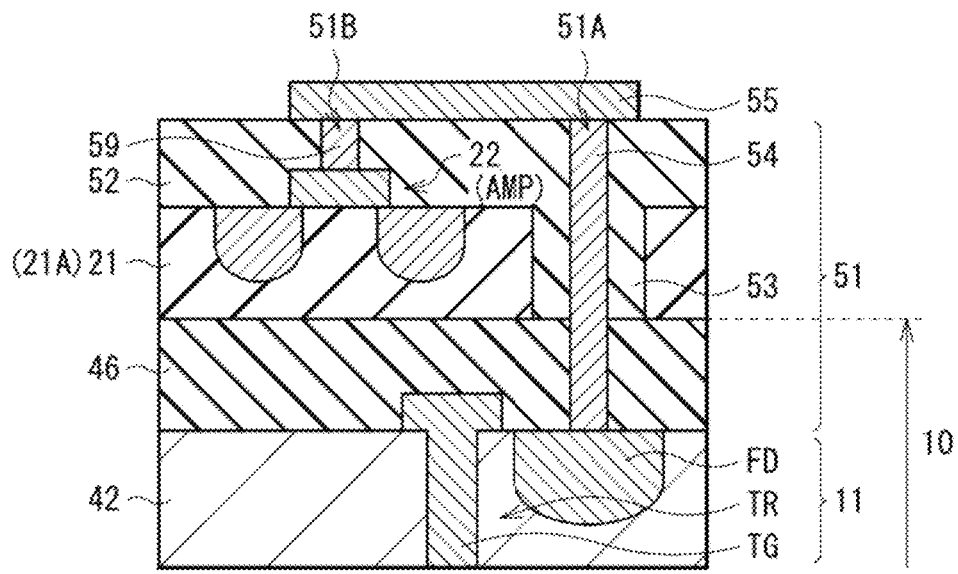
FIG. 19E is a diagram illustrating an example of a manufacturing process subsequent to FIG. 19D.
Figure 19F:
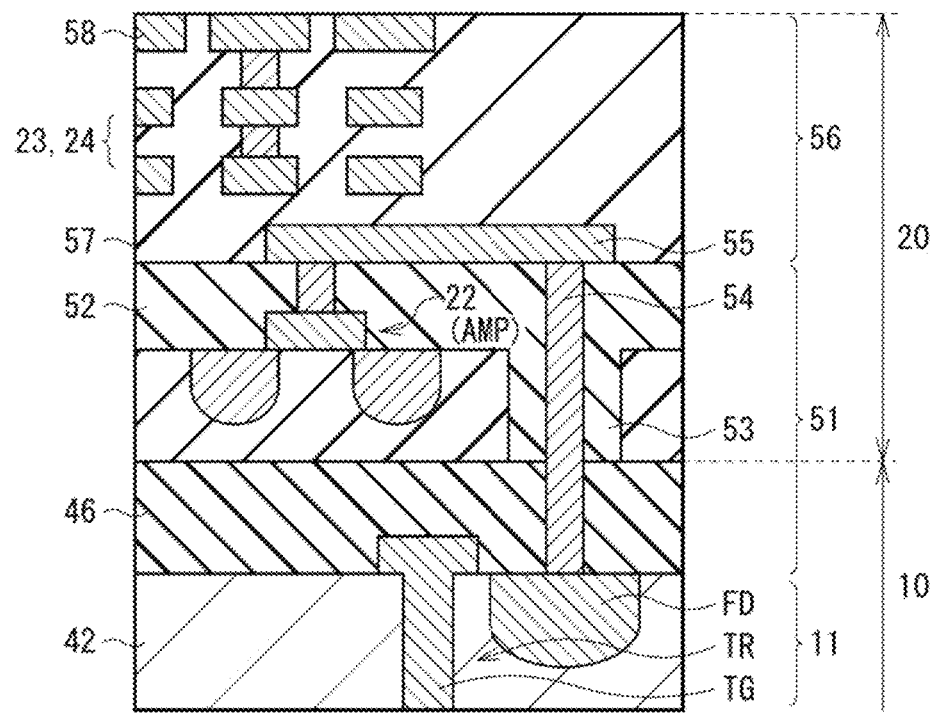
FIG. 19F is a diagram illustrating an example of a manufacturing process subsequent to FIG. 19E.

Subsequently, filling the through holes 51A and 51B with electrically conductive materials causes the through wiring line 54 to be formed in the through hole 51A and causes the coupling section 59 to be formed in the through hole 51B (FIG. 19E). Further, the coupling wiring line 55 that electrically couples the through wiring line 54 and the coupling section 59 to each other is formed on the insulating layer 52 (FIG. 19E). After that, the wiring layer 56 is formed on the insulating layer 52 (FIG. 19F). In this way, the second substrate 20 is formed.

Figure 19G:
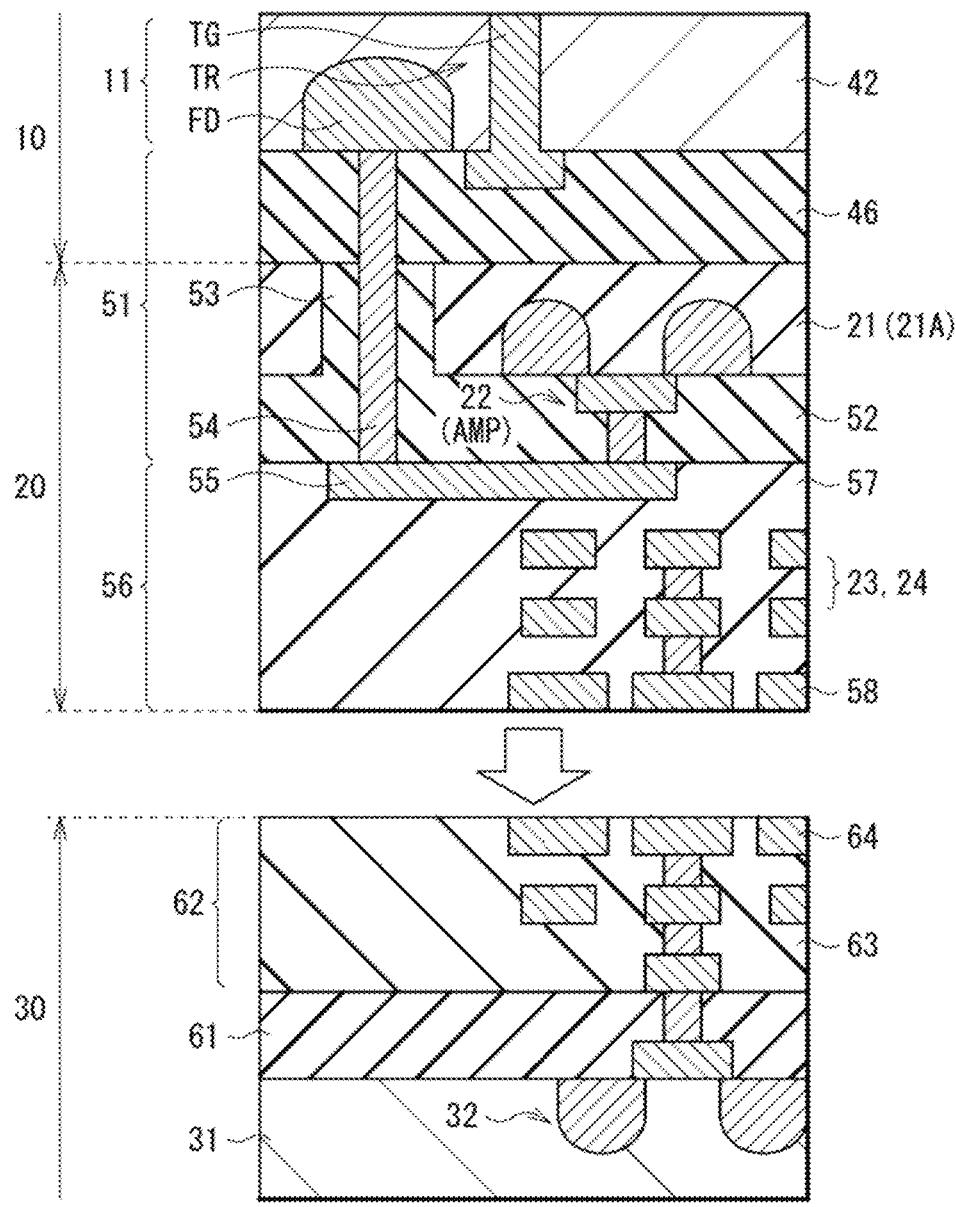
FIG. 19G is a diagram illustrating an example of a manufacturing process subsequent to FIG. 19F.

Next, the second substrate 20 is bonded to the third substrate 30 with the front surface of the semiconductor substrate 21 opposed to the front surface side of the semiconductor substrate 31 (FIG. 19G). The logic circuit 32 and the wiring layer 62 are formed on the third substrate 30. In this case, the pad electrode 58 of the second substrate 20 and the pad electrode 64 of the third substrate 30 are bonded to each other, thereby electrically coupling the second substrate 20 and the third substrate 30 to each other. In this way, the imaging device 1 is manufactured.

1-5. Workings and Effects

The wiring structure 100 according to the present embodiment and the imaging device 1 to which this wiring structure 100 is applied are each provided with the notch X in the upper surface section of a cross section (e.g., the cross section in the X axis direction) of a wiring line adjacent to the gap G out of a plurality of wiring lines (e.g., the wiring line 112X1 to the wiring line 112X6) extending in one direction and provided with the gaps G between predetermined wiring lines. The cross section (e.g., the cross section in the X axis direction) of the wiring line adjacent to the gap G is orthogonal to the extending direction. This increases the coverage of the insulating film 122 over the upper surfaces and the side surfaces of the wiring lines 112X2 to 112X5. The following describes this.

As described above, in recent years, as finer semiconductor integrated circuit elements are made, the intervals between the elements and the intervals between wiring lines that connect the elements have been narrower in semiconductor devices. The capacitance (parasitic capacitance) between wiring lines tends to increase. Therefore, in a typical semiconductor device, wiring lines in the stack direction are electrically insulated by using a Low-k material and there is provided a gap between wiring lines disposed side by side to decrease the parasitic capacitance between the wiring lines.

It is possible to form a gap between wiring lines in parallel, for example, by removing an insulating film between the wiring lines by etching and then forming an insulating film including a sealing film and a Low-k material.

A wiring line exposed by etching, however, has a damage on the surface. The presence of the damage in the wiring line easily causes an electromigration defect. In addition, in a case where the wiring line has a rectangular cross section, the coverage of the sealing film over the surface of the wiring line is decreased and an electromigration defect is similarly caused easily.

In contrast, in the present embodiment, the insulating films 111 and 121 between the wiring lines 112X2 to 112X5 are removed by dry etching to form the openings H2. After that, ends of the upper surfaces of the exposed wiring lines 112X2 to 112X5 are removed, for example, by wet etching. This removes the damaged portions of the surfaces of the wiring lines 112X2 to 112X5 caused by the dry etching and provides the notches X at the ends of the upper surfaces of the wiring lines 112X2 to 112X5. This increases the coverage of the insulating film 122 that covers the upper surfaces and the side surfaces of the wiring lines 112X2 to 112X5.

It is thus possible to suppress the occurrence of an electromigration defect in the wiring lines 112X2 to 112X5 in the wiring structure 100 according to the present embodiment. This makes it possible to increase the reliability of the wiring structure 100 and the imaging device 1 to which the wiring structure 100 is applied.

Further, in the present embodiment, one (e.g., the pad electrode 58X1) of the pad electrodes 58 used for Cu—Cu junction with the third substrate 30 is electrically coupled to the ground line coupled to a p-well of the semiconductor substrate 11 or the ground (GND). This makes it possible to provide the pad electrode 58X1 with a function of a shield wiring line for the stack direction of the vertical signal lines 24. Noise is therefore reduced that occurs in the vertical signal lines 24 and it is possible to increase, for example, the image quality of the imaging device 1.

In addition, the use of the pad electrode 58X1 for Cu—Cu junction as a shield wiring line also makes it possible to use the pad electrode 64X1 on the third substrate 30 side that is joined to the pad electrode 58X1 as a shield wiring line for the stack direction of the vertical signal lines 24. This makes it possible to reduce the impedance of the shield wiring line. It is therefore possible to further reduce noise that occurs in the vertical signal lines 24.

In addition, in the present embodiment, the notches X are provided at ends of the upper surfaces of the wiring lines 112X2 to 112X5. This makes it possible to reduce an IR drop as compared with a case where step differences are formed, for example, in the upper surfaces of the wiring lines 112X2 to 112X5. This allows the imaging device 1 including, for example, these wiring lines to suppress an output voltage that takes an IR drop into consideration, making it possible to suppress power consumption.

Further, in the present embodiment, the notches X are provided at ends of the upper surfaces of the wiring lines 112X2 to 112X5. This makes it possible to reduce the parasitic capacitance between the wiring lines as compared with in a case where the wiring lines 112X2 to 112X5 have rectangular cross-sectional shapes. This decreases the effective dielectric constant between the wiring lines and thus makes it possible to increase the wiring lines in speed. In addition, the imaging device 1 including these wiring lines is allowed to have an increased frame rate. This makes it possible to achieve a higher-definition moving image.

In addition, it is possible in the present embodiment to reduce the field strength between the wiring lines 112X2 to 112X5. This decreases the probability that noise caused in the wiring lines 112X2 to 112X5 directly influences the adjacent wiring lines. This allows the imaging device 1 including these wiring lines to form a high-definition image.

In addition, it is possible in the imaging device 1 to which the wiring structure 100 according to the present embodiment is applied to structurally increase wiring lines in speed and decrease noise as described above. It is thus possible to reduce a system load such as a special signal processing method. Further, it is possible to more easily design an external system that interacts with the imaging device 1.

The following describes second and third embodiments and modification examples 1 to 13. It is to be noted that the following description denotes the same components as those of the embodiment described above with the same symbols and the descriptions thereof are omitted as appropriate.

2. Modification Examples 2-1. Modification Example 1

FIGS. 20 to 23 schematically illustrate examples of cross-sectional configurations of wiring structures (wiring structures 100A, 100B, 100C, and 100D) according to a modification example 1 of the present disclosure in the vertical direction. The shapes of the gaps G provided between the wiring lines 112X2 to 112X5 are not limited to the shape illustrated in FIG. 1.

Figure 20:
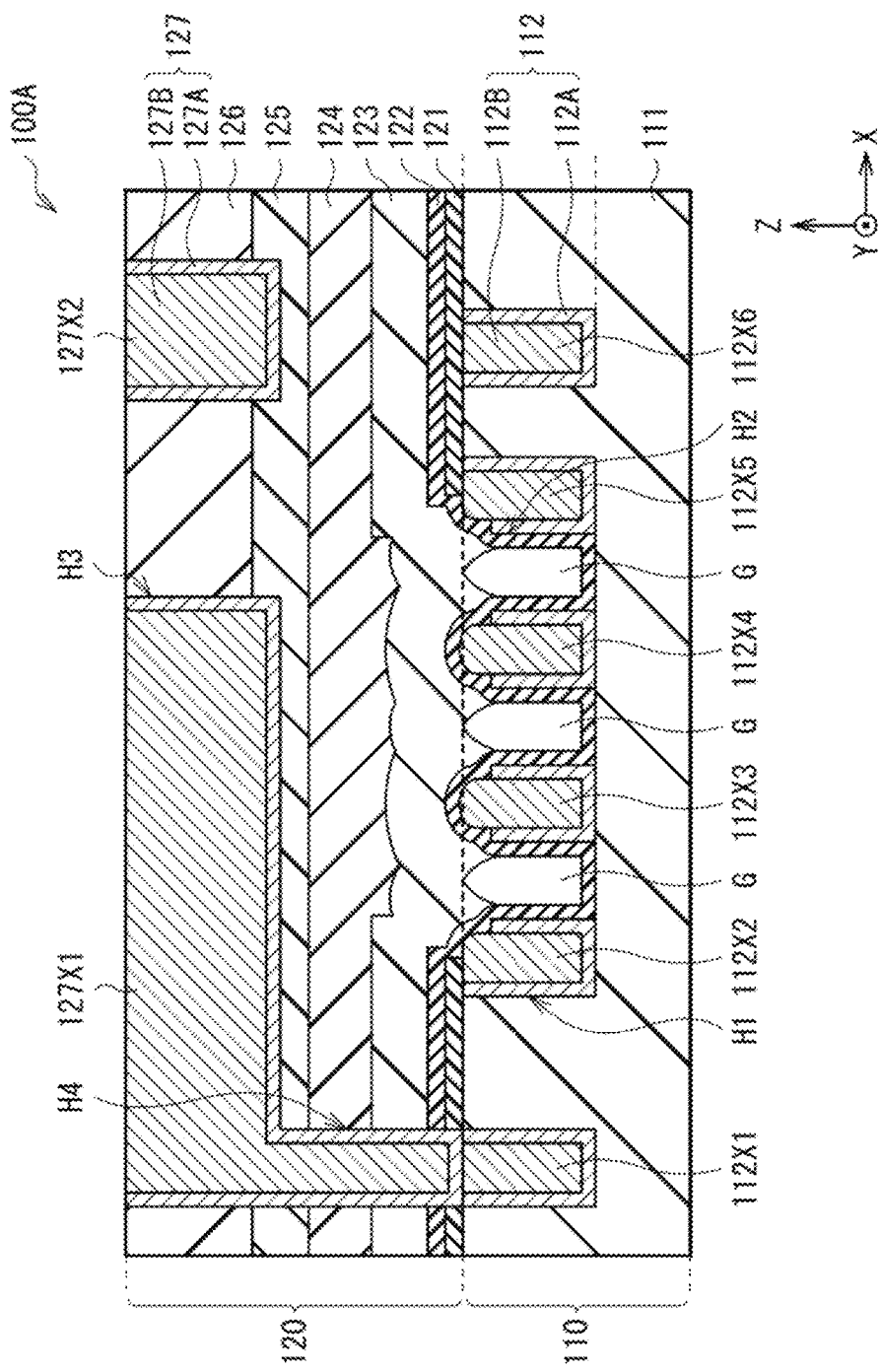
FIG. 20 is a schematic diagram illustrating an example of a cross-sectional configuration of a wiring structure according to a modification example 1 of the present disclosure in the vertical direction.

For example, as illustrated in FIG. 20, the tops of the gaps G may be formed to have substantially the same height as that of the upper surfaces of the wiring lines 112X2 to 112X5 and the bottoms of the gaps G may be formed to have substantially the same depth as that of the bottoms of the wiring lines 112X2 to 112X5. This makes it possible to sufficiently reduce the parasitic capacitance between the wiring lines. In addition, it is possible to increase the electrical reliability (TDDB) by insulating the wiring lines with the gaps G.

Figure 21:
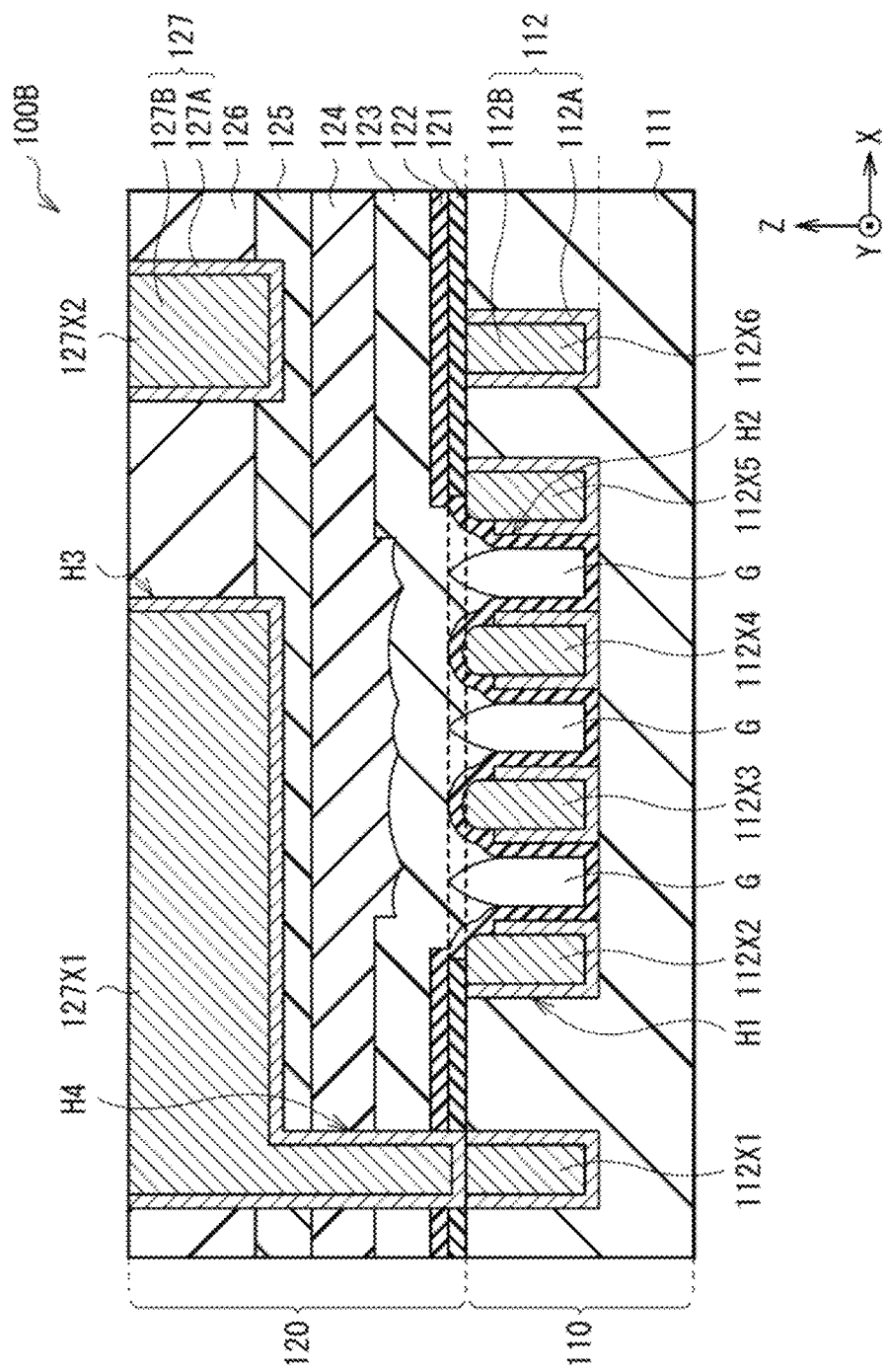
FIG. 21 is a schematic diagram illustrating another example of the cross-sectional configuration of the wiring structure according to the modification example 1 of the present disclosure in the vertical direction.
Figure 22:
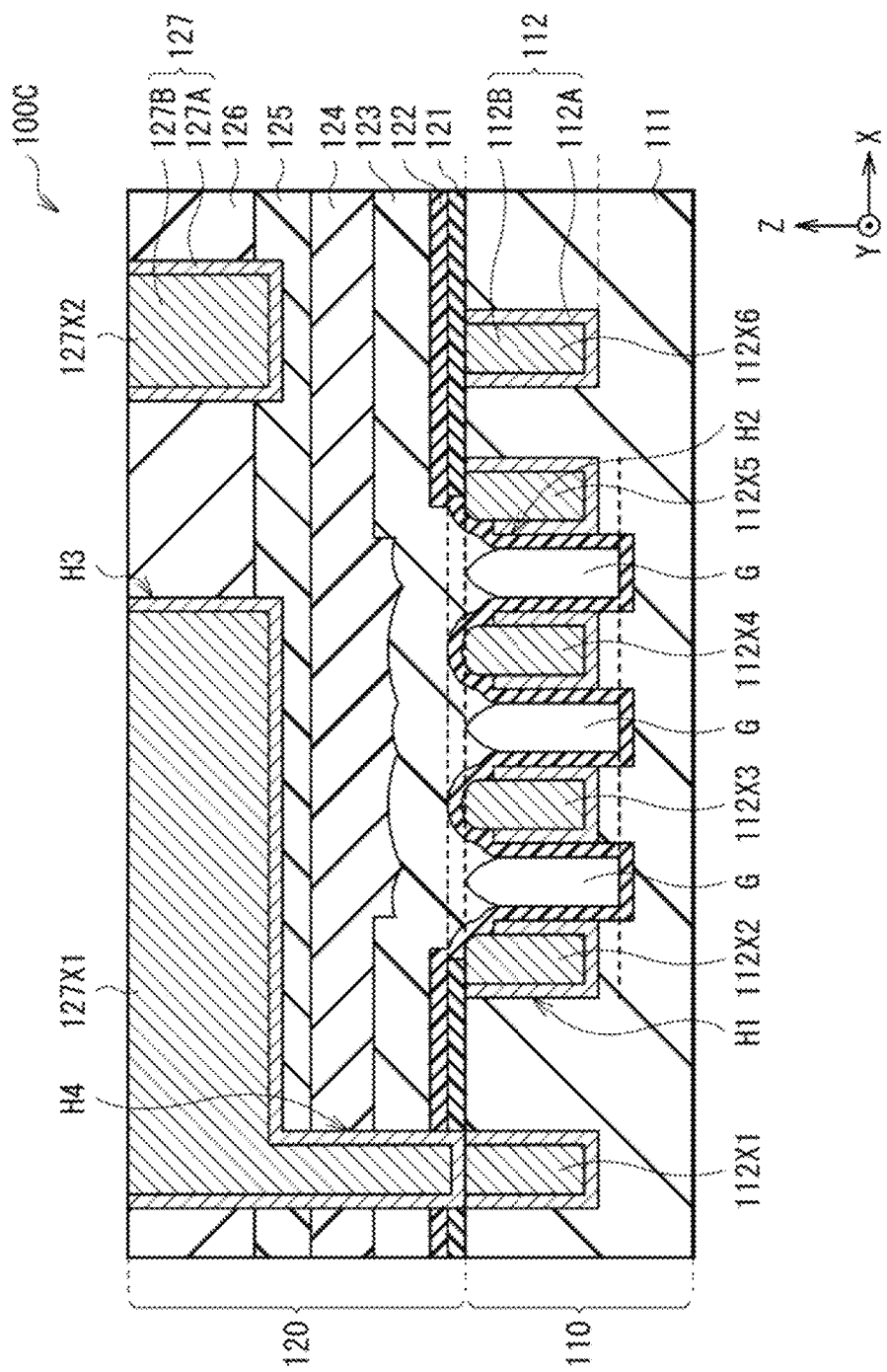
FIG. 22 is a schematic diagram illustrating another example of the cross-sectional configuration of the wiring structure according to the modification example 1 of the present disclosure in the vertical direction.
Figure 23:
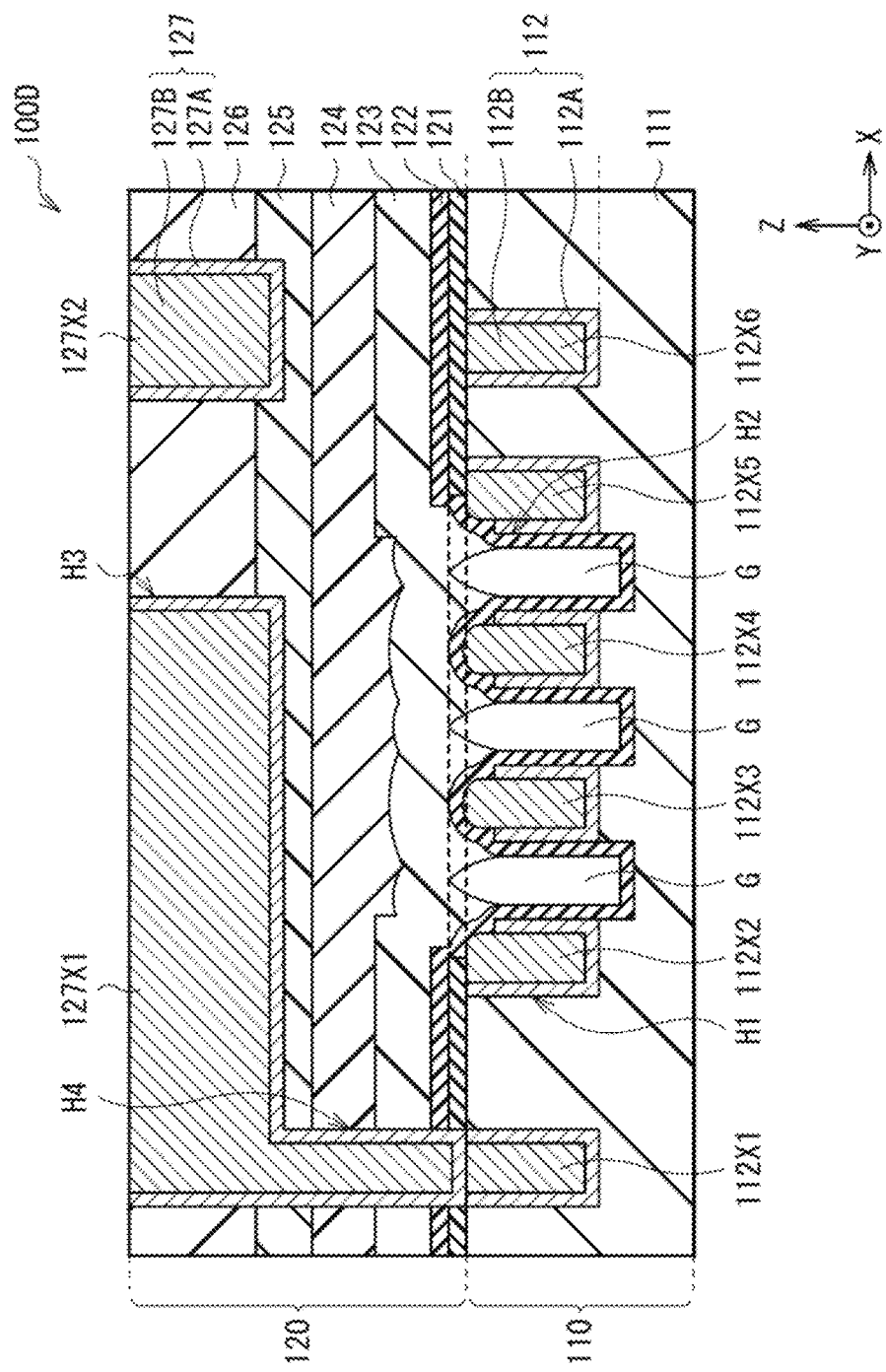
FIG. 23 is a schematic diagram illustrating another example of the cross-sectional configuration of the wiring structure according to the modification example 1 of the present disclosure in the vertical direction.

In addition, as illustrated in FIG. 21, the tops of the gaps G may be formed at positions that are, for example, 10% or more higher than the positions of the upper surfaces of the wiring lines 112X2 to 112X5, for example, in consideration of the end effect of lines of electric force. Alternatively, for example, as illustrated in FIG. 22, the bottoms of the gaps G may be formed at positions that are, for example, 10% or more deeper than the positions of the bottoms of the wiring lines 112X2 to 112X5. Further, the shapes of the gaps G illustrated in FIGS. 21 and 22 may be combined to form the tops of the gaps G at positions higher than the positions of the upper surfaces of the wiring lines 112X2 to 112X5 and form the bottoms of the gaps G at positions deeper than the positions of the bottoms of the wiring lines 112X2 to 112X5 as illustrated in FIG. 23. This makes it possible to further increase the effect of reducing the parasitic capacitance between the wiring lines and the effect of increasing the TDDB.

It is possible to adjust the height of the top and the depth of the bottom of the gap G, for example, as follows.

Figure 24A:
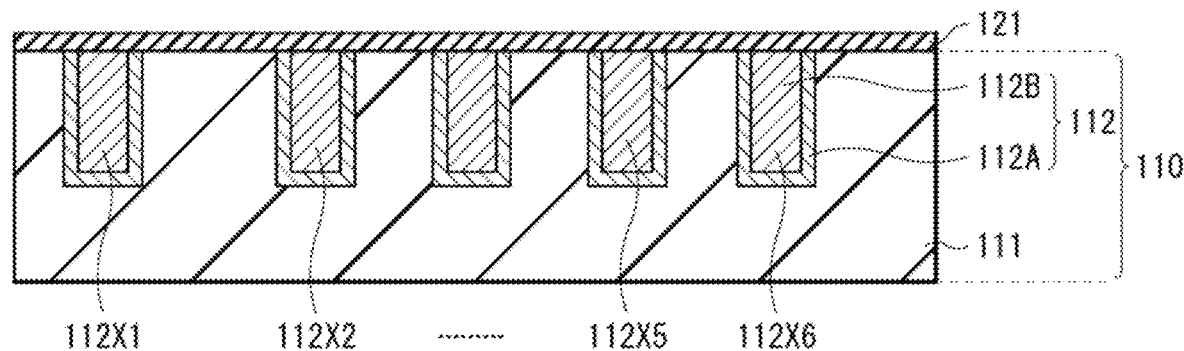
FIG. 24A is a diagram illustrating an example of a process of manufacturing the wiring structure according to the modification example 1 of the present disclosure.

First, as in the first embodiment described above, the insulating film 121 is formed on the first layer 110 by using, for example, a PVD method or a CVD method as illustrated in FIG. 24A. Subsequently, as in the first embodiment described above, portions of the wiring line 112X2 to the wiring line 112X5 and the insulating film 111 are subjected, for example, to dry etching to form the openings H2. In this case, the etching depth is set by targeting positions corresponding to 10% or more of the positions of the bottoms of the wiring line 112X2 to the wiring line 112X5. For example, as illustrated in 24B, this forms the bottom surfaces of the openings H2 at positions deeper than the positions of the bottoms of the wiring line 112X2 to the wiring line 112X5. In addition, in a case where wiring lines (e.g., the wiring lines 112X1 and 112X6) having no influence from the gaps G are targeted as the positions of the bottoms of the gaps G instead of the wiring line 112X2 to the wiring line 112X5 whose capacitance is to be reduced, it is preferable to target, for example, positions corresponding to 10% or more of the sum of the depth of the bottom of the wiring line 112X1 and the depth of the bottom of the wiring line 112X3.

It is to be noted that, in a case where the bottoms of the gaps G have substantially the same depth as that of the bottoms of the wiring lines 112X2 to 112X5 as illustrated in FIGS. 20 and 21, it is sufficient if the etching depth is set by targeting the positions of the bottoms of the wiring line 112X2 to the wiring line 112X5. In addition, in a case where wiring lines (e.g., the wiring lines 112X1 and 112X6) having no influence from the gaps G are targeted as the positions of the bottoms of the gaps G instead of the wiring line 112X2 to the wiring line 112X5 whose capacitance is to be reduced in this case, for example, the position of the bottom of the wiring line 112X1 is similarly targeted.

Figure 24B:
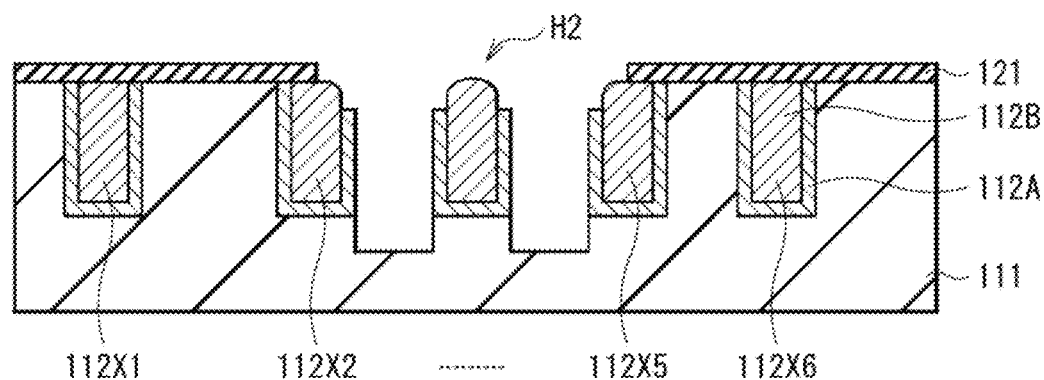
FIG. 24B is a diagram illustrating an example of a manufacturing process subsequent to FIG. 24A.
Figure 24C:
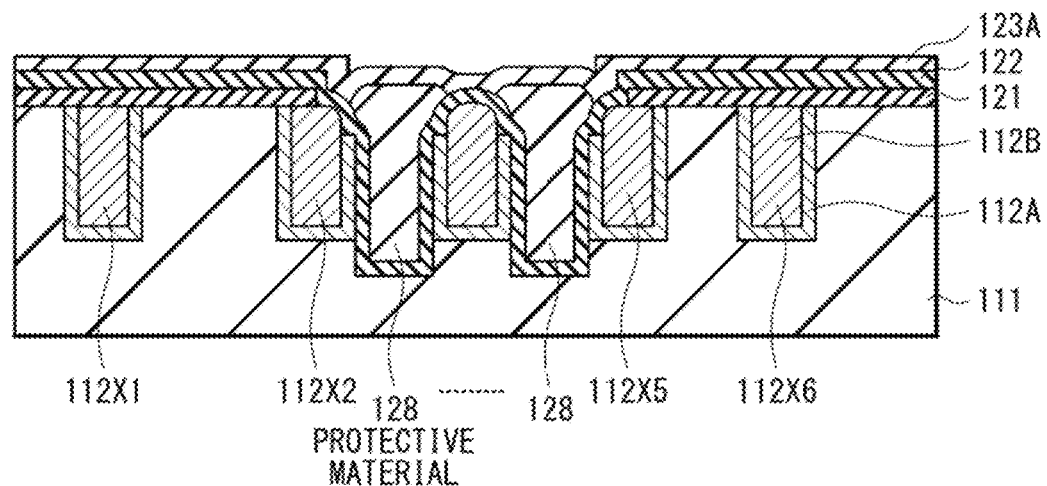
FIG. 24C is a diagram illustrating an example of a manufacturing process subsequent to FIG. 24B.

Next, as illustrated in FIG. 24C, the insulating film 122 that covers the insulating film 121 and the side surfaces and the bottom surfaces of the openings H2 is formed by using, for example, an ALD method as in the first embodiment described above. After that, the respective openings H2 between the wiring line 112X2 to the wiring line 112X5 are each filled with an organic material such as a resist as a protective material 128 by using a phase-shift mask. Subsequently, as illustrated in FIG. 24C, an insulating film 123A is formed, for example, in an environment of 250 deg C. or less. The insulating film 123A includes, for example, SiOC or silicon nitride. In this case, the thickness of the insulating film 123A is adjusted in accordance with the height of the top of each of the gaps G. Specifically, positions are targeted that correspond to 10% or more of the positions of the tops of the wiring line 112X2 to the wiring line 112X5. In addition, in a case where wiring lines (e.g., the wiring lines 112X1 and 112X6) having no influence from the gaps G are targeted as the positions of the tops of the gaps G instead of the wiring line 112X2 to the wiring line 112X5 whose capacitance is to be reduced, it is preferable to target, for example, positions corresponding to 10% or more of the sum of the height of the top of the wiring line 112X1 and the height of the top of the wiring line 112X3.

It is to be noted that, in a case where the tops of the gaps G have substantially the same height as that of the tops of the wiring lines 112X2 to 112X5 as illustrated in FIGS. 20 and 22 and wiring lines (e.g., the wiring lines 112X1 and 112X6) having no influence from the gaps G are targeted as the positions of the tops of the gaps G instead of the wiring line 112X2 to the wiring line 112X5 whose capacitance is to be reduced, it is sufficient if positions are targeted that correspond, for example, to 5% or more of the difference of the height of the top of the wiring line 112X1 from the height of the top of the wiring line 112X3.

Figure 24D:
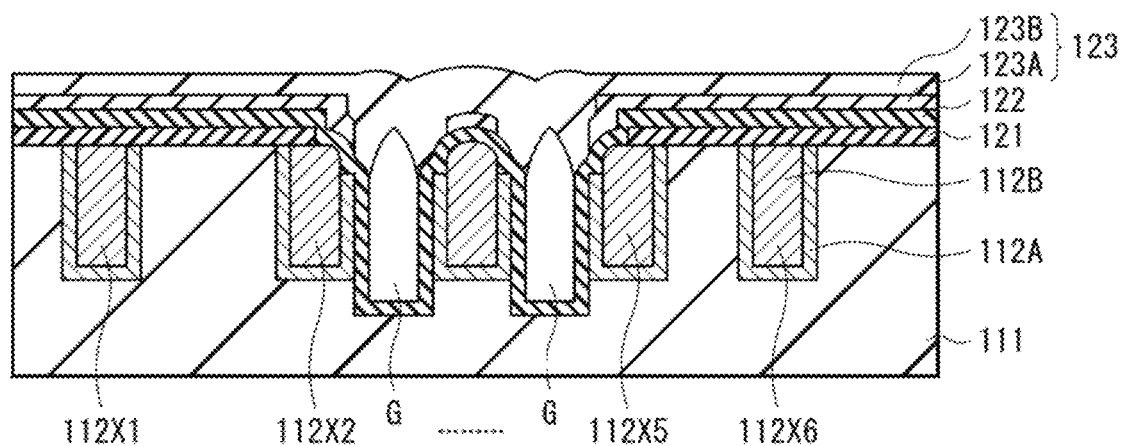
FIG. 24D is a diagram illustrating an example of a manufacturing process subsequent to FIG. 24C.

Next, the protective material 128 and the insulating film 123A formed on the protective material 128 are removed by wet etching or an UV or EB cleaning process. After that, as illustrated in FIG. 24D, an insulating film 123B is formed as in the first embodiment described above. The insulating film 123B includes, for example, SiOC or silicon nitride. In this case, in the present modification example, the height of the region above the wiring line 112X1 to the wiring line 112X6 and the insulating film 111 around the wiring line 112X1 to the wiring line 112X6 is increased by the thickness of the insulating film 123A. This forms the tops of the gaps G formed between the wiring line 112X2 and the wiring line 112X3, between the wiring line 112X3 and the wiring line 112X4, and between the wiring line 112X4 and the wiring line 112V5 at positions higher than the positions of the tops of the wiring lines 112X2 to 112X5.

Figure 25A:
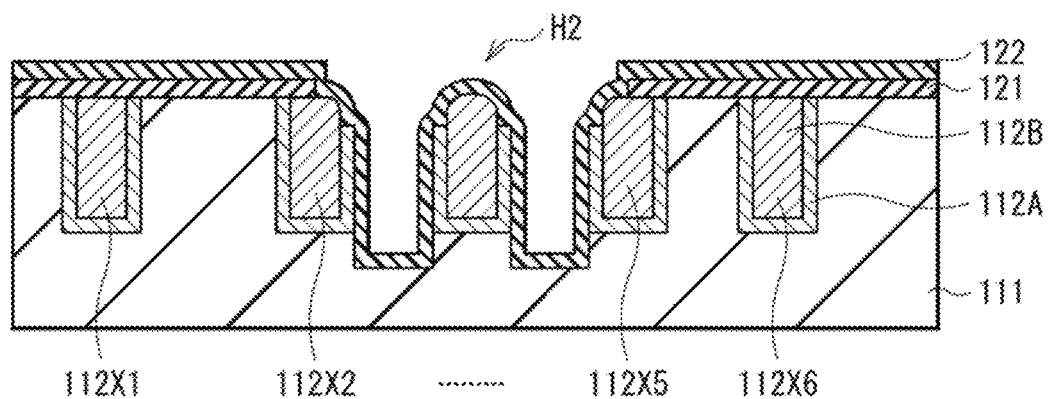
FIG. 25A is a diagram illustrating another example of the process of manufacturing the wiring structure according to the modification example 1 of the present disclosure.
Figure 25B:
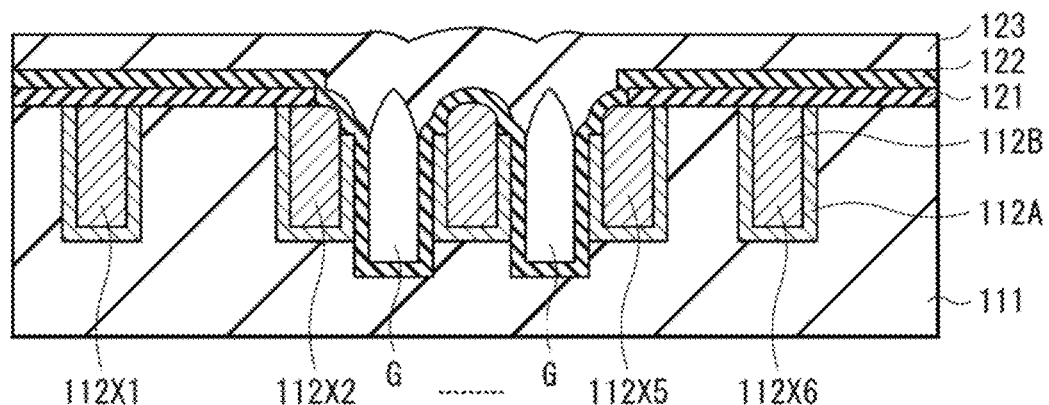
FIG. 25B is a diagram illustrating an example of a manufacturing process subsequent to FIG. 25A.

In addition to the method described above, it is also possible to adjust the formation positions of the tops of the gaps G as with the method described above by forming the insulating film 122, for example, as illustrated in FIG. 25A by using, for example, an ALD method and then forming the insulating film 123 under a film formation condition for a lower coverage ratio as illustrated in FIG. 25B by using, for example, a CVD method. The insulating film 122 covers the insulating film 121 and the side surfaces and the bottom surfaces of the openings H2.

2-2. Modification Example 2

Figure 26:
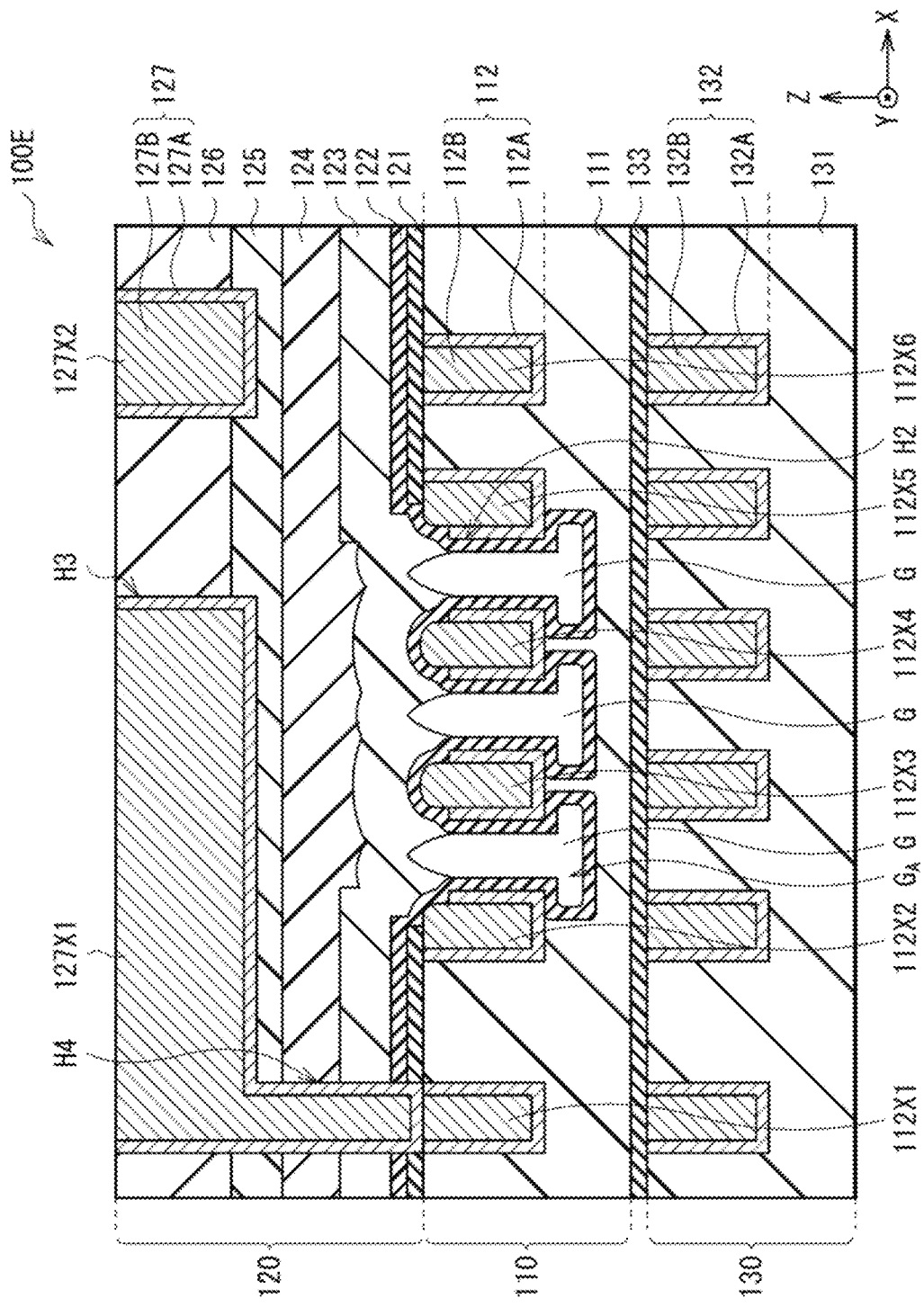
FIG. 26 is a schematic diagram illustrating an example of a cross-sectional configuration of a wiring structure according to a modification example 2 of the present disclosure in the vertical direction.
Figure 27:
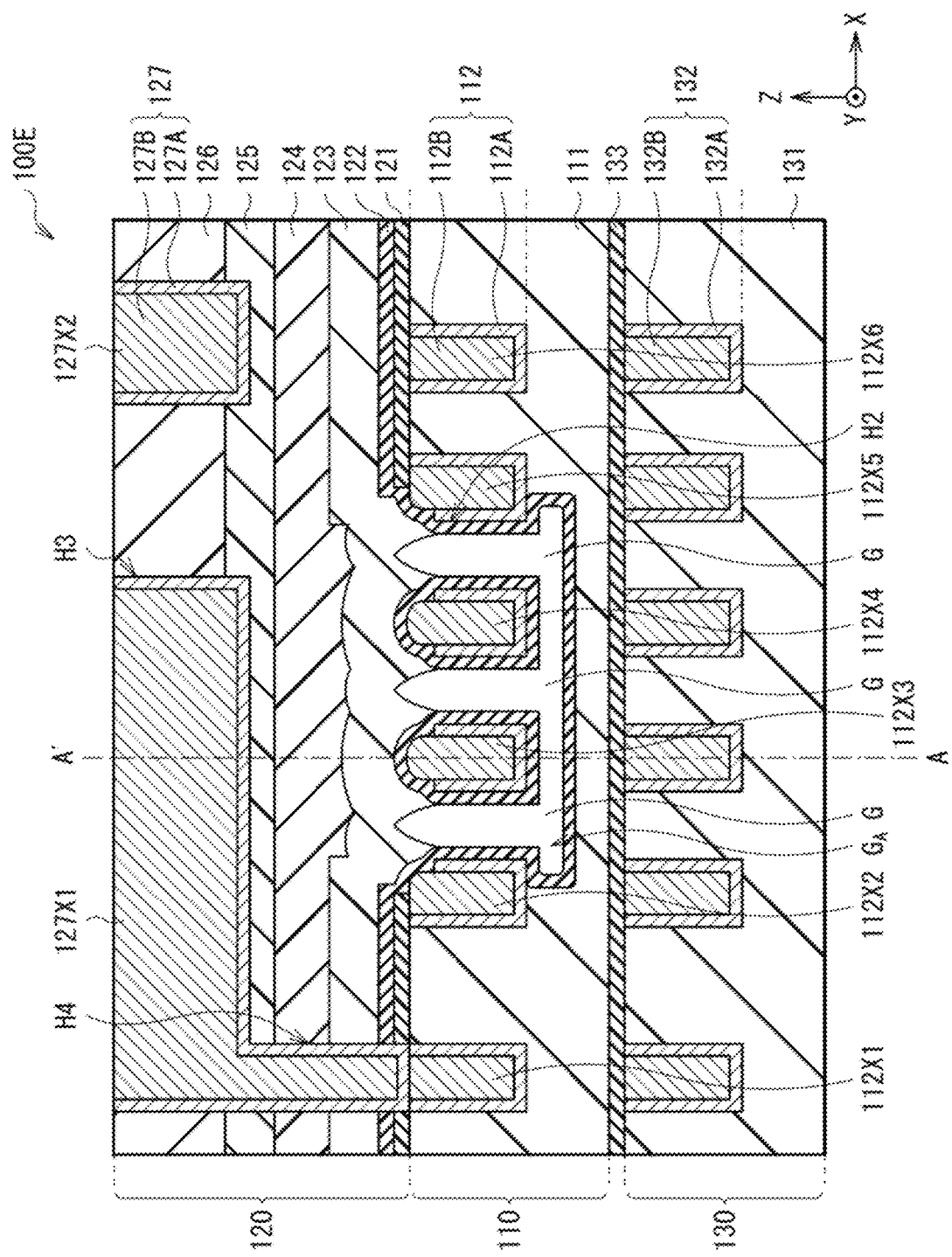
FIG. 27 is a schematic diagram illustrating another example of the cross-sectional configuration of the wiring structure according to the modification example 2 of the present disclosure in the vertical direction.

FIG. 26 schematically illustrates an example of a cross-sectional configuration of a wiring structure (wiring structure 100E) according to a modification example 2 of the present disclosure in the vertical direction. The wiring structure 100E according to the present modification example is provided with a third layer below the first layer 110. In the third layer, a wiring layer 132 is buried in an insulating film 131 as in the first layer 110. The wiring layer 132 includes a plurality of wiring lines extending, for example, in one direction (e.g., the Y axis direction). In the first embodiment or the like described above, the example has been described in which the gaps G are formed between the adjacent wiring line 112X2 and wiring line 112X3, between the adjacent wiring line 112X3 and wiring line 112X4, and between the adjacent wiring line 112X4 and wiring line 112X5, but the shapes of the gaps G are not limited to this. For example, as illustrated in FIG. 26, the gaps G may expand below the bottoms of the wiring lines 112X2 to 112X5 (widened sections GA). Further, these widened sections GA may be continuous with each other at the bottoms of the wiring lines 112X2 to 112X5, for example, as illustrated in FIG. 27.

It is possible to form the widened section GA of each of the gaps G like this, for example, as follows. First, as illustrated in FIG. 24B according to the modification example 1 described above, the respective openings H2 are formed between the wiring lines 112X2 to 112X5. The respective openings H2 have bottom surfaces at positions deeper than the positions of the bottoms of the respective wiring lines 112X2 to 112X5. After that, for example, isotropic etching is performed. This causes the openings H2 to expand, for example, in the X axis direction. After that, the insulating film 122 is formed by using, for example, a CVD method. This forms the insulating film 122 on the wall surfaces of the openings H2. This forms the respective gaps G having the widened sections GA illustrated in FIG. 26 or the like between the adjacent wiring line 112X2 and wiring line 112X3, between the adjacent wiring line 112X3 and wiring line 112X4, and the adjacent wiring line 112X4 and wiring line 112X5.

Figure 28:
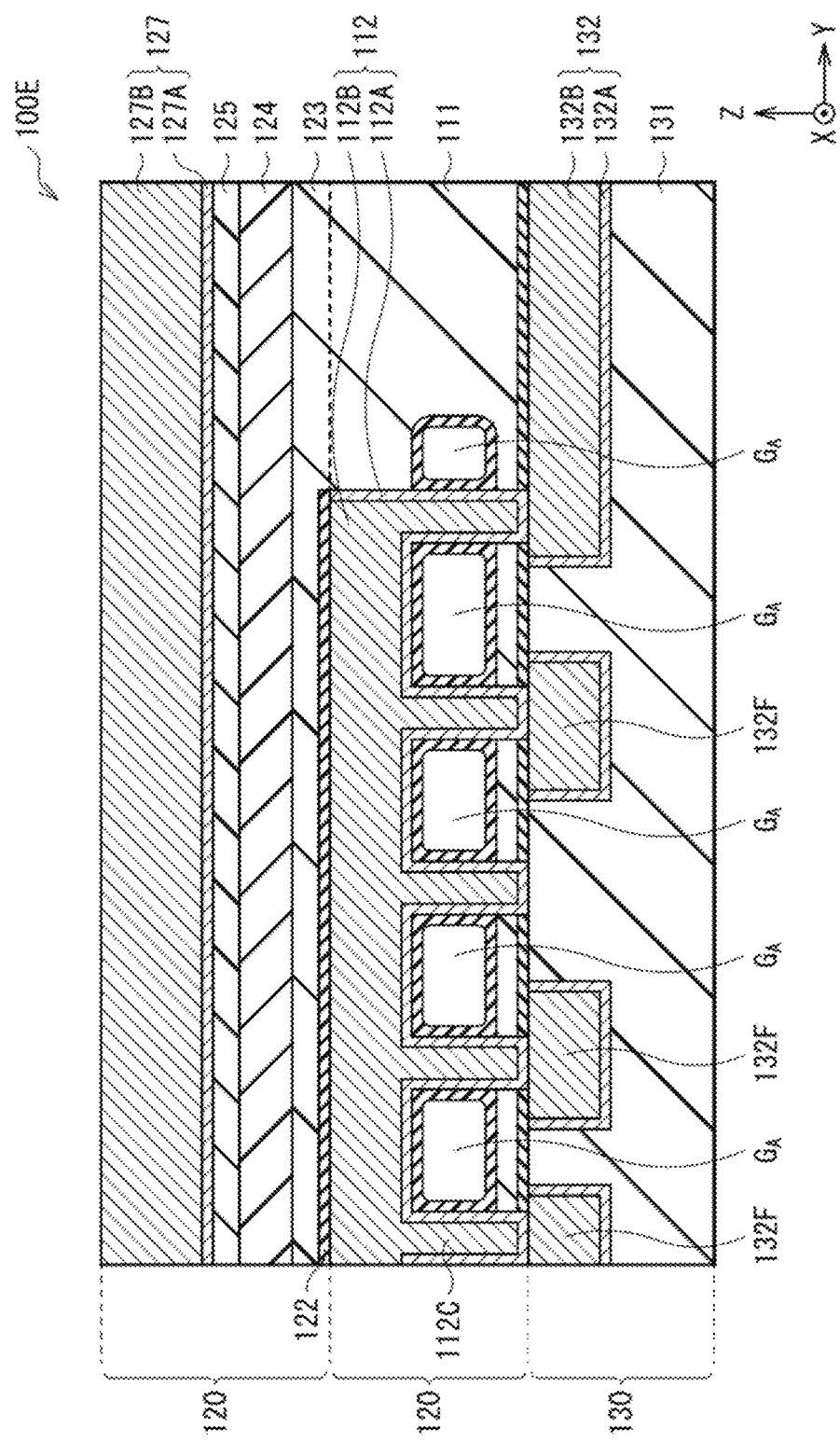
FIG. 28 is a schematic diagram illustrating an example of a cross-sectional configuration of the wiring structure illustrated in FIG. 26 or the like in an extending direction.

It is to be noted that it is preferable from the viewpoint of the strength of these widened sections GA that the insulating film 111 be left between the adjacent widened sections GA as illustrated in FIG. 26. In addition, for example, as illustrated in FIG. 28, there are provided an electrically conducive film 132F and a dummy via 112V as appropriate in a third layer 130 in the extending direction (Y axis direction) of the wiring lines 112X2 to 112X5. This makes it possible to maintain the strength. The electrically conducive film 132F is electrically floating. The dummy via 112V is coupled to this electrically conducive film 132F.

As described above, in the present modification example, the respective gaps G are provided between the adjacent wiring line 112X2 and wiring line 112X3, between the adjacent wiring line 112X3 and wiring line 112X4, and between the adjacent wiring line 112X4 and wiring line 112X5. The respective gaps G extend below the bottoms of the wiring lines 112X2 to 112X5. This makes it possible to reduce the parasitic capacitance between wiring lines in the stack direction in addition to a reduction in the parasitic capacitance between wiring lines in the planar direction.

2-3. Modification Example 3

Figure 29:
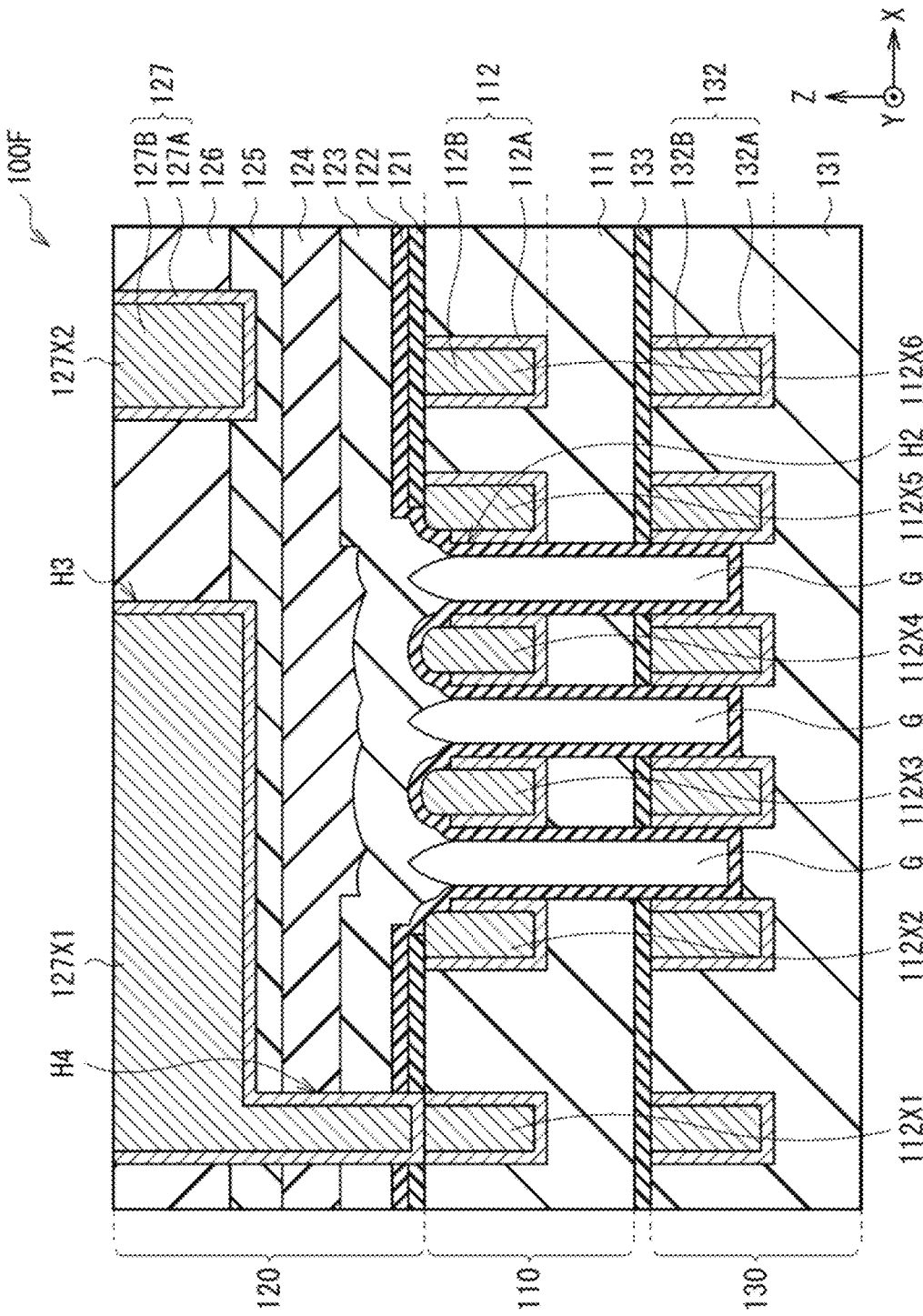
FIG. 29 is a schematic diagram illustrating an example of a cross-sectional configuration of a wiring structure according to a modification example 3 of the present disclosure in the vertical direction.

FIG. 29 schematically illustrates an example of a cross-sectional configuration of a wiring structure (wiring structure 100F) according to the modification example 2 of the present disclosure in the vertical direction. As in the modification example 2 described above, the wiring structure 100F according to the present modification example is provided with the third layer 130 below the first layer 110. In the third layer 130, a wiring layer 132 is buried in an insulating film 131 as in the first layer 110. The wiring layer 132 includes a plurality of wiring lines extending in one direction (e.g., the Y axis direction). The present modification example is different from the embodiment or the like described above in that the gaps G provided between the wiring lines 112X2 to 112X5 in the first layer 110 extend to the regions between the respective wiring lines provided in the third layer 130. It is to be noted that the wiring layer 132 corresponds to a specific example of a "second wiring layer" according to the present disclosure.

These gaps G make it possible to form openings H5 by adjusting the film thickness of the resist film 141 in a case where the insulating film 121 exposed from the resist film 141, portions of the wiring line 112X2 to the wiring line 112X5, and the insulating film 111 are subjected, for example, to dry etching to form the openings H2, for example, as illustrated in FIG. 4C. The openings H5 extend to the third layer 130. In addition, it is possible to form the insulating film 122 by using an ALD method as in the first embodiment described above. The insulating film 122 covers the insulating film 121 and the side surfaces and the bottom surfaces of the openings H5.

It is to be noted that a plurality of respective wiring lines extending in one direction which is formed in the first layer 110 and the third layer 130 is not necessarily formed at positions at which the plurality of respective wiring lines is opposed to each other because of manufacturing step variations (e.g., misalignment and dimensional difference). It is, however, possible to absorb these variations by adjusting the selectivity of dry etching. In addition, FIG. 29 illustrates an example in which the openings H5 each have a columnar shape, but the shapes of the openings H5 are not limited to this. For example, the openings H5 may each have, for example, a tapered shape.

As described above, in the present modification example, the gaps G provided between the wiring lines 112X2 to 112X5 in the first layer 110 are formed to extend to the regions between the wiring lines in the lower layer (third layer 130). This makes it possible to reduce not only the parasitic capacitance between wiring lines in the planar direction, but also the parasitic capacitance between wiring lines in the stack direction.

In addition, in the present modification example, the gaps G provided between the wiring lines 112X2 to 112X5 in the first layer 110 are formed to extend to the regions between the wiring lines in the lower layer (third layer 130). For example, the plurality of wiring lines provided in the third layer and extending in one direction thus has cross-sectional shapes that are the same as each other unlike the wiring lines 112X2 to 112X5 in the first layer. This eliminates the necessity to, for example, adjust, in the third layer 130, the output voltage that takes an IR drop into consideration.

It is to be noted that the example has been described in the present modification example in which the gaps G provided between the wiring lines 112X2 to 112X5 in the first layer 110 are formed to extend to the regions between the wiring lines in the lower layer (third layer 130). However, for example, in a case where there is further provided a layer having a similar configuration below the third layer 130, the gaps G may be formed to extend to that layer. In addition, the gaps G extending to only the first layer 110 or the first layer 110 and the third layer 130 may be mixed.

As described in the first embodiment described above, the wiring structure 100 in which a plurality of wiring lines (e.g., the wiring line 112X1 to the wiring line 112X6) extends in one direction (e.g., the Y axis direction) may have varied wiring widths and varied wiring interval in spite of wiring pitches (wiring widths and wiring intervals) having the same design because of manufacturing variations caused by the lithography and etching of wiring patterns. This causes variations in the capacitance between wiring lines. The use of the following method makes it possible to reduce these variations in the capacitance between the wiring lines caused by the varied wiring widths and the varied wiring intervals.

3. Second Embodiment

Figure 30:
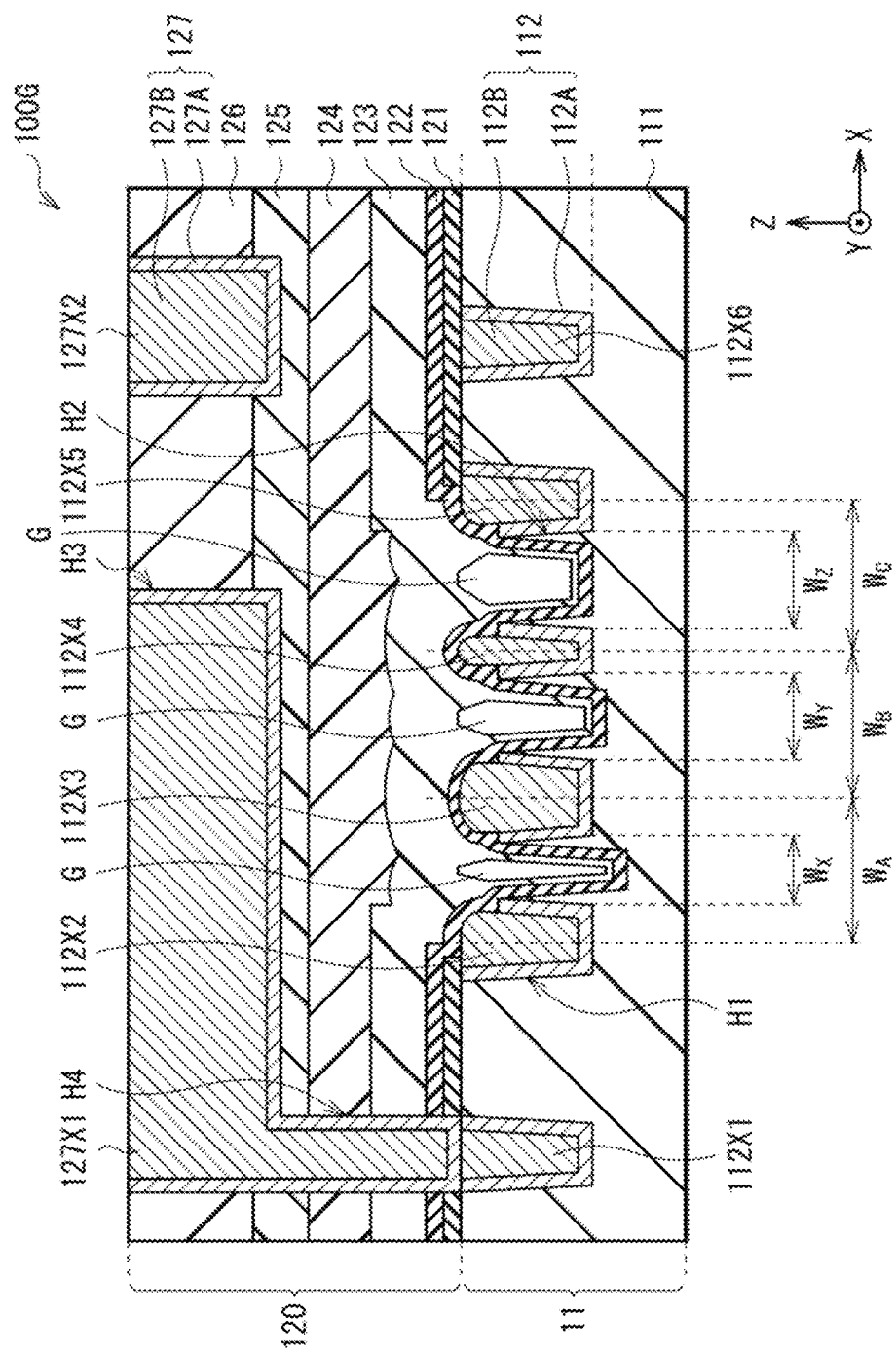
FIG. 30 is a schematic diagram illustrating an example of a cross-sectional configuration of a wiring structure according to a second embodiment of the present disclosure in the vertical direction.

FIG. 30 schematically illustrates an example of a cross-sectional configuration of a wiring structure (wiring structure 100G) according to a second embodiment of the present disclosure in the vertical direction. As described above, in the wiring structure 100G, a plurality of wiring lines (e.g., the wiring line 112X2 to the wiring line 112X5) extending in one direction (e.g., the Y axis direction) has wiring widths and wiring intervals different from each other.

Specifically, wiring pitches WA, WB, and We between the wiring line 112X2 to wiring line 112X5 are the same, but the respective wiring widths are different. An interval $W_X$ between the adjacent wiring line 112X2 and wiring line 112X3, an interval $W_Y$ between the adjacent wiring line 112X3 and wiring line 112X4, and an interval $W_Z$ between the adjacent wiring line 112X4 and wiring line 112X5 satisfy, for example, $W_X < W_Y < W_Z$.

Figure 31:
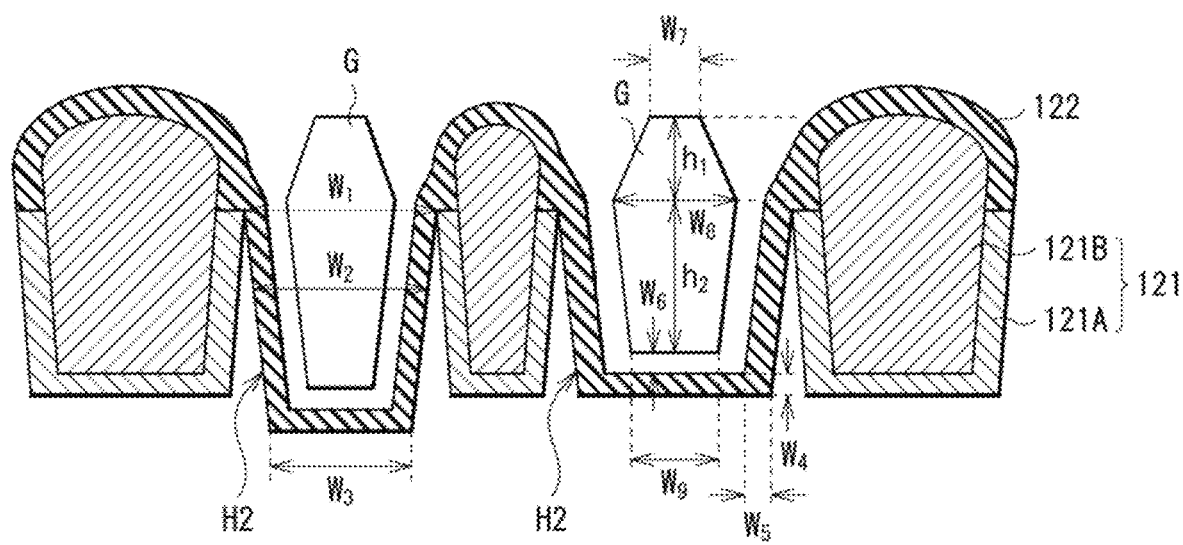
FIG. 31 is a diagram describing a shape of each of sections of the wiring structure illustrated in FIG. 30.

In a case where the respective wiring widths and wiring intervals are different in this way, it is possible to reduce variations in the capacitance between the wiring lines caused by the varied wiring widths and the varied wiring intervals by changing the shapes of the insulating films 122 and 123 formed on the side walls of the openings H2 between the respective wiring lines (the wiring line 112X2 to the wiring line 112X5) and the gaps G, for example, as illustrated in FIG. 31 and Table 1. For example, in a case where a width $W_1$ of the upper section of each of the opening H2 is decreased, a width $W_2$ of the middle section and a width $W_3$ of the lower section of the opening H2 are similarly decreased. In contrast, a thickness $W_4$ of the insulating film 122 on the bottom of the opening H2 and a thickness $W_5$ of a side surface of the insulating film 122 and a thickness $W_6$ of the insulating film 123 formed on the bottom of the opening H2 are substantially constant in spite of the changing wiring widths and wiring intervals. In addition, a width $W_7$ of the top, a width $W_8$ of the middle section, and a width $W_9$ of the lower section of each of the gaps G are each decreased. A height $h_1$ of the upper section of the gap G is slightly decreased. A height $h_2$ of the lower section is considerably increased.

TABLE 1

| | |
|---|---|
| $W_1$ | decreased |
| $W_2$ | decreased |
| $W_3$ | decreased |
| $W_4$ | no change |
| $W_5$ | no change |
| $W_6$ | no change |
| $W_7$ | decreased |
| $W_8$ | decreased |
| $W_8$ | decreased |
| $h_1$ | slightly decreased |
| $h_2$ | considerably increased |

It is possible to form the thicknesses of the insulating films 122 and 123 and the shapes of the gaps G, for example, in a self-aligning manner. The thicknesses of the insulating films 122 and 123 and the shapes of the gaps G correspond to the respective changing wiring widths and wiring intervals like the present modification example. The insulating films 122 and 123 are formed on the side walls of the openings H2 between the respective wiring lines (the wiring line 112X2 to the wiring line 112X5). Specifically, in a case where the openings H2 are formed as illustrated in FIG. 4C, dry etching is performed by using an etchant gas having a high deposition component such as octafluorocyclobutane ($C_4F_8$) diluted, for example, with nitrogen ($N_2$), argon (Ar), or the like while heating, for example, at high temperature. This forms the deeper openings H2 at narrower wiring intervals. The insulating film 123 for which a CVD method is used next forms the gaps G corresponding to the shapes of the respective openings H2. This reduces variations in the capacitance between the wiring lines caused by the varied wiring widths and the varied wiring intervals.

4. Third Embodiment

Figure 32:
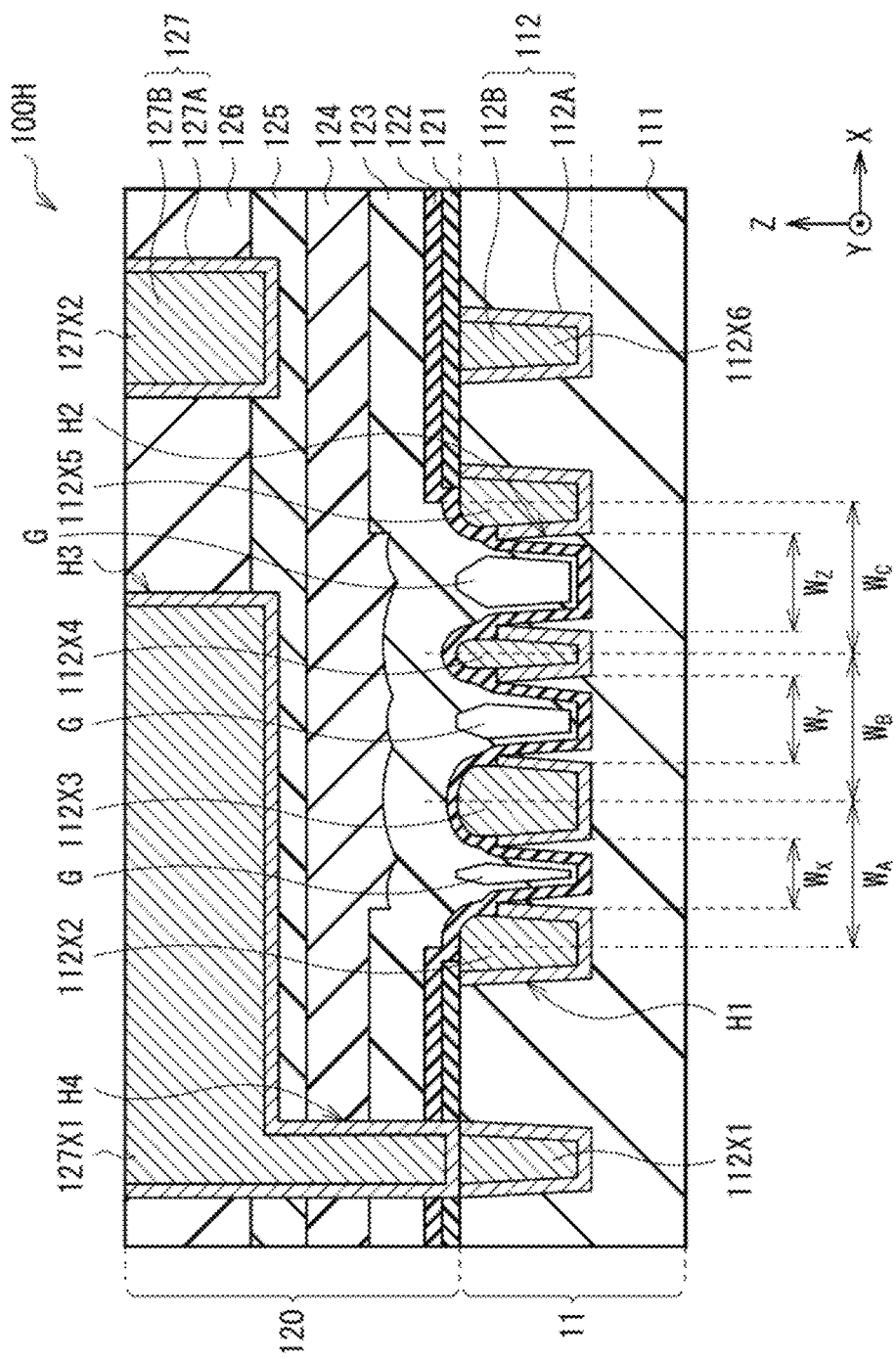
FIG. 32 is a schematic diagram illustrating an example of a cross-sectional configuration of a wiring structure according to a third embodiment of the present disclosure in the vertical direction.

FIG. 32 schematically illustrates an example of a cross-sectional configuration of a wiring structure (wiring structure 100H) according to a third embodiment of the present disclosure in the vertical direction. As in the second embodiment described above, in the wiring structure 100H, a plurality of wiring lines (e.g., the wiring line 112X2 to the wiring line 112X5) extending in one direction (e.g., the Y axis direction) is formed at wiring widths and wiring intervals different from each other.

Specifically, the wiring pitches WA, WB, and Wc between the wiring line 112X2 to wiring line 112X5 are the same, but the respective wiring widths are different. The interval $W_X$ between the wiring line 112X2 and the wiring line 112X3, the interval $W_Y$ between the wiring line 112X3 and the wiring line 112X4, and the interval $W_Z$ between the wiring line 112X4 and the wiring line 112X5 satisfy, for example, $W_X < W_Y < W_Z$.

Figure 33:
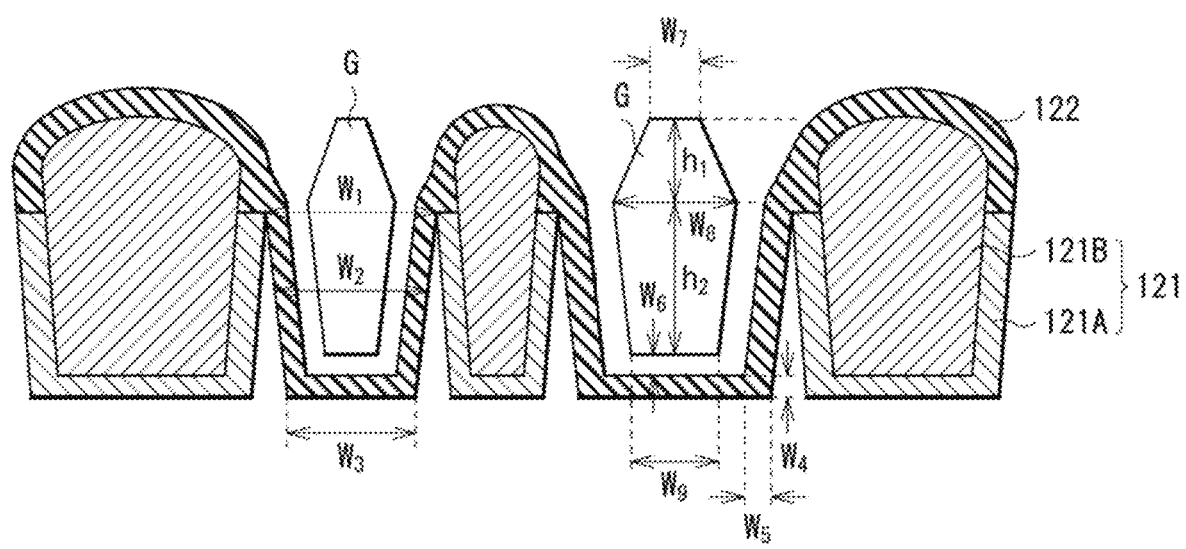
FIG. 33 is a diagram describing a shape of each of sections of the wiring structure illustrated in FIG. 32.

In a case where the respective wiring widths and wiring intervals are different in this way, it is possible to reduce variations in the capacitance between the wiring lines caused by the varied wiring widths and the varied wiring intervals by changing the shapes of the insulating films 122 and 123 formed on the side walls of the openings H2 between the respective wiring lines (the wiring line 112X2 to the wiring line 112X5) and the gaps G, for example, as illustrated in FIG. 33 and Table 2. For example, in a case where the width $W_1$ of the upper section of each of the openings H2 is decreased, the width $W_2$ of the middle section and the width $W_3$ of the lower section of the opening H2, the thickness $W_4$ of the insulating film 122 on the bottom of the opening H2 and the thickness $W_5$ of a side surface of the insulating film 122, and the thickness $W_6$ of the insulating film 123 formed on the bottom of the opening H2 are each decreased. In addition, the width $W_7$ of the top, the width $W_8$ of the middle section, and the width $W_9$ of the lower section of each of the gaps G and the height $h_1$ of the upper section of the gap G are slightly decreased. The height $h_2$ of the lower section is considerably increased.

TABLE 2

| | |
|---|---|
| $W_1$ | decreased |
| $W_2$ | decreased |
| $W_3$ | decreased |
| $W_4$ | decreased |
| $W_5$ | decreased |
| $W_6$ | decreased |
| $W_7$ | slightly decreased |
| $W_8$ | slightly decreased |
| $W_8$ | slightly decreased |
| $h_1$ | slightly decreased |
| $h_2$ | considerably increased |

It is possible to form the changing shapes of the insulating films 122 and 123 and the gaps G, for example, in a self-aligning manner. The changing shapes of the insulating films 122 and 123 and the gaps G are made by the respective changing wiring widths and wiring intervals like the present modification example. The insulating films 122 and 123 are formed on the side walls of the openings H2 between the respective wiring lines (the wiring line 112X2 to the wiring line 112X5). Specifically, in a case where the insulating film 122 is formed as illustrated in FIG. 4E, the insulating film 122 is formed at 350° C. by using, for example, vapor reaction precursor species such as $Si(CH_3)H$ and $N_2$ or $SiH_4$ and $N_2$ each having a conformality of less than 0.5, which is defined by dividing, for example, the thickness of the insulating film 122 on the bottom of the opening H2 by the thickness of the insulating film 122 on the insulating film 121. This forms the thinner insulating film 122 on the side surfaces and the bottom surfaces of the openings H2 between the respective wiring lines as the wiring intervals are narrower. Next, the insulating film 123 is formed at 350° C. by using, for example, vapor reaction precursor species such as $SiH_4$ and $O_2$ each having a conformality of less than 0.5, which is defined by dividing, for example, the thickness of the insulating film 123 on the bottom of the opening H2 by the thickness of the insulating film 123 above the insulating film 121 outside the opening H2. This forms the thinner insulating film 123 on the side surfaces and the bottom surfaces of the openings H2 between the respective wiring lines as the wiring intervals are narrower. This reduces variations in the capacitance between the wiring lines caused by the varied wiring widths and the varied wiring intervals.

5. Modification Examples

5-1. Modification Example 4

Figure 34:
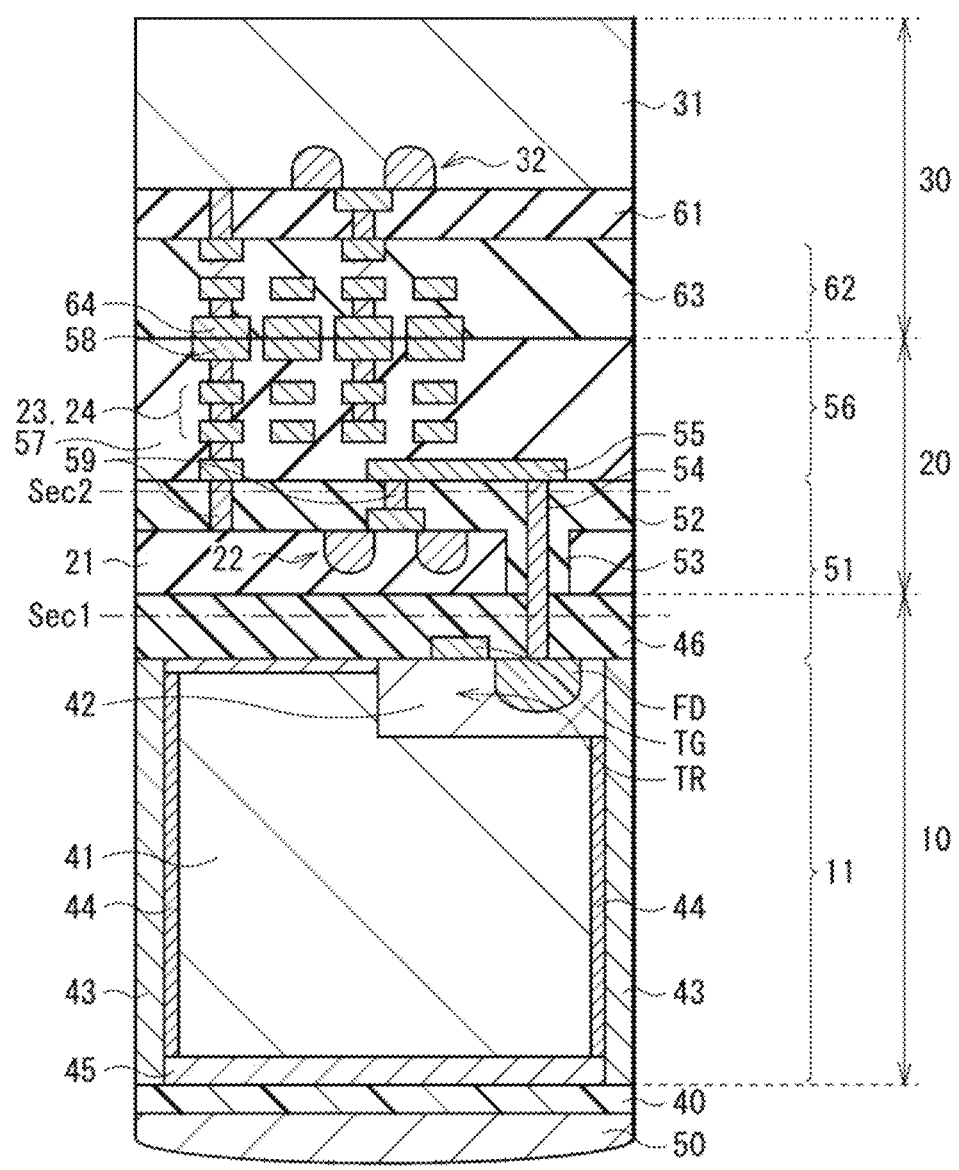
FIG. 34 is a diagram illustrating an example of a cross-sectional configuration of an imaging device according to a modification example 4 of the present disclosure in the vertical direction.

FIG. 34 illustrates an example of a cross-sectional configuration of an imaging device (imaging device 1) according to a modification example (modification example 4) of the present embodiment described above in the vertical direction. In the present modification example, the transfer transistor TR includes a planar transfer gate TG. Therefore, the transfer gate TG does not penetrate the p-well layer 42, but is formed on the front surface of the semiconductor substrate 11 alone. Even in a case where the planar transfer gate TG is used for the transfer transistor TR, the imaging device 1 has effects similar to those of the embodiment described above.

5-2. Modification Example 5

Figure 35:
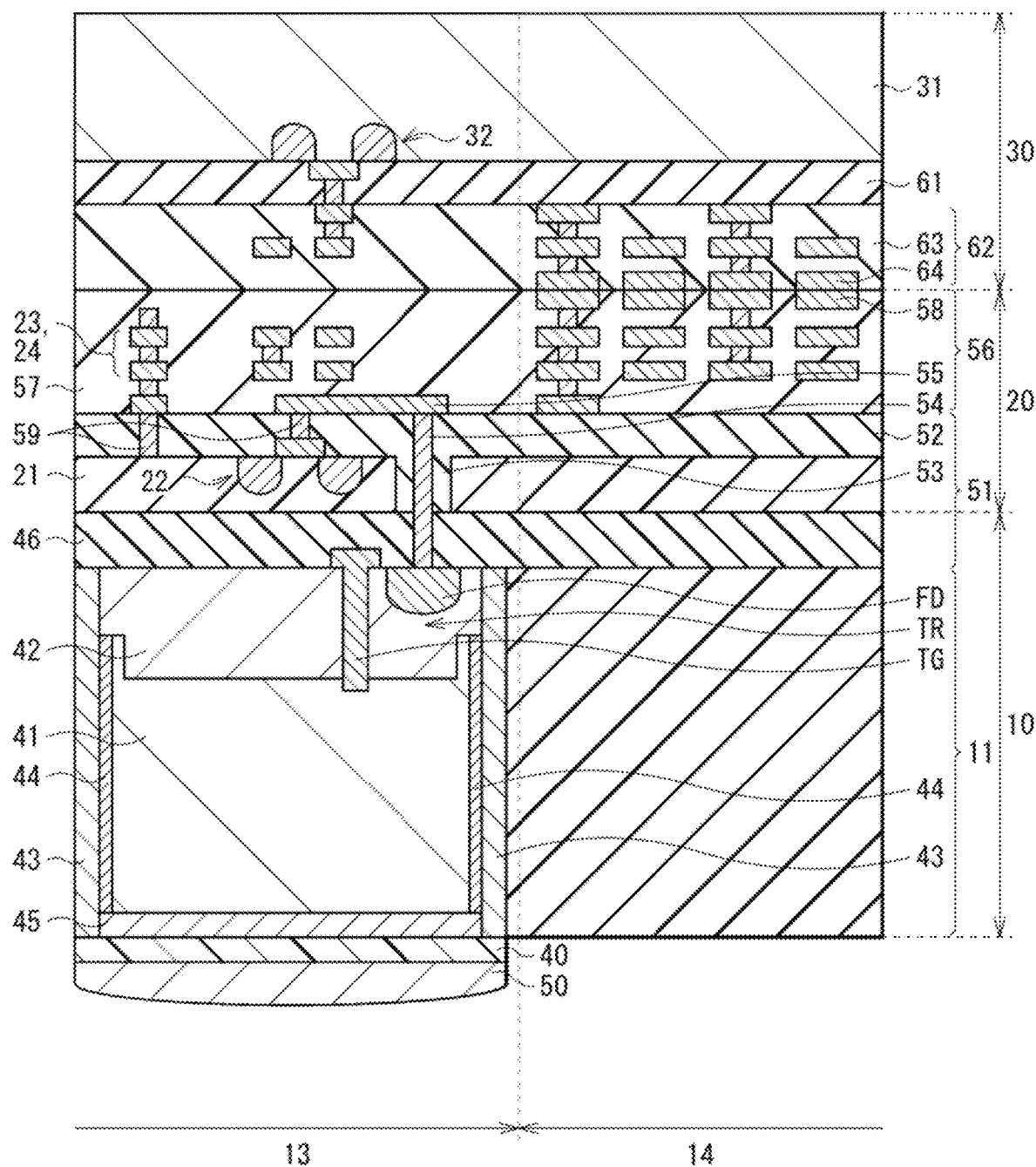
FIG. 35 is a diagram illustrating an example of a cross-sectional configuration of an imaging device according to a modification example 5 of the present disclosure in the vertical direction.

FIG. 35 illustrates an example of a cross-sectional configuration of an imaging device (imaging device 1) according to a modification example (modification example 5) of the present embodiment described above in the vertical direction. In the present modification example, the second substrate 20 and the third substrate 30 are electrically coupled in a region opposed to a peripheral region 14 on the first substrate 10. The peripheral region 14 corresponds to a frame region of the first substrate 10 and is provided on the periphery of the pixel region 13. In the present modification example, the second substrate 20 includes the plurality of pad electrodes 58 in the region opposed to the peripheral region 14 and the third substrate 30 includes the plurality of pad electrodes 64 in the region opposed to the peripheral region 14. The second substrate 20 and the third substrate 30 are electrically coupled to each other by bonding the pad electrodes 58 and 64 to each other. The pad electrodes 58 and 64 are provided in a region opposed to the peripheral region 14.

In this way, in the present modification example, the second substrate 20 and the third substrate 30 are electrically coupled to each other by bonding the pad electrodes 58 and 64 to each other. The pad electrodes 58 and 64 are provided in a region opposed to the peripheral region 14. This makes it possible to reduce the possibility of preventing one pixel from having smaller area as compared with a case where the pad electrodes 58 and 64 are bonded to each other in a region opposed to the pixel region 13. Thus, in addition to the effects of the embodiment described above, it is possible to provide the imaging device 1 having a three-layer structure that does not prevent one pixel from having smaller area while maintaining a chip size equivalent to an existing chip size.

5-3. Modification Example 6

FIG. 36 illustrates an example of a cross-sectional configuration of an imaging device (imaging device 1) according to a modification example (modification example 6) of the present embodiment described above in the vertical direction. FIG. 37 illustrates another example of the cross-sectional configuration of the imaging device (imaging device 1) according to the modification example (modification example 5) of the present embodiment described above in the vertical direction. The diagram on the upper side of each of FIGS. 36 and 37 is a modification example of the cross-sectional configuration taken along the cross section Sec1 in FIG. 5 and the diagram on the lower side of FIG. 36 is a modification example of the cross-sectional configuration taken along the cross section Sec2 in FIG. 5. It is to be noted that a diagram illustrating a modification example of the front surface configuration of the semiconductor substrate 11 in FIG. 5 is superimposed on a diagram illustrating the modification example of the cross-sectional configuration taken along the cross section Sec1 in FIG. 5 and the insulating layer 46 is omitted in the cross-sectional view on the upper side of each of FIGS. 36 and 37. In addition, a diagram illustrating a modification example of the front surface configuration of the semiconductor substrate 21 is superimposed on a diagram illustrating the modification example of the cross-sectional configuration taken along the cross section Sec2 in FIG. 5 in the cross-sectional view on the lower side of each of FIGS. 36 and 37.

As illustrated in FIGS. 36 and 37, the plurality of through wiring lines 54, the plurality of through wiring lines 48, and the plurality of through wiring lines 47 (the plurality of dots disposed in the diagrams) are disposed side by side in a strip shape in the first direction V (the left/right direction in FIGS. 36 and 37) within the plane of the first substrate 10. It is to be noted that each of FIGS. 36 and 37 exemplifies a case where the plurality of through wiring lines 54, the plurality of through wiring lines 48, and the plurality of through wiring lines 47 are disposed side by side in two rows in the first direction V. In the four sensor pixels 12 that share the readout circuit 22, the four floating diffusions FD are disposed close to each other, for example, with the element separation section 43 interposed in between. In the four sensor pixels 12 that share the readout circuit 22, the four transfer gates TG (TG1, TG2, TG3, and TG4) are disposed to surround the four floating diffusions FD and the four transfer gates TG form, for example, an annular shape.

The insulating layer 53 includes a plurality of blocks extending in the first direction V. The semiconductor substrate 21 extends in the first direction V and includes the plurality of island-shaped blocks 21A disposed side by side in the second direction H orthogonal to the first direction V with the insulating layer 53 interposed in between. Each of the blocks 21A is provided, for example, with the reset transistor RST, the amplification transistor AMP, and the selection transistor SEL. The one readout circuit 22 that is shared by the four sensor pixels 12 is not disposed, for example, to be right opposed to the four sensor pixels 12, but disposed to shift in the second direction H.

In FIG. 36, the one readout circuit 22 shared by the four sensor pixels 12 includes the reset transistor RST, the amplification transistor AMP, and the selection transistor SEL in a region obtained by shifting the region opposed to the four sensor pixels 12 in the second direction H on the second substrate 20. The one readout circuit 22 shared by the four sensor pixels 12 includes, for example, the amplification transistor AMP, the reset transistor RST, and the selection transistor SEL in the one block 21A.

In FIG. 37, the one readout circuit 22 shared by the four sensor pixels 12 includes the reset transistor RST, the amplification transistor AMP, the selection transistor SEL, and FD transfer transistor FDG in a region obtained by shifting the region opposed to the four sensor pixels 12 in the second direction H on the second substrate 20. The one readout circuit 22 shared by the four sensor pixels 12 includes, for example, the amplification transistor AMP, the reset transistor RST, the selection transistor SEL, and the FD transfer transistor FDG in the one block 21A.

In the present modification example, the one readout circuit 22 that is shared by the four sensor pixels 12 is not disposed, for example, to be right opposed to the four sensor pixels 12, but disposed to shift from the position opposed right opposed to the four sensor pixels 12 in the second direction H. In such a case, it is possible to shorten the wiring line 25 or it is possible to omit the wiring line 25 and cause the source of the amplification transistor AMP and the drain of the selection transistor SEL to include a common impurity region. As a result, it is possible to reduce the size of the readout circuit 22 or increase the size of another component in the readout circuit 22.

5-4. Modification Example 7

Figure 38:
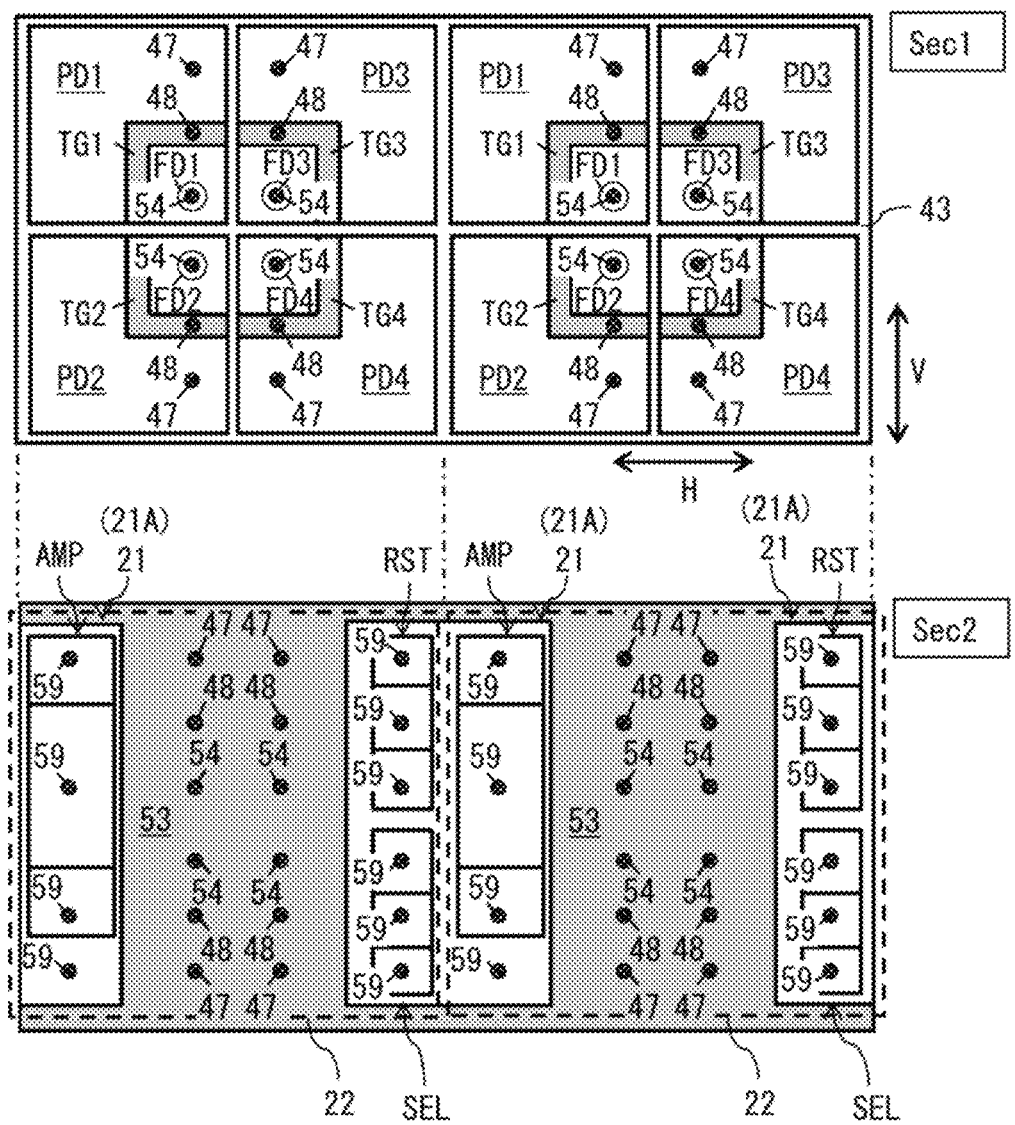
FIG. 38 is a diagram illustrating an example of a cross-sectional configuration of an imaging device according to a modification example 7 of the present disclosure in the horizontal direction.

FIG. 38 illustrates an example of a cross-sectional configuration of an imaging device (imaging device 1) according to a modification example (modification example 7) of the present embodiment described above in the horizontal direction. FIG. 38 illustrates a modification example of the cross-sectional configuration in FIG. 13.

In the present modification example, the semiconductor substrate 21 includes the plurality of island-shaped blocks 21A disposed side by side in the first direction V and the second direction H with the insulating layer 53 interposed in between. Each of the blocks 21A is provided, for example, with one set of the reset transistor RST, the amplification transistor AMP, and the selection transistor SEL. In such a case, it is possible to cause the insulating layer 53 to suppress the crosstalk between the readout circuits 22 adjacent to each other, making it possible to suppress image quality degradation due to a decrease in resolution and color mixing on a reproduced image.

5-5. Modification Example 8

Figure 39:
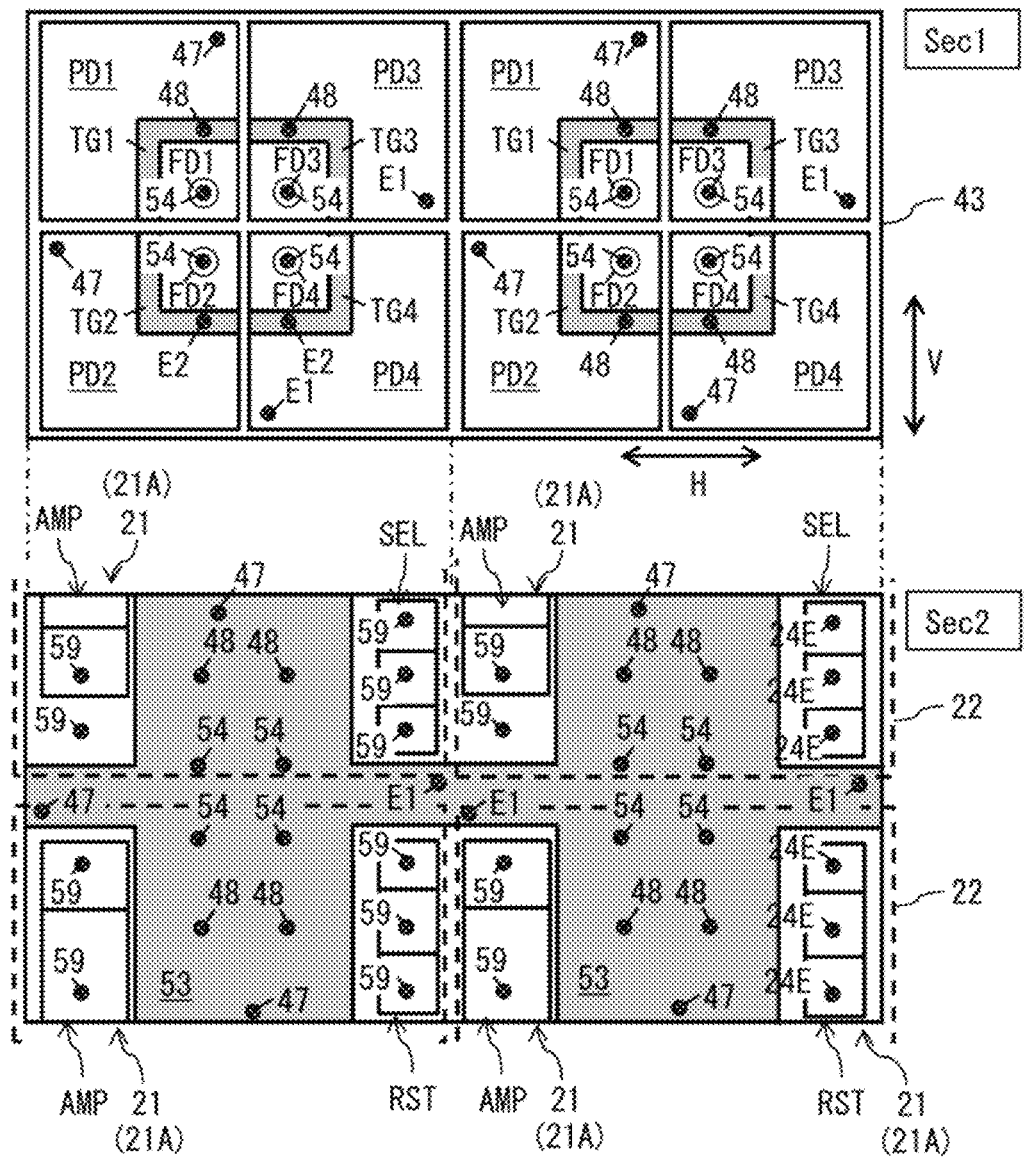
FIG. 39 is a diagram illustrating an example of a cross-sectional configuration of an imaging device according to a modification example 8 of the present disclosure in the horizontal direction.

FIG. 39 illustrates an example of a cross-sectional configuration of an imaging device (imaging device 1) according to a modification example (modification example 8) of the present embodiment described above in the horizontal direction. FIG. 39 illustrates a modification example of the cross-sectional configuration in FIG. 38.

In the present modification example, the one readout circuit 22 that is shared by the four sensor pixels 12 is not disposed, for example, to be right opposed to the four sensor pixels 12, but disposed to shift in the first direction V. Further, in the present modification example, the semiconductor substrate 21 includes the plurality of island-shaped blocks 21A disposed side by side in the first direction V and the second direction H with the insulating layer 53 interposed in between as in the modification example 6. Each of the blocks 21A is provided, for example, with one set of the reset transistor RST, the amplification transistor AMP, and the selection transistor SEL. In the present modification example, the plurality of through wiring lines 47 and the plurality of through wiring lines 54 are further disposed even in the second direction H. Specifically, the plurality of through wiring lines 47 is disposed between the four through wiring lines 54 that share the certain readout circuit 22 and the four through wiring lines 54 that share the other readout circuit 22 adjacent to the certain readout circuit 22 in the second direction H. In such a case, it is possible to cause the insulating layer 53 and the through wiring line 47 to suppress the crosstalk between the readout circuits 22 adjacent to each other, making it possible to suppress image quality degradation due to a decrease in resolution and color mixing on a reproduced image.

5-6. Modification Example 9

Figure 40:
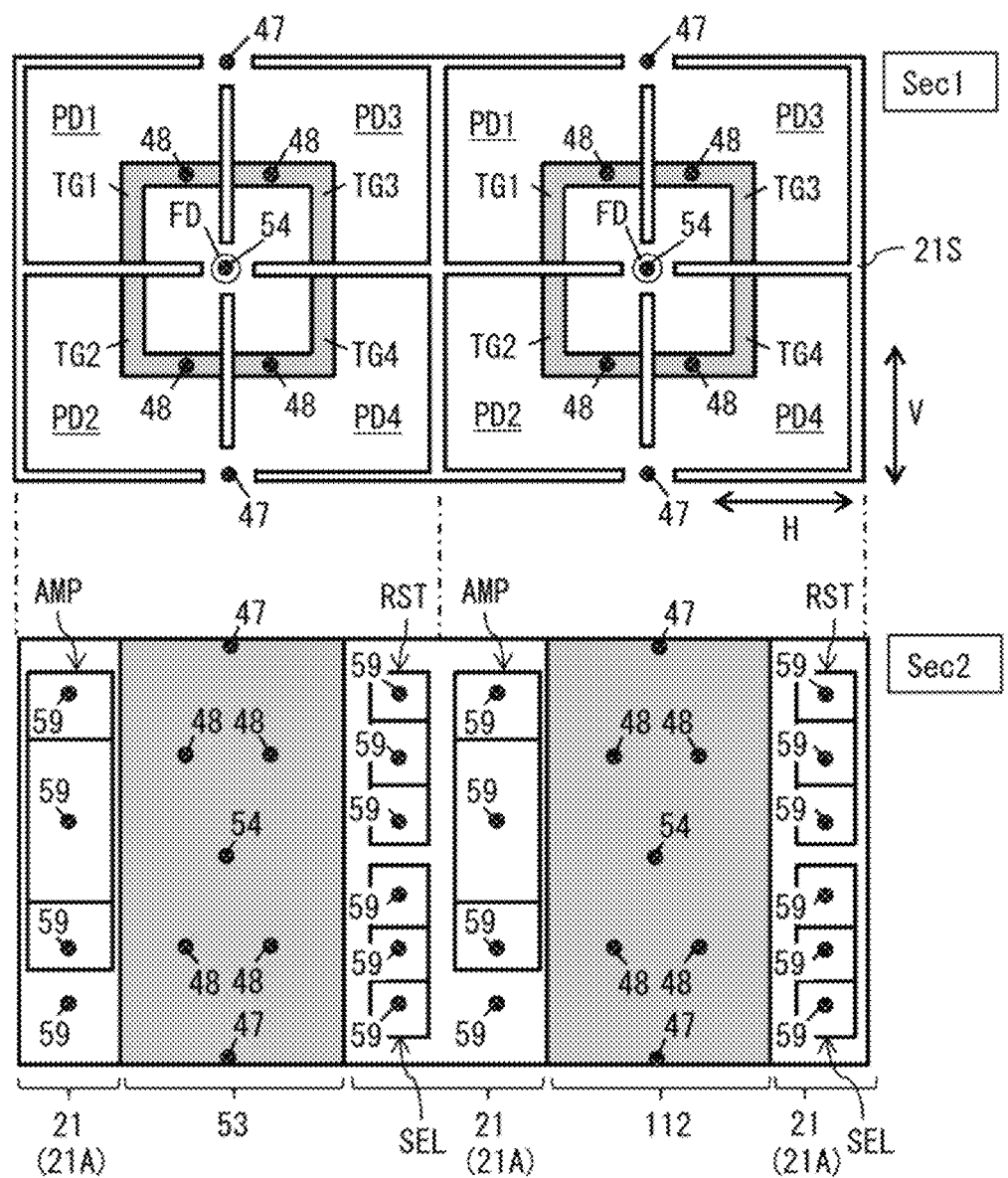
FIG. 40 is a diagram illustrating an example of a cross-sectional configuration of an imaging device according to a modification example 9 of the present disclosure in the horizontal direction.

FIG. 40 illustrates an example of a cross-sectional configuration of an imaging device (imaging device 1) according to a modification example (modification example 9) of the present embodiment described above in the horizontal direction. FIG. 40 illustrates a modification example of the cross-sectional configuration in FIG. 13.

In the present modification example, the first substrate 10 includes the photodiode PD and the transfer transistor TR for each of the sensor pixels 12 and shares the floating diffusion FD between the four sensor pixels 12. Accordingly, in the present modification example, the one through wiring line 54 is provided for every four sensor pixels 12.

In the plurality of sensor pixels 12 disposed in a matrix, the four sensor pixels 12 corresponding to a region obtained by shifting the unit region corresponding to the four sensor pixels 12 that share the one floating diffusion FD by the one sensor pixel 12 in the first direction V is referred to as four sensor pixels 12A for the sake of convenience. In this case, in the present modification example, the first substrate 10 shares the through wiring line 47 between the four sensor pixels 12A. Accordingly, in the present modification example, the one through wiring line 47 is provided for every four sensor pixels 12A.

In the present modification example, the first substrate 10 includes the element separation section 43 that separates the photodiodes PD and the transfer transistors TR for the respective sensor pixels 12. As viewed from the normal direction of the semiconductor substrate 11, the element separation section 43 does not completely surround the sensor pixel 12. The element separation section 43 has a gap (unformed region) near the floating diffusion FD (through wiring line 54) and near the through wiring line 47. The gap then allows the four sensor pixels 12 to share the one through wiring line 54 and allows the four sensor pixels 12A to share the one through wiring line 47. In the present modification example, the second substrate 20 includes the readout circuit 22 for every four sensor pixels 12. The four sensor pixels 12 share the floating diffusion FD.

Figure 41:
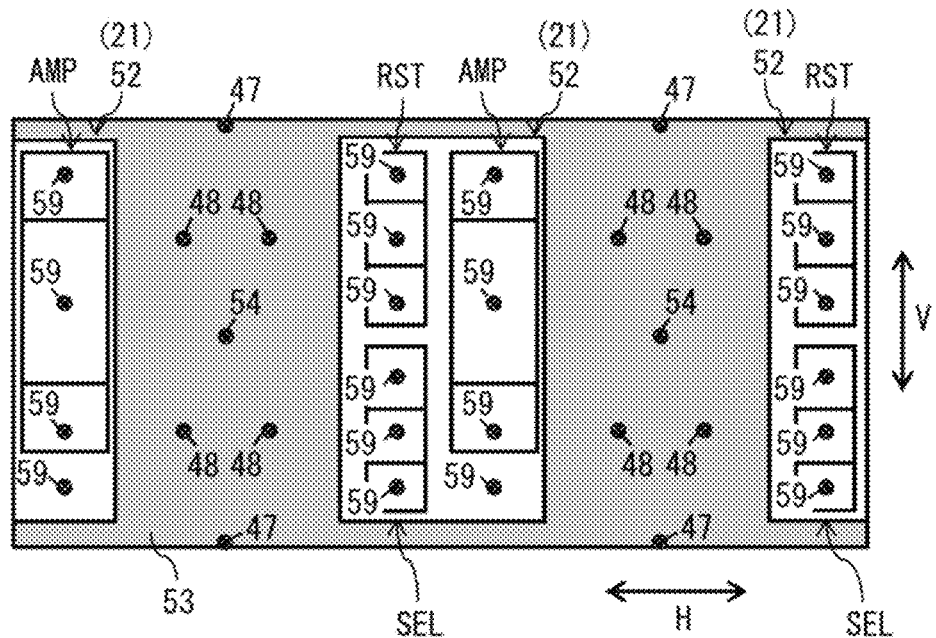
FIG. 41 is a diagram illustrating another example of the cross-sectional configuration of the imaging device according to the modification example 9 of the present disclosure in the horizontal direction.

FIG. 41 illustrates another example of the cross-sectional configuration of the imaging device 1 according to the present modification example in the horizontal direction. FIG. 41 illustrates a modification example of the cross-sectional configuration in FIG. 38. In the present modification example, the first substrate 10 includes the photodiode PD and the transfer transistor TR for each of the sensor pixels 12 and shares the floating diffusion FD between the four sensor pixels 12. Further, the first substrate 10 includes the element separation section 43 that separates the photodiodes PD and the transfer transistors TR for the respective sensor pixels 12.

Figure 42:
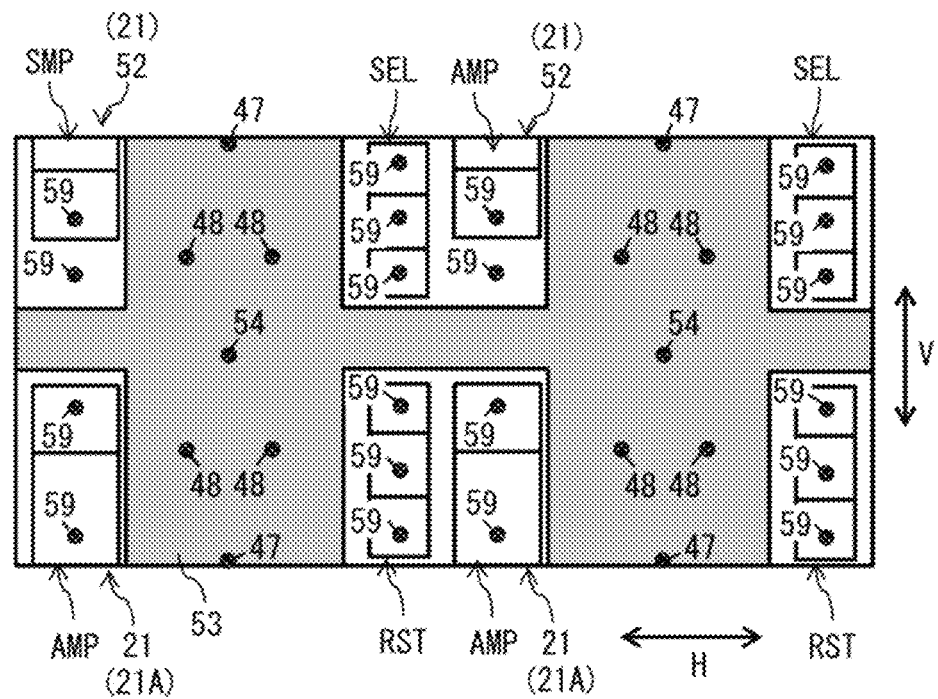
FIG. 42 is a diagram illustrating another example of the cross-sectional configuration of the imaging device according to the modification example 9 of the present disclosure in the horizontal direction.

FIG. 42 illustrates another example of the cross-sectional configuration of the imaging device 1 according to the present modification example in the horizontal direction. FIG. 42 illustrates a modification example of the cross-sectional configuration in FIG. 39. In the present modification example, the first substrate 10 includes the photodiode PD and the transfer transistor TR for each of the sensor pixels 12 and shares the floating diffusion FD between the four sensor pixels 12. Further, the first substrate 10 includes the element separation section 43 that separates the photodiodes PD and the transfer transistors TR for the respective sensor pixels 12.

5-7. Modification Example 10

Figure 43:
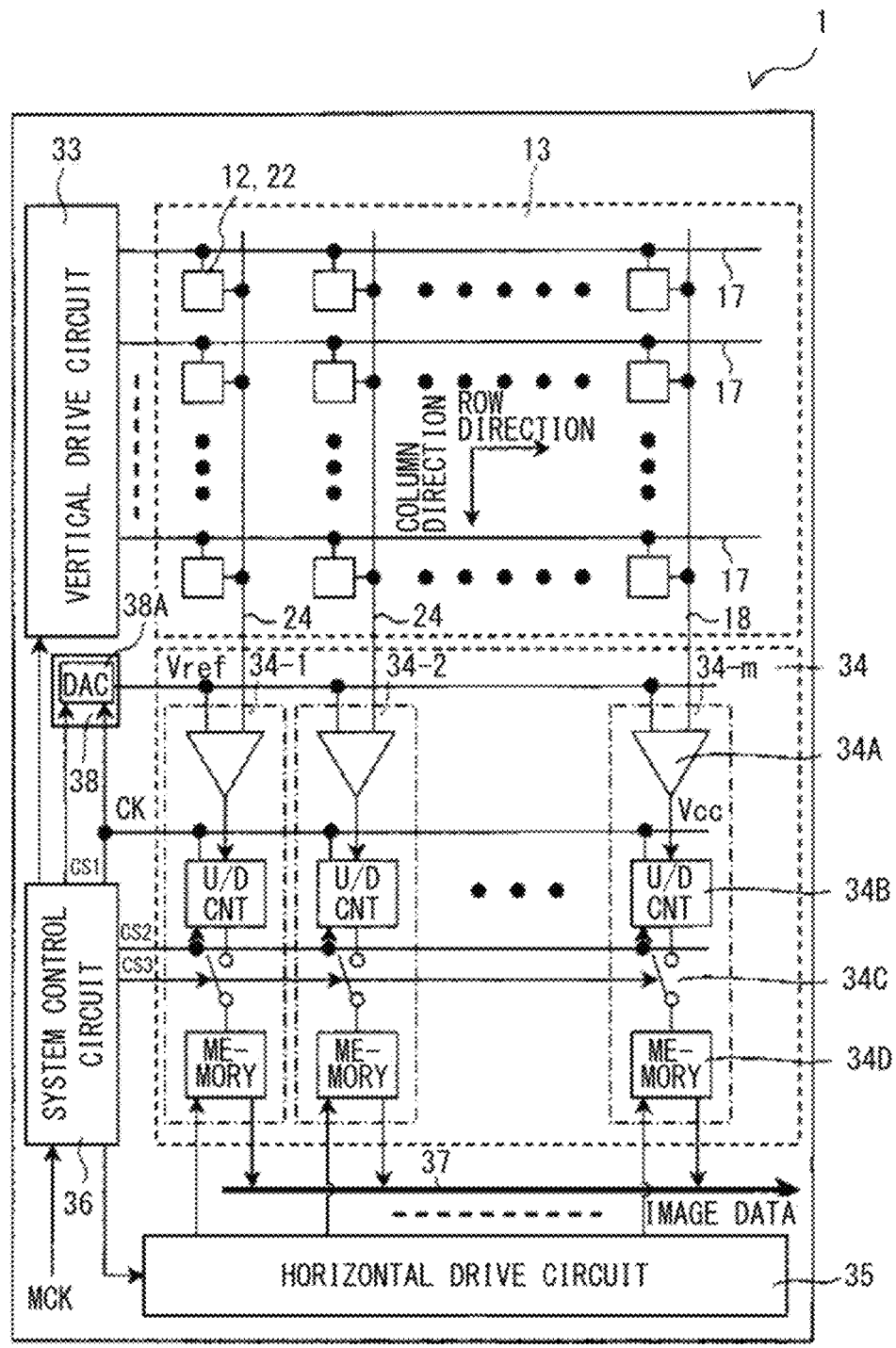
FIG. 43 is a diagram illustrating an example of a circuit configuration of an imaging device for an imaging device according to a modification example 10 of the present disclosure.

FIG. 43 illustrates an example of a circuit configuration of an imaging device (imaging device 1) according to a modification example (modification example 10) of the embodiment and the modification examples 4 to 7 described above. The imaging device 1 according to the present modification example is a CMOS image sensor mounted with column-parallel ADC.

As illustrated in FIG. 43, the imaging device 1 according to the present modification example includes the vertical drive circuit 33, the column signal processing circuit 34, a reference voltage supply section 38, the horizontal drive circuit 35, a horizontal output line 37, and the system control circuit 36 in addition to the pixel region 13 in which the plurality of sensor pixels 12 is two-dimensionally disposed in a matrix (matrix shape). Each of the plurality of sensor pixels 12 includes a photoelectric conversion section.

In this system configuration, on the basis of a master clock MCK, the system control circuit 36 generates a clock signal, a control signal, or the like that serves as a criterion for an operation of the vertical drive circuit 33, the column signal processing circuit 34, the reference voltage supply section 38, the horizontal drive circuit 35, and the like, and provides the clock signal, the control signal, or the like to the vertical drive circuit 33, the column signal processing circuit 34, the reference voltage supply section 38, the horizontal drive circuit 35, and the like.

In addition, the vertical drive circuit 33 is formed on the first substrate 10 along with each of the sensor pixels 12 of the pixel region 13 and is further formed even on the second substrate 20 on which the readout circuit 22 is formed. The column signal processing circuit 34, the reference voltage supply section 38, the horizontal drive circuit 35, the horizontal output line 37, and the system control circuit 36 are formed on the third substrate 30.

It is possible to use, as the sensor pixel 12, for example, a component including, in addition to the photodiode PD, the transfer transistor TR that transfers electric charge obtained by photoelectric conversion by the photodiode PD to the floating diffusion FD, although not illustrated here. In addition, it is possible to use, as the readout circuit 22, for example, a component having a three-transistor configuration in which the reset transistor RST that controls the electric potential of the floating diffusion FD, the amplification transistor AMP that outputs a signal corresponding to the electric potential of the floating diffusion FD, and the selection transistor SEL for selecting a pixel are included, although not illustrated here.

In the pixel region 13, the sensor pixels 12 are two-dimensionally disposed. With respect to this m-row and n-column pixel disposition, the pixel drive lines 23 are wired for the respective rows and the vertical signal lines 24 are wired for the respective columns. One end of each of the plurality of pixel drive lines 23 is coupled to a corresponding output end of the rows of the vertical drive circuit 33. The vertical drive circuit 33 includes a shift register or the like and controls the row address and the row scanning of the pixel region 13 through the plurality of pixel drive lines 23.

The column signal processing circuit 34 includes, for example, ADCs (analog-to-digital conversion circuits) 34-1 to 34-m provided for the respective pixel columns or for the respective vertical signal lines 24 of the pixel region 13. The column signal processing circuit 34 converts analog signals outputted column by column from the respective sensor pixels 12 of the pixel region 13 into digital signals and outputs the digital signals.

The reference voltage supply section 38 includes, for example, DAC (digital-to-analog conversion circuit) 38A as a means for generating a reference voltage Vref of a so-called ramp (RAMP) waveform having a level that changes in an inclined manner as time elapses. It is to be noted that the means for generating the reference voltage Vref of the ramp waveform is not limited to the DAC 38A.

Under the control of a control signal CS1 provided from the system control circuit 36, the DAC 38A generates the reference voltage Vref of the ramp waveform on the basis of a clock CK provided from the system control circuit 36 and supplies the generated reference voltage Vref to each of the ADCs 34-1 to 34-m of the column signal processing circuit 34.

It is to be noted that each of the ADCs 34-1 to 34-m is configured to selectively perform an AD conversion operation corresponding to each operation mode of a normal frame rate mode in a progressive scanning system for reading information on all of the sensor pixels 12 and a high-speed frame rate mode for setting exposure time of the sensor pixel 12 to 1/N to increase a frame rate by N times, for example, by twice, as compared with the time of the normal frame rate mode. This switching between the operation modes is executed on the basis of control performed by control signals CS2 and CS3 provided from the system control circuit 36. In addition, instruction information for switching the respective operation modes of the normal frame rate mode and the high-speed frame rate mode is provided from an external system controller (not illustrated) to the system control circuit 36.

All of the ADCs 34-1 to 34-m have the same configuration. The ADC 34-m is described here as an example. The ADC 34-m includes a comparator 34A, an up/down counter (referred to as U/D CNT in the diagram) 34B that is, for example, a number counting means, a transfer switch 34C, and a memory device 34D.

The comparator 34A compares a signal voltage Vx of the vertical signal line 24 corresponding to a signal outputted from each of the sensor pixels 12 in an n-th column of the pixel region 13 and the reference voltage Vref of the ramp waveform supplied from the reference voltage supply section 38. For example, in a case where the reference voltage Vref is larger than the signal voltage Vx, an output Vco enters an "H" level. In a case where the reference voltage Vref is the signal voltage Vx or less, the output Vco enters an "L" level.

An up/down counter 34B is an asynchronous counter. Under the control of the control signal CS2 provided from the system control circuit 36, the up/down counter 34B is provided with the clock CK from the system control circuit 36 concurrently with DAC 18A. The up/down counter 34B performs down (DOWN)-counting or up (UP)-counting in synchronization with the clock CK, thereby measuring a comparison period from the start of a comparison operation to the end of the comparison operation in the comparator 34A.

Specifically, in a reading operation of signals from the one sensor pixel 12, the down-counting is performed in the normal frame rate mode upon a first reading operation, thereby measuring comparison time upon the first reading. The up-counting is performed upon a second reading operation, thereby measuring comparison time upon the second reading.

Meanwhile, while holding a count result for the sensor pixel 12 in a certain row as it is in the high-speed frame rate mode, the down-counting is subsequently performed for the sensor pixel 12 in the next row upon a first reading operation from the previous count result, thereby measuring comparison time upon the first reading. The up-counting is performed upon a second reading operation, thereby measuring comparison time upon the second reading.

Under the control by the control signal CS3 provided from the system control circuit 36, the transfer switch 34C is turned on (closed) in the normal frame rate mode upon completion of the counting operation of the up/down counter 34B for the sensor pixel 12 in a certain row and transfers the count results of the up/down counter 34B to the memory device 34D.

Meanwhile, for example, in the high-speed frame rate of N=2, the transfer switch 34C remains off (open) upon completion of the counting operation of the up/down counter 34B for the sensor pixel 12 in a certain row and is subsequently turned on upon completion of the counting operation of the up/down counter 34B for the sensor pixel 12 in the next row. The transfer switch 34C transfers the count results of the up/down counter 34B for the vertical two pixels to the memory device 34D.

In this way, analog signals supplied for respective columns from the respective sensor pixels 12 of the pixel region 13 through the vertical signal lines 24 are converted into N-bit digital signals by respective operations of the comparators 34A and the up/down counters 34B in the ADCs 34-1 to 34-m and are stored in the memory devices 34D.

The horizontal drive circuit 35 includes a shift register or the like and controls the column address and the column scanning of the ADCs 34-1 to 34-m in the column signal processing circuit 34. Under the control of the horizontal drive circuit 35, the N-bit digital signals subjected to the AD conversion in the respective ADCs 34-1 to 34-m are read out to the horizontal output line 37 in order and outputted as imaging data through the horizontal output line 37.

It is to be noted that it is also possible to provide, in addition to the components described above, a circuit or the like that performs various kinds of signal processing on the imaging data outputted through the horizontal output line 37, although not illustrated in particular because there is no direct relationship with the present disclosure.

It is possible in the imaging device 1 mounted with the column-parallel ADC according to the present modification example having the configuration described above to selectively transfer the count results of the up/down counter 34B to the memory device 34D through the transfer switch 34C. This makes it possible to independently control the counting operation of the up/down counter 34B and the reading operation of the count results of the up/down counter 34B to the horizontal output line 37.

5-8. Modification Example 11

Figure 44:
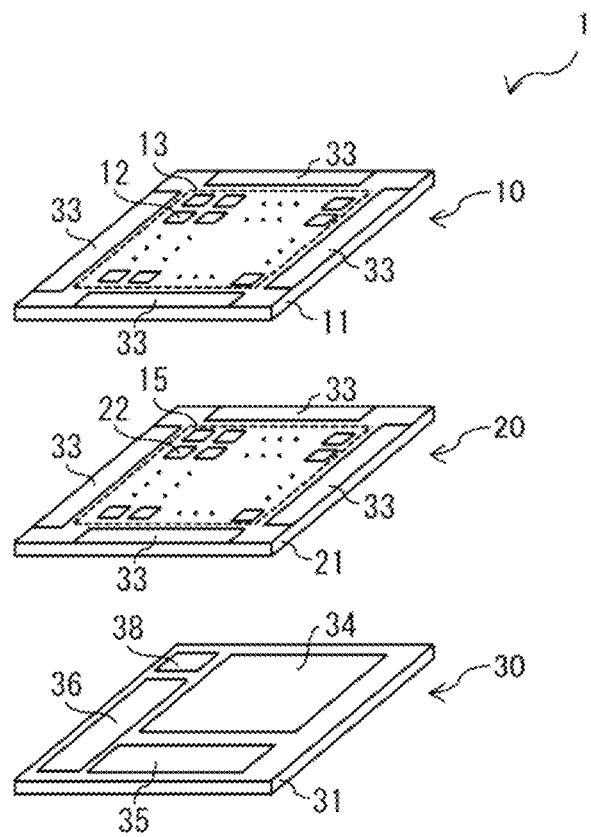
FIG. 44 is a diagram illustrating an example in which an imaging device according to a modification example 11 of the present disclosure in FIG. 42 includes three substrates that are stacked.

FIG. 44 illustrates an example in which the imaging device in FIG. 43 includes three substrates (the first substrate 10, the second substrate 20, and the third substrate 30) that are stacked. In the present modification example, the pixel region 13 is formed in a middle portion of the first substrate 10. The vertical drive circuit 33 is formed around the pixel region 13. The pixel region 13 includes the plurality of sensor pixels 12. In addition, a readout circuit region 15 is formed in a middle portion of the second substrate 20. The vertical drive circuit 33 is formed around the readout circuit region 15. The readout circuit region 15 includes the plurality of readout circuits 22. In the third substrate 30, the column signal processing circuit 34, the horizontal drive circuit 35, the system control circuit 36, the horizontal output line 37, and the reference voltage supply section 38 are formed. This eliminates an increase in chip size and eliminates the prevention of one pixel from having smaller area due to the structure of electrically coupling substrates to each other as in the embodiment described above and the modification examples thereof. As a result, it is possible to provide the imaging device 1 having a three-layer structure that does not prevent one pixel from having smaller area while maintaining a chip size equivalent to an existing chip size. It is to be noted that the vertical drive circuit 33 may be formed on the first substrate 10 alone or may be formed on the second substrate 20 alone.

5-9. Modification Example 12

Figure 45:
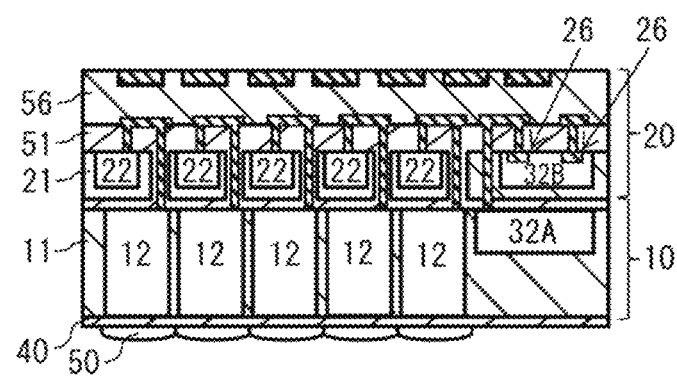
FIG. 45 is a diagram illustrating an example in which a logic circuit according to a modification example 12 of the present disclosure is separately formed in a substrate provided with a sensor pixel and a substrate provided with a readout circuit.

FIG. 45 illustrates an example of a cross-sectional configuration of an imaging device (imaging device 1) according to a modification example (modification example 12) of the embodiment described above and the modification examples 4 to 11 thereof. In the embodiment described above, the modification examples 3 to 12 thereof, and the like, the imaging device 1 includes three substrates (the first substrate 10, the second substrate 20, and the third substrate 30) that are stacked. However, as with the imaging devices 5 and 6 according to the fifth embodiment described above, an imaging device may include two substrates (the first substrate 10 and the second substrate 20) that are stacked. In this case, the logic circuit 32 may be formed separately on the first substrate 10 and the second substrate 20, for example, as illustrated in FIG. 45. Here, a circuit 32A of the logic circuit 32 is provided with a transistor having a gate structure in which a high dielectric constant film including a material (e.g., high-k) that is able to withstand a high temperature process and a metal gate electrode are stacked. The circuit 32A is provided on the first substrate 10 side. Meanwhile, in a circuit 32B provided on the second substrate 20 side, a low resistance region 26 that includes a silicide and is formed by using a Salicide (Self Aligned Silicide) process such as $CoSi_2$ and NiSi is formed on the surface of an impurity diffusion region in contact with a source electrode and a drain electrode. The low resistance region including a silicide is formed by using a compound of a material of a semiconductor substrate and metal. This makes it possible to use a high temperature process such as thermal oxidation to form the sensor pixel 12. In addition, it is possible to reduce contact resistance in a case where the low resistance region 26 including a silicide is provided on the surface of the impurity diffusion region in contact with the source electrode and the drain electrode in the circuit 32B of the logic circuit 32. The circuit 32B is provided on the second substrate 20 side. As a result, it is possible to increase the speed of an arithmetic operation in the logic circuit 32.

5-10. Modification Example 13

Figure 46:
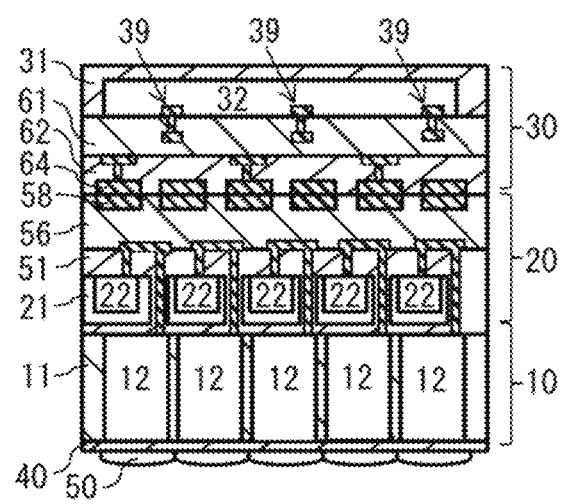
FIG. 46 is a diagram illustrating an example in which a logic circuit according to a modification example 13 of the present disclosure is formed on a third substrate.

FIG. 46 illustrates a modification example of a cross-sectional configuration of the imaging device 1 according to a modification example (modification example 13) of the embodiment described above and the modification examples 4 to 11 thereof. In the logic circuit 32 of the third substrate 30 according to any of the embodiment described above and the modification examples 3 to 12 thereof, a low resistance region 39 that includes a silicide and is formed by using a Salicide (Self Aligned Silicide) process such as $CoSi_2$ and NiSi may be formed on the surface of an impurity diffusion region in contact with a source electrode and a drain electrode. This makes it possible to use a high temperature process such as thermal oxidation to form the sensor pixel 12. In addition, it is possible to reduce contact resistance in a case where the low resistance region 39 including a silicide is provided on the surface of the impurity diffusion region in contact with the source electrode and the drain electrode in the logic circuit 32. As a result, it is possible to increase the speed of an arithmetic operation in the logic circuit 32.

It is to be noted that the electric conductivity type may be opposite in the embodiment described above and the modification examples 4 to 11 thereof. For example, in the descriptions of the embodiment described above and the modification examples 4 to 11 thereof, the p-type may be read as the n-type and the n-type may be read as the p-type. Even in such a case, it is possible to obtain effects similar to those of the embodiment described above and the modification examples 4 to 11 thereof.

6. Application Examples

Figure 47:
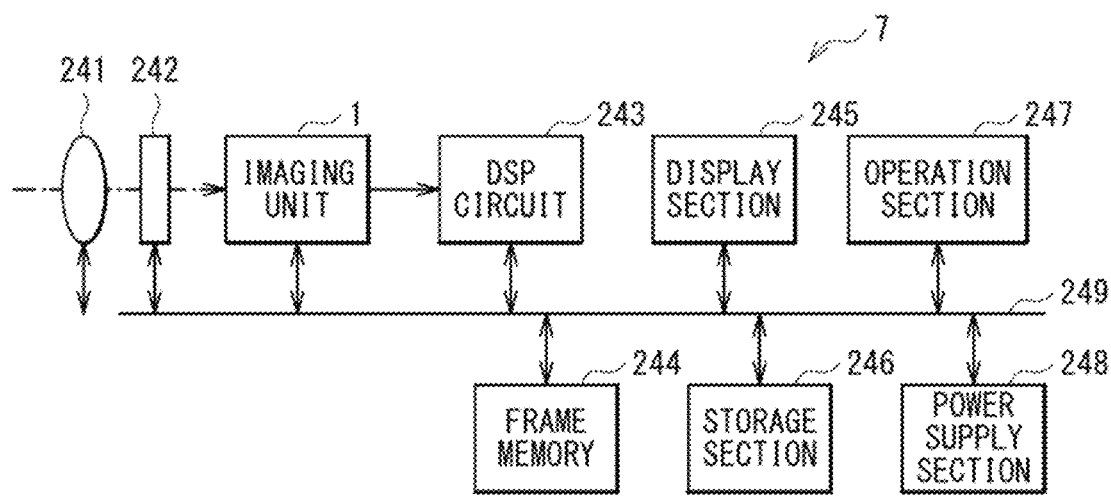
FIG. 47 is a diagram illustrating an example of a schematic configuration of an imaging system including the imaging device according to any of the embodiment described above and the modification examples thereof.

FIG. 47 illustrates an example of a schematic configuration of an imaging system 7 including an imaging device (imaging device 1) according to any of the embodiment described above and the modification examples 4 to 13 thereof.

The imaging system 7 is an electronic apparatus including, for example, an imaging device such as a digital still camera or a video camera, a portable terminal apparatus such as a smartphone or a tablet-type terminal, or the like. The imaging system 7 includes, for example, an optical system 241, a shutter unit 242, the imaging device 1, a DSP circuit 243, a frame memory 244, a display section 245, a storage section 246, an operation section 247, and a power supply section 248. In the imaging system 7, the shutter unit 242, the imaging device 1, the DSP circuit 243, the frame memory 244, the display section 245, the storage section 246, the operation section 247, and the power supply section 248 are coupled to each other through a bus line 249.

The imaging device 1 outputs image data corresponding to incident light. The optical system 241 includes one or more lenses and guides light (incident light) from a subject to the imaging device 1 to form an image on a light receiving surface of the imaging device 1. The shutter unit 242 is disposed between the optical system 241 and the imaging device 1 and controls a period in which the imaging device 1 is irradiated with light and a period in which light is blocked under the control of the operation section 247. The DSP circuit 243 is a signal processing circuit that processes a signal (image data) outputted from the imaging device 1. The frame memory 244 temporarily holds the image data processed by the DSP circuit 243 in a frame unit. The display section 245 includes, for example, a panel-type display unit such as a liquid crystal panel or an organic EL (Electro Luminescence) panel and displays a moving image or a still image captured by the imaging device 1. The storage section 246 records image data of a moving image or a still image captured by the imaging device 1 in a recording medium such as a semiconductor memory or a hard disk. The operation section 247 issues an operation instruction for various functions of the imaging system 7 in accordance with an operation by a user. The power supply section 248 appropriately supplies various kinds of power for operation to the imaging device 1, the DSP circuit 243, the frame memory 244, the display section 245, the storage section 246, and the operation section 247 that are supply targets.

Next, an imaging procedure in the imaging system 7 is described.

Figure 48:
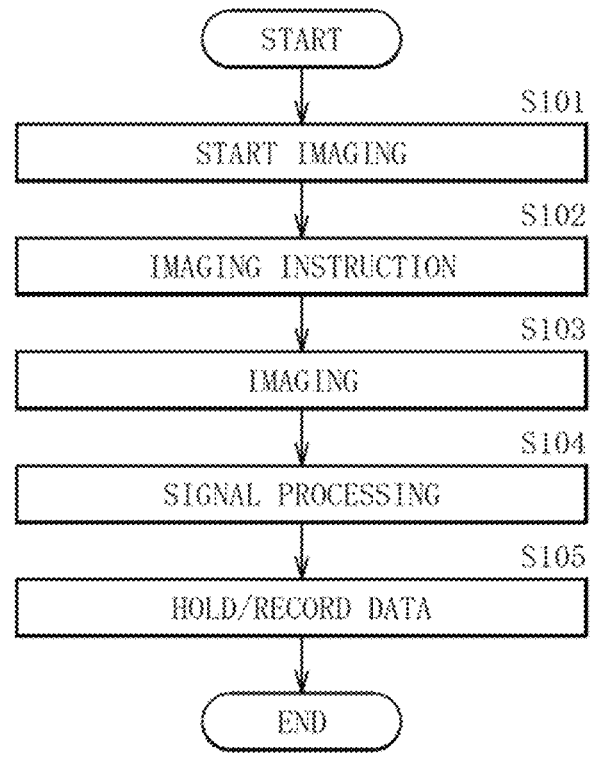
FIG. 48 is a diagram illustrating an example of an imaging procedure in the imaging system in FIG. 47.

FIG. 48 illustrates an example of a flowchart of an imaging operation in the imaging system 7. A user issues an instruction to start imaging by operating the operation section 247 (step S101). The operation section 247 then transmits an imaging instruction to the imaging device 1 (step S102). The imaging device 1 (specifically, the system control circuit 36) executes imaging in a predetermined imaging scheme upon receiving the imaging instruction (step S103).

The imaging device 1 outputs light (image data) formed on the light receiving surface through the optical system 241 and the shutter unit 242 to the DSP circuit 243. Here, the image data refers to data for all of the pixels of pixel signals generated on the basis of electric charge temporarily held in the floating diffusion FD. The DSP circuit 243 performs predetermined signal processing (e.g., noise reduction processing or the like) on the basis of the image data inputted from the imaging device 1 (step S104). The DSP circuit 243 causes the frame memory 244 to hold the image data subjected to the predetermined signal processing and the frame memory 244 causes the storage section 246 to store the image data (step S105). In this way, the imaging in the imaging system 7 is performed.

In the present application example, the imaging device 1 is applied to the imaging system 7. This allows the imaging device 1 to be smaller or higher in definition. This makes it possible to provide the small or high-definition imaging system 7.

Figure 49:
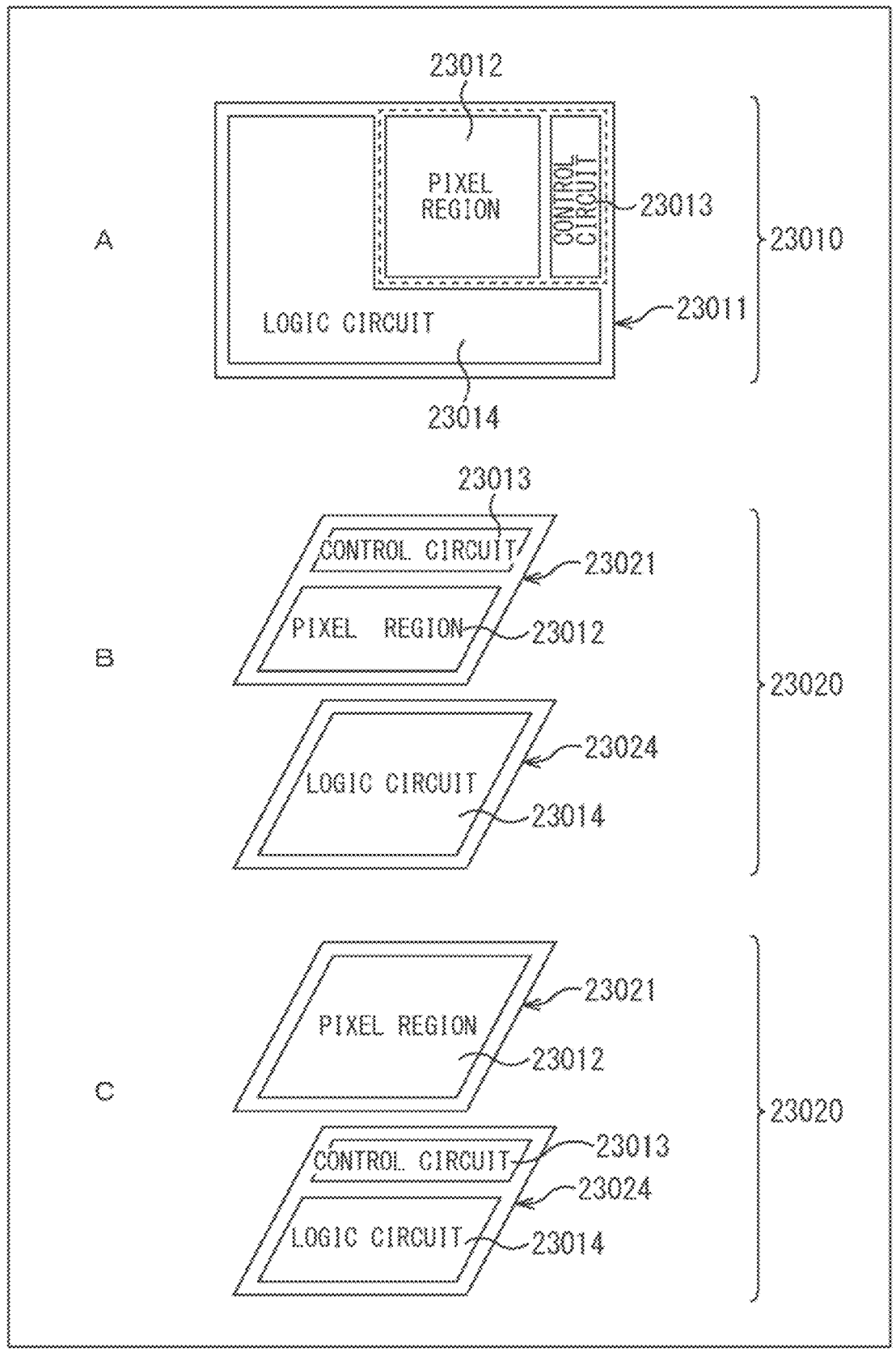
FIG. 49 is a diagram illustrating an overview of configuration examples of a non-stacked solid-state imaging device and a stacked solid-state imaging device to which the technology according to the present disclosure may be applied.

FIG. 49 is a diagram illustrating an overview of configuration examples of a non-stacked solid-state imaging device (solid-state imaging device 23210) and a stacked solid-state imaging device (solid-state imaging device 23020) to which the technology according to the present disclosure may be applied.

A of FIG. 49 illustrates a schematic configuration example of a non-stacked solid-state imaging device. As illustrated in A of FIG. 49, a solid-state imaging device 23010 includes one die (semiconductor substrate) 23011. This die 23011 is mounted with a pixel region 23012 in which pixels are disposed in an array, a control circuit 23013 that drives the pixels and performs any other various kinds of control, and a logic circuit 23014 for signal processing.

B and C of FIG. 49 illustrate a schematic configuration example of a stacked solid-state imaging device. As illustrated in B and C of FIG. 49, in the solid-state imaging device 23020, the two dies of a sensor die 23021 and a logic die 23024 are stacked and coupled electrically to serve as one semiconductor chip. These sensor die 23021 and logic die 23024 correspond to specific examples of the "first substrate" and the "second substrate" according to the present disclosure.

In B of FIG. 49, the sensor die 23021 is mounted with the pixel region 23012 and the control circuit 23013 and the logic die 23024 is mounted with the logic circuit 23014 including a signal processing circuit that performs signal processing. Further, a sensor die 20321 may also be mounted, for example, with the readout circuit 22 or the like described above.

In C of FIG. 49, the sensor die 23021 is mounted with the pixel region 23012 and the logic die 23024 is mounted with the control circuit 23013 and the logic circuit 23014.

Figure 50:
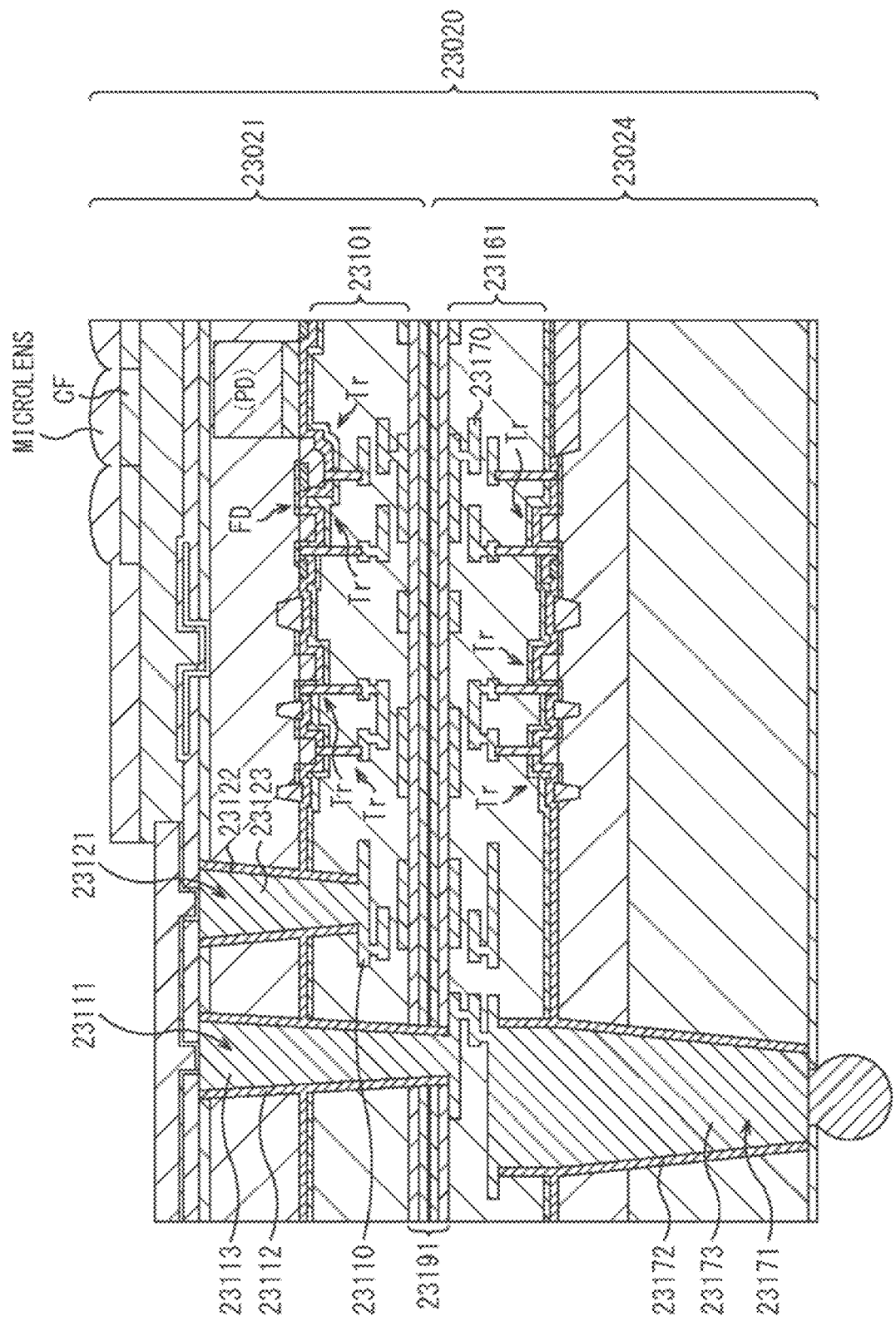
FIG. 50 is a cross-sectional view illustrating a first configuration example of the stacked solid-state imaging device.

FIG. 50 is a cross-sectional view illustrating a first configuration example of the stacked solid-state imaging device 23020.

PD (photodiode) that is included in each of pixels serving as the pixel region 23012, FD (floating diffusion), Tr (MOS FET), Tr serving as the control circuit 23013, and the like are formed in the sensor die 23021. Further, a wiring layer 23101 including a wiring line 23110 including a plurality of layers is formed in the sensor die 23021. In this example, the wiring line 23110 includes three layers. It is to be noted that it is possible to include the control circuit 23013 (the Tr serving as the control circuit 23013) in the logic die 23024 in place of the sensor die 23021.

Tr included in the logic circuit 23014 is formed in the logic die 23024. Further, a wiring layer 23161 including a wiring line 23170 including a plurality of layers is formed in the logic die 23024. In this example, the wiring line 23170 includes three layers. In addition, a coupling hole 23171 having an insulating film 23172 formed on the inner wall surface thereof is formed in the logic die 23024. The coupling hole 23171 is filled with an interconnecting conductor 23173 that is coupled to the wiring line 23170 and the like.

The sensor die 23021 and the logic die 23024 are bonded together with the wiring layers 23101 and 23161 thereof opposed to each other. This forms the stacked solid-state imaging device 23020 in which the sensor die 23021 and the logic die 23024 are stacked. A film 23191 such as a protective film is formed on the surface on which the sensor die 23021 and the logic die 23024 are bonded together.

A coupling hole 23111 is formed in the sensor die 23021. The coupling hole 23111 extends through the sensor die 23021 from the back surface side (the side where light enters the PD) (upper side) of the sensor die 23021 and reaches the uppermost layer of the wiring line 23170 of the logic die 23024. Further, a coupling hole 23121 is formed in the sensor die 23021. The coupling hole 23121 is close to the coupling hole 23111 and reaches the first layer of the wiring line 23110 from the back surface side of the sensor die 23021. An insulating film 23112 is formed on the inner wall surface of the coupling hole 23111 and an insulating film 23122 is formed on the inner wall surface of the coupling hole 23121. The coupling holes 23111 and 23121 are then respectively filled with interconnecting conductors 23113 and 23123. The interconnecting conductor 23113 and the interconnecting conductor 23123 are electrically coupled on the back surface side of the sensor die 23021. This electrically couples the sensor die 23021 and the logic die 23024 through the wiring layer 23101, the coupling hole 23121, the coupling hole 23111, and the wiring layer 23161.

Figure 51:
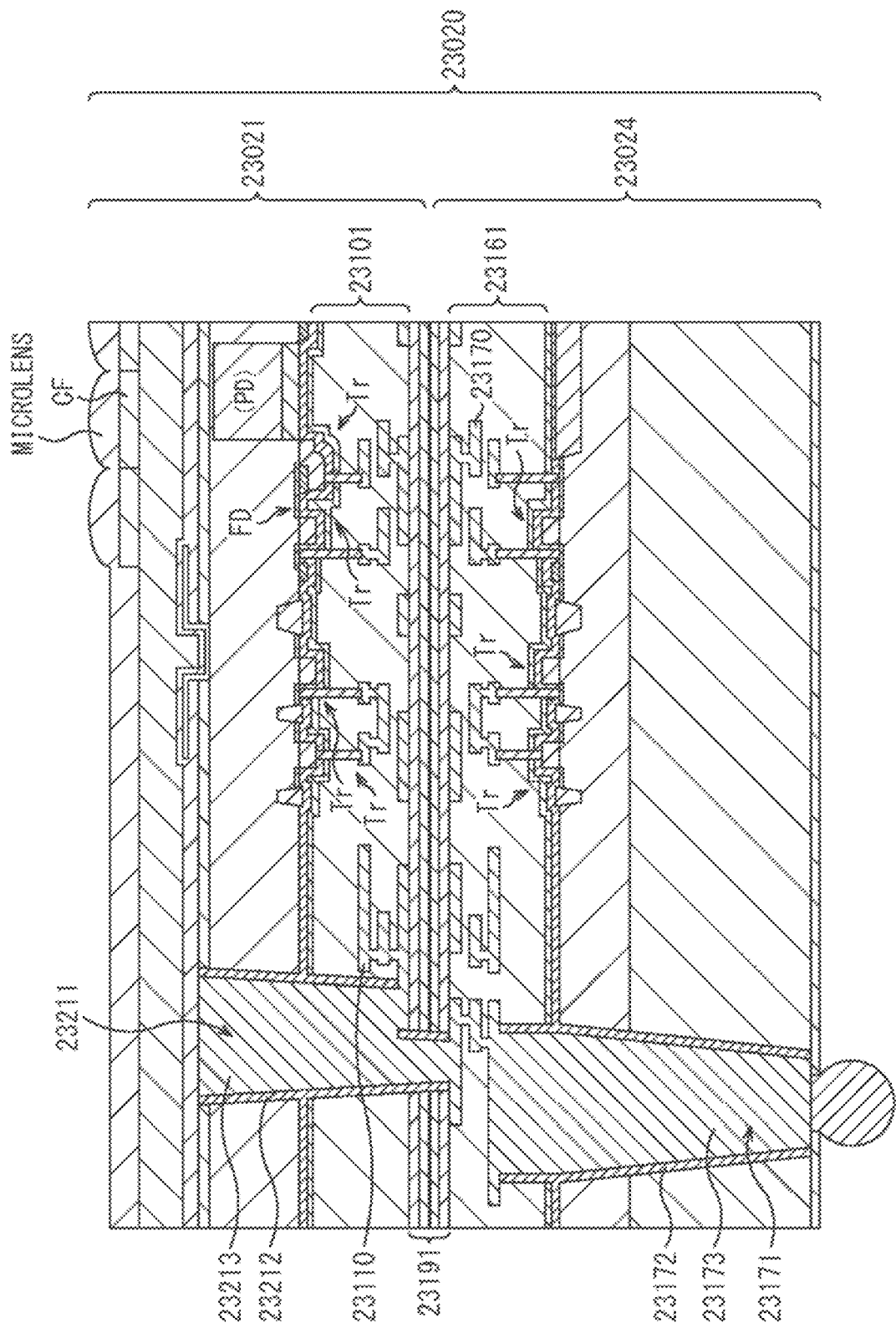
FIG. 51 is a cross-sectional view illustrating a second configuration example of the stacked solid-state imaging device.

FIG. 51 is a cross-sectional view illustrating a second configuration example of the stacked solid-state imaging device 23020.

In the second configuration example of the solid-state imaging device 23020, one coupling hole 23211 that is formed in the sensor die 23021 electrically couples ((the wiring line 23110 of) the wiring layer 23101 of) the sensor die 23021 and ((the wiring line 23170 of) the wiring layer 23161 of) the logic die 23024.

In other words, in FIG. 51, the coupling hole 23211 is formed to extend through the sensor die 23021 from the back surface side of the sensor die 23021 and reach the uppermost layer of the wiring line 23170 of the logic die 23024 and also reach the uppermost layer of the wiring line 23110 of the sensor die 23021. An insulating film 23212 is formed on the inner wall surface of the coupling hole 23211 and the coupling hole 23211 is filled with an interconnecting conductor 23213. The sensor die 23021 and the logic die 23024 are electrically coupled by the two coupling holes 23111 and 23121 in FIG. 50 described above, but the sensor die 23021 and the logic die 23024 are electrically coupled by the one coupling hole 23211 in FIG. 51.

Figure 52:
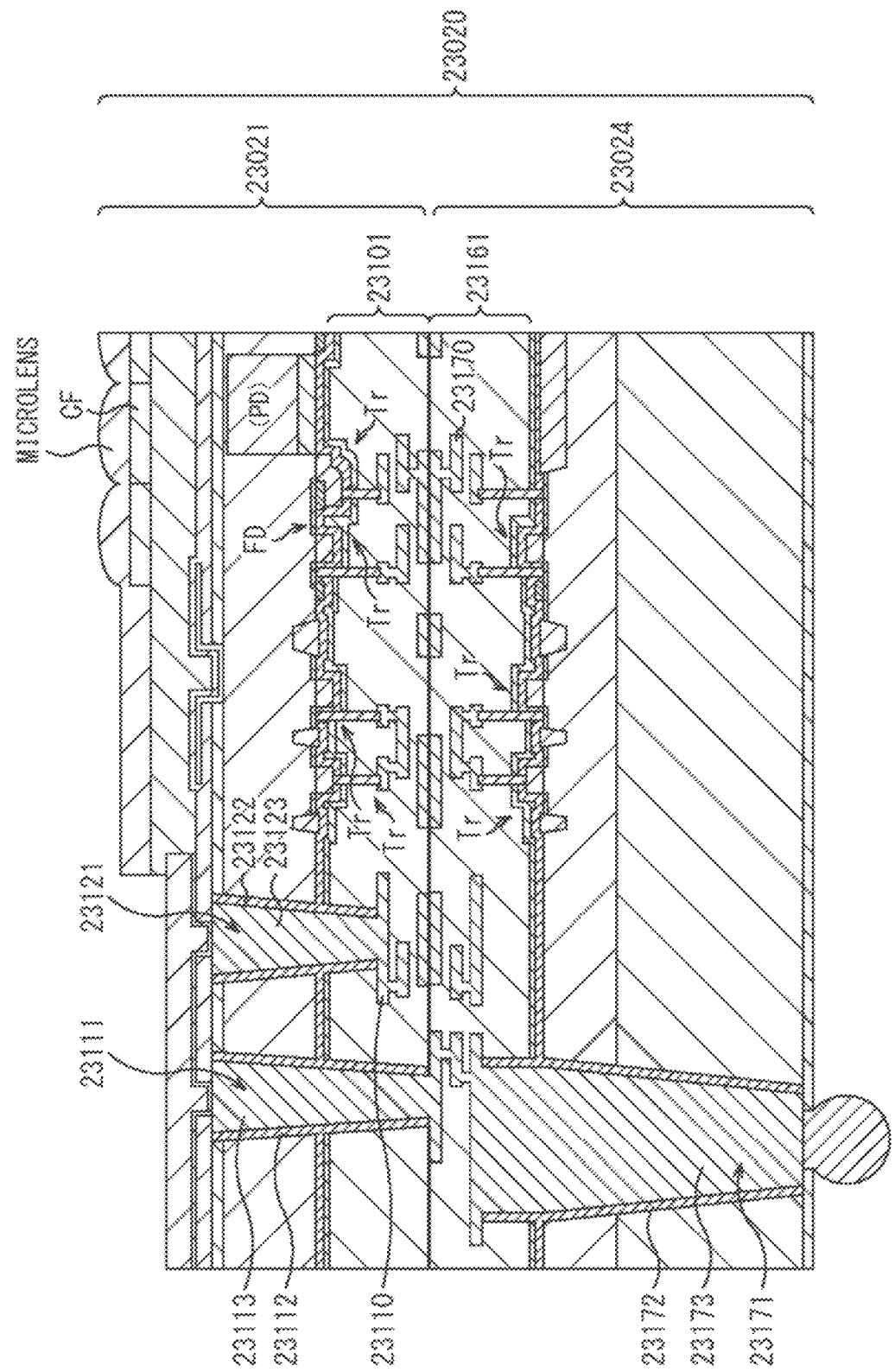
FIG. 52 is a cross-sectional view illustrating a third configuration example of the stacked solid-state imaging device.

FIG. 52 is a cross-sectional view illustrating a third configuration example of the stacked solid-state imaging device 23020.

The solid-state imaging device 23020 in FIG. 52 is different from the case of FIG. 50 in that the film 23191 such as a protective film is not formed on the surface on which the sensor die 23021 and the logic die 23024 are bonded together. In the case of FIG. 50, the film 23191 such as a protective film is formed on the surface on which the sensor die 23021 and the logic die 23024 are bonded together.

The solid-state imaging device 23020 in FIG. 52 is formed by stacking the sensor die 23021 and the logic die 23024 to bring the wiring lines 23110 and 23170 into direct contact and applying desired load and heating them to directly bond the wiring lines 23110 and 23170.

Figure 53:
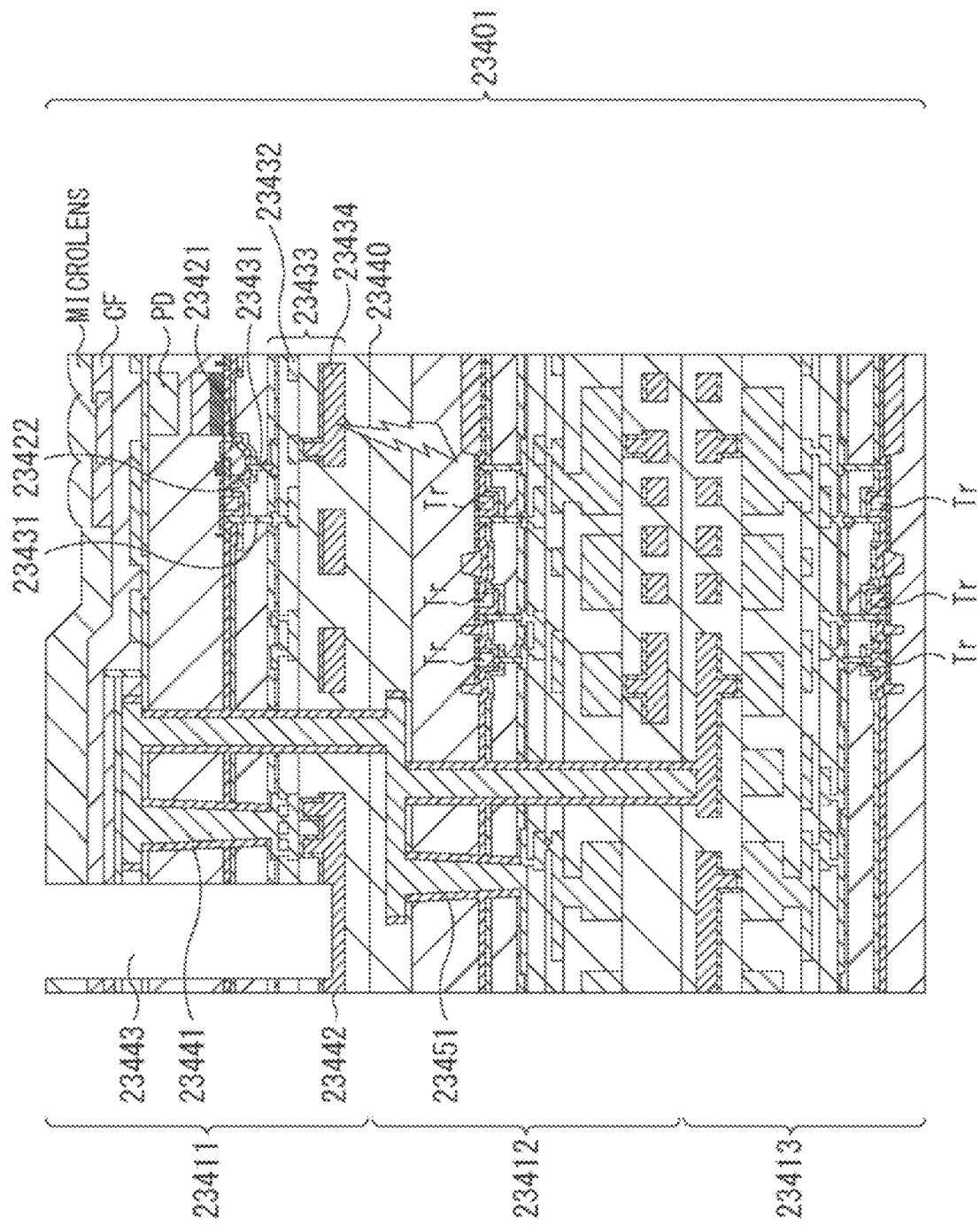
FIG. 53 is a cross-sectional view illustrating another configuration example of the stacked solid-state imaging device to which the technology according to the present disclosure may be applied.

FIG. 53 is a cross-sectional view illustrating another configuration example of the stacked solid-state imaging device to which the technology according to the present disclosure may be applied.

In FIG. 53, a solid-state imaging device 23401 has a three-layer stacked structure in which the three dies of a sensor die 23411, a logic die 23412, and a memory die 23413 are stacked.

The memory die 23413 includes, for example, a memory circuit that stores data. The data is temporarily necessary in signal processing performed in the logic die 23412.

In FIG. 53, the logic die 23412 and the memory die 23413 are stacked in this order under the sensor die 23411, but it is possible to stack the logic die 23412 and the memory die 23413 in the inverse order under the sensor die 23411. In other words, it is possible to stack the memory die 23413 and the logic die 23412 in this order.

It is to be noted that, in FIG. 53, PD serving as a photoelectric conversion section of a pixel and a source/drain region of pixel Tr are formed in the sensor die 23411.

A gate electrode is formed around the PD with a gate insulating film interposed in between. The gate electrode and the paired source/drain regions form pixel Tr 23421 and pixel Tr 23422.

The pixel Tr 23421 adjacent to the PD is transfer Tr and one of the paired source/drain regions included in the pixel Tr 23421 is FD.

In addition, an interlayer insulating film is formed in the sensor die 23411 and a coupling hole is formed in the interlayer insulating film. An interconnecting conductor 23431 that is coupled to the pixel Tr 23421 and the pixel Tr 23422 is formed in the coupling hole.

Further, a wiring layer 23433 including a wiring line 23432 that is coupled to each of the interconnecting conductors 23431 is formed in the sensor die 23411. The wiring line 23432 includes a plurality of layers.

In addition, an aluminum pad 23434 serving as an electrode for external coupling is formed in the lowermost layer of the wiring layer 23433 in the sensor die 23411. In other words, the aluminum pad 23434 is formed at a position closer to a joint surface 23440 with the logic die 23412 than the wiring line 23432 in the sensor die 23411. The aluminum pad 23434 is used as an end of a wiring line for inputting and outputting signals to and from the outside.

Further, a contact 23441 is formed in the sensor die 23411. The contact 23441 is used for electrical coupling to the logic die 23412. The contact 23441 is coupled to a contact 23451 in the logic die 23412 and is also coupled to an aluminum pad 23442 in the sensor die 23411.

In the sensor die 23411, a pad hole 23443 is then formed to reach the aluminum pad 23442 from the back surface side (the upper side) of the sensor die 23411.

The technology according to the present disclosure is applicable to solid-state imaging devices as described above. For example, the wiring line 23110 or the wiring layer 23161 may be provided, for example, with the plurality of pixel drive lines 23 and the plurality of vertical signal lines 24 described above. In that case, the gaps G as illustrated in FIG. 1 are formed between the wiring lines of the plurality of these vertical signal lines 24. This makes it possible to reduce the capacitance between the wiring lines. In addition, suppressing an increase in the capacitance between the wiring lines makes it possible to reduce variations in the wiring capacitance.

7. Practical Application Examples

Practical Application Example 1

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

Figure 54:
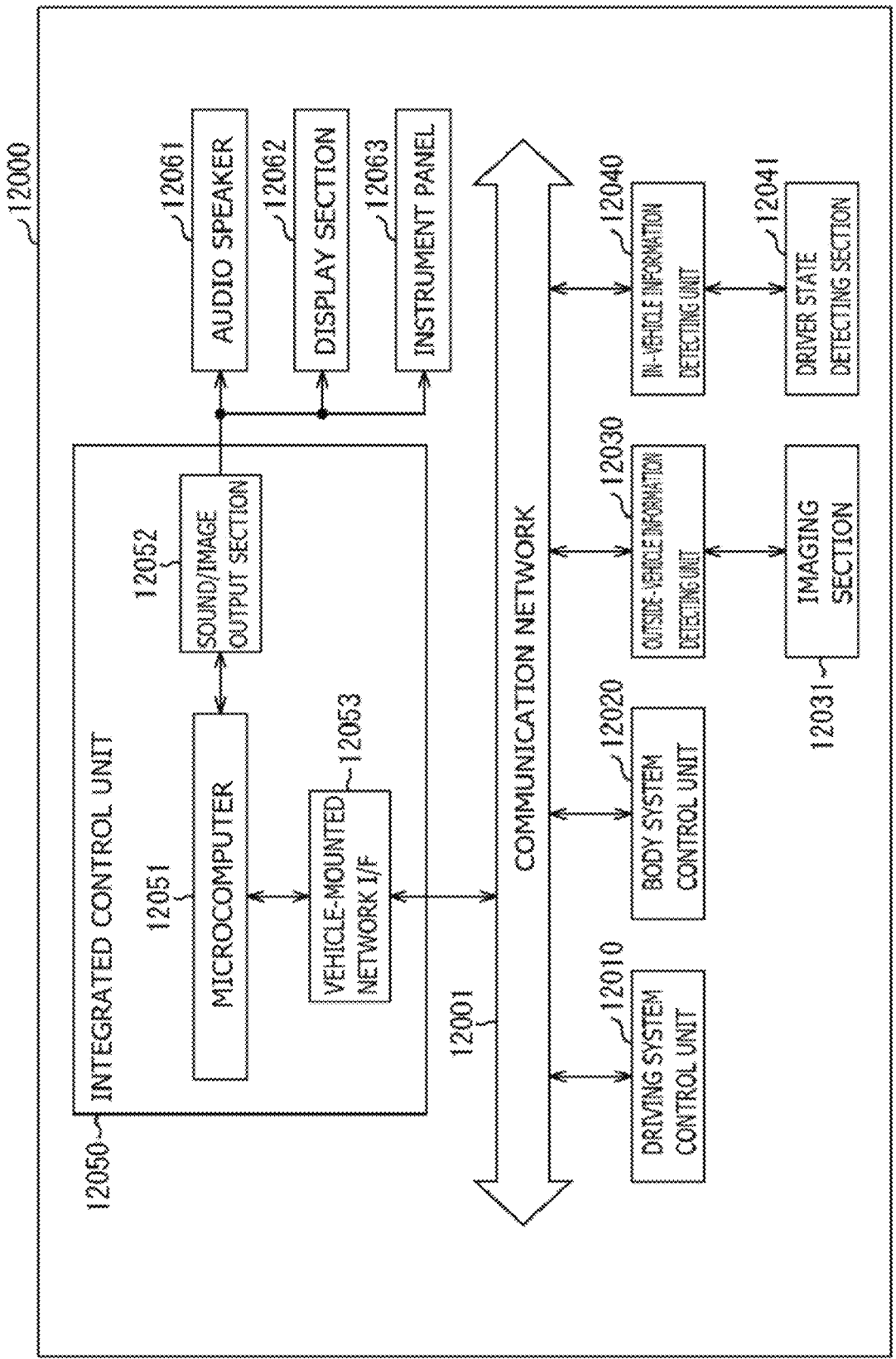
FIG. 54 is a block diagram depicting an example of schematic configuration of a vehicle control system.

FIG. 54 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 54, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 54, an audio speaker 12061, a display section 12062, and an instrument panel 12063 are illustrated as the output device. The display section 12062 may, for example, include at least one of an on-board display and a head-up display.

Figure 55:
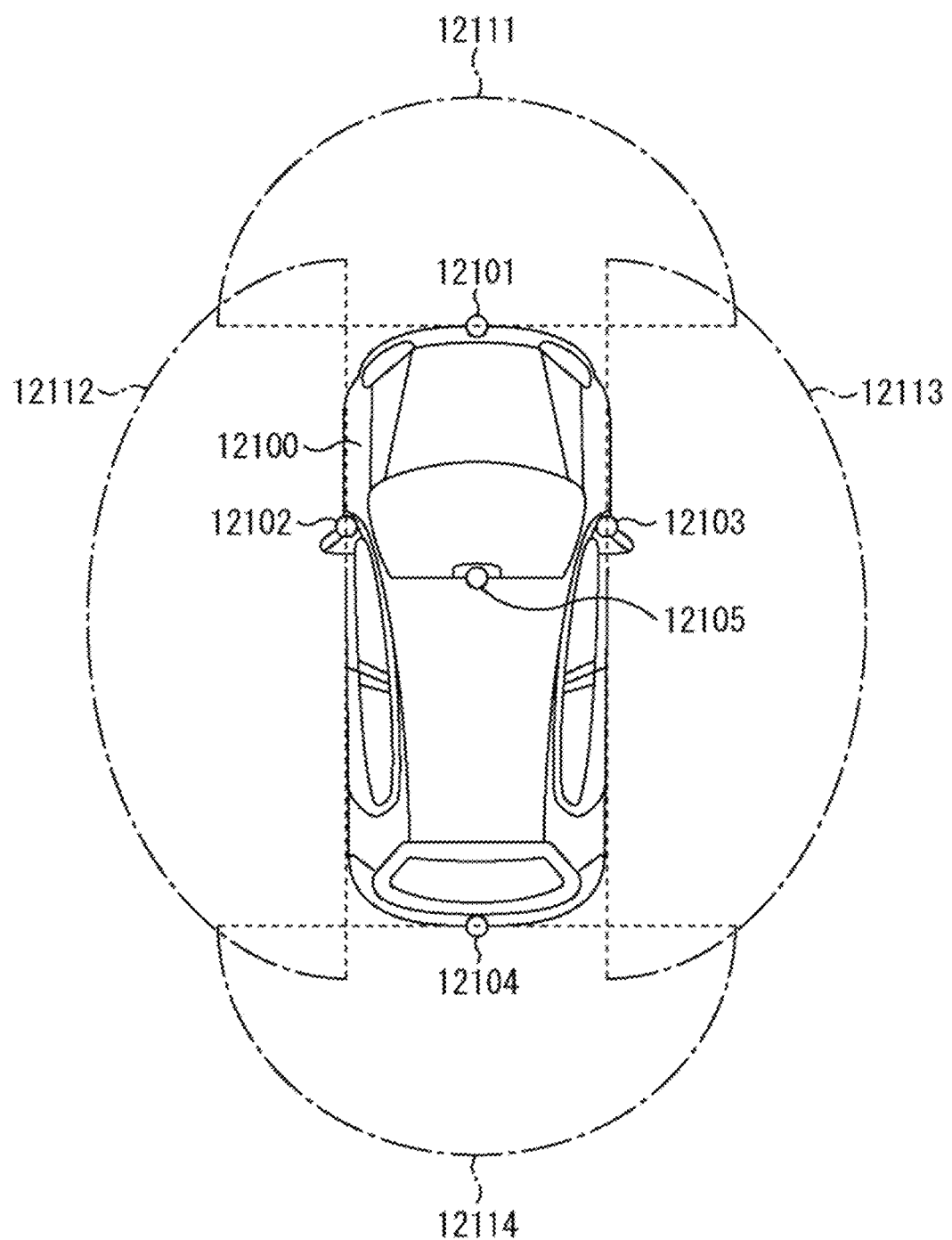
FIG. 55 is a diagram of assistance in explaining an example of installation positions of an outside-vehicle information detecting section and an imaging section.

FIG. 55 is a diagram depicting an example of the installation position of the imaging section 12031.

In FIG. 55, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 55 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has described the example of the mobile body control system to which the technology according to the present disclosure may be applied. The technology according to the present disclosure may be applied to the imaging section 12031 among the components described above. Specifically, the imaging devices 1 according to the embodiment described above and modification examples thereof are each applicable to the imaging section 12031. The application of the technology according to the present disclosure to the imaging section 12031 makes it possible to obtain a high-definition shot image with less noise and it is thus possible to perform highly accurate control using the shot image in the mobile body control system.

Practical Application Example 2

Figure 56:
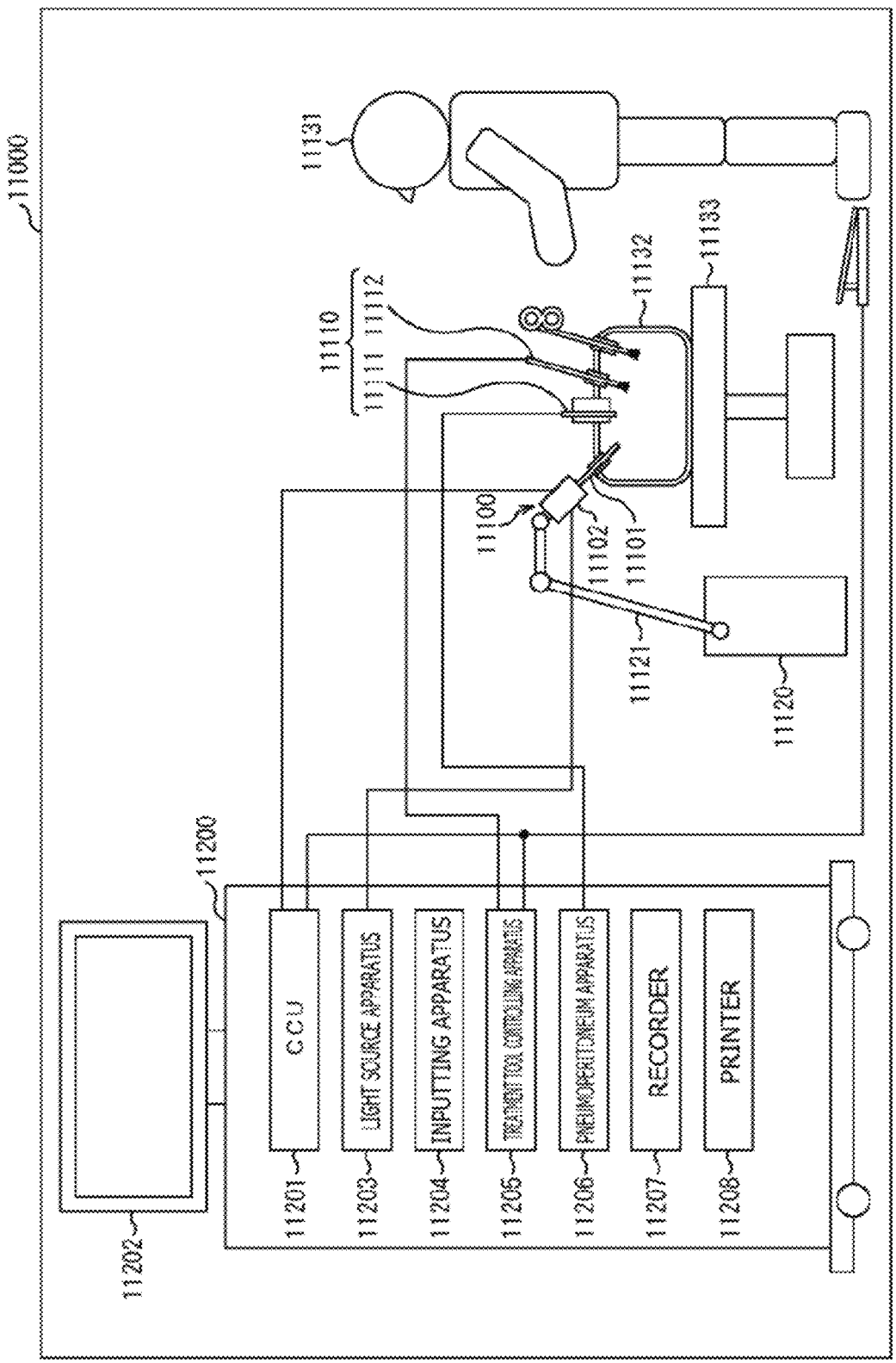
FIG. 56 is a view depicting an example of a schematic configuration of an endoscopic surgery system.

FIG. 56 is a view depicting an example of a schematic configuration of an endoscopic surgery system to which the technology according to an embodiment of the present disclosure (present technology) can be applied.

In FIG. 56, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 57:
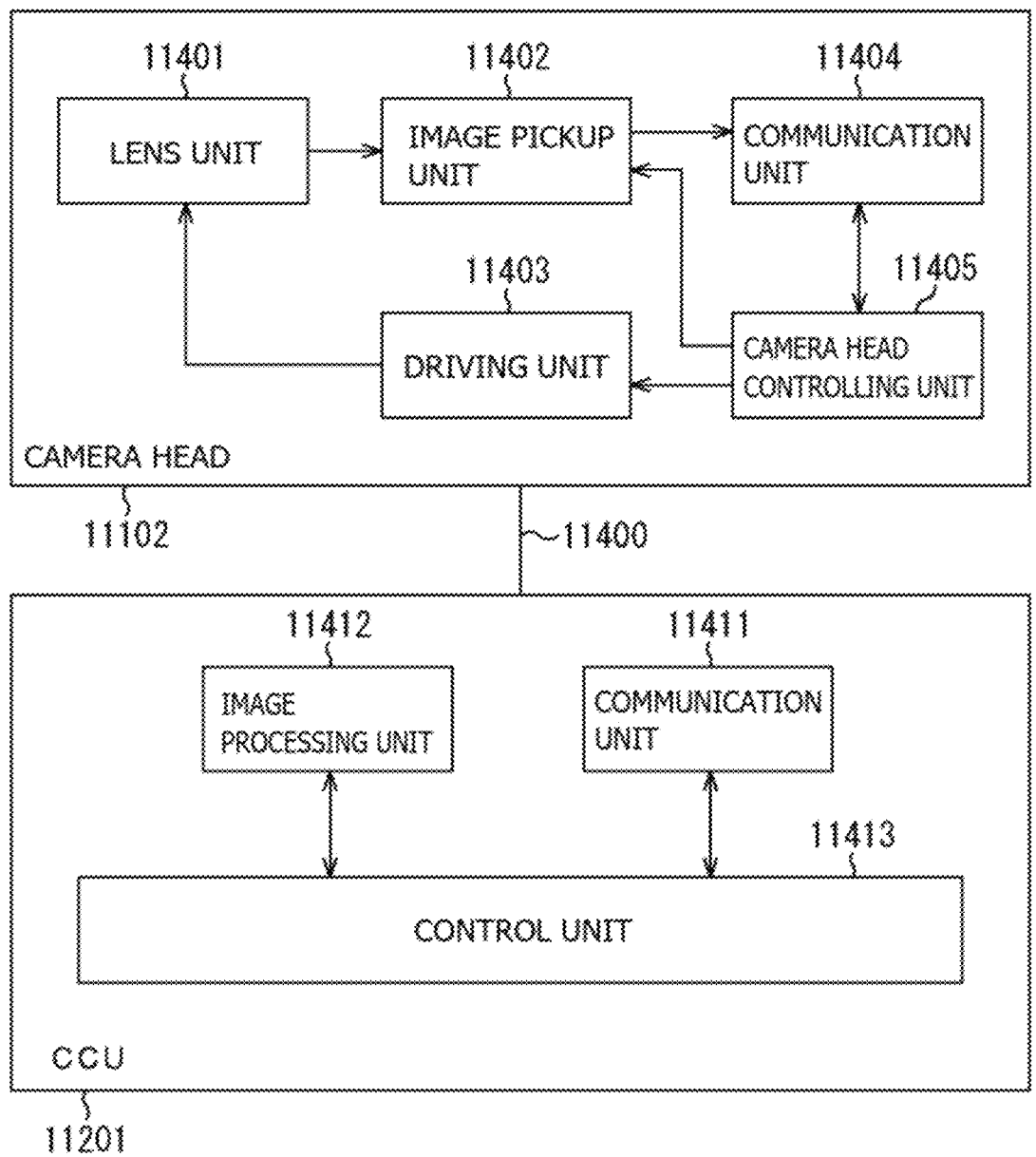
FIG. 57 is a block diagram depicting an example of a functional configuration of a camera head and a camera control unit (CCU).

FIG. 57 is a block diagram depicting an example of a functional configuration of the camera head 11102 and the CCU 11201 depicted in FIG. 56.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The above has described the example of the endoscopic surgery system to which the technology according to the present disclosure may be applied. The technology according to the present disclosure may be favorably applied to the image pickup unit 11402 provided to the camera head 11102 of the endoscope 11100 among the components described above. The application of the technology according to the present disclosure to the image pickup unit 11402 makes it possible to achieve the downsizing or higher definition of the image pickup unit 11402 and it is thus possible to provide the small or high-definition endoscope 11100.

Although the present disclosure has been described above with reference to the first to third embodiments, the modification examples 1 to 13 thereof, the application examples thereof, and the practical application examples thereof, the present disclosure is not limited to the embodiment and the like described above. A variety of modifications are possible. For example, the modification examples 1 to 3 described above have been described as modification examples of the first embodiment described above. However, the present modification examples 1 to 3 are also applicable to the second and third embodiments described above.

In addition, in the embodiment or the like described above, the example has been described in which the plurality of pixel drive lines 23 extends in the row direction and the plurality of vertical signal lines extends in the column direction, but the plurality of pixel drive lines 23 and the plurality of vertical signal lines may both extend in the same direction. In addition, the pixel drive lines 23 may extend as appropriate in a different direction such as the vertical direction.

Further, in the embodiment or the like described above, the present technology has been described by using, as an example, the imaging device having a three-dimensional structure, but this is not limitative. The present technology is applicable to any three-dimensional stacked semiconductor device subjected to large scale integration (LSI).

It is to be noted that the effects described herein are merely illustrative. The effects according to the present disclosure are not limited to the effects described herein. The present disclosure may have effects other than the effects described herein.

It is to be noted that the present disclosure may also have configurations as follows. According to the present technology having the following configurations, the notch is provided at at least one of the ends of the one surface of each of the plurality of wiring lines in the cross section orthogonal to the extending direction. The plurality of wiring lines is included in the first wiring layer. The plurality of wiring lines extends in the one direction. This increases the coverage of the first insulating film that covers the surface of the first wiring layer, making it possible to increase the reliability.

(1)

An imaging device including:

a first wiring layer including a plurality of first wiring lines that extends in one direction, the plurality of first wiring lines each having a notch at at least one of ends of one surface in a cross section orthogonal to an extending direction;
a first insulating film that covers a surface of the first wiring layer; and
a second insulating film that is stacked on the first insulating film, the second insulating film forming a gap between the plurality of adjacent first wiring lines.

(2)

The imaging device according to (1), in which the ends of the plurality of first wiring lines have angles of more than 0° with respect to tangent lines on upper surfaces of the plurality of respective first wiring lines.

(3)

The imaging device according to (1) or (2), in which
the plurality of first wiring lines has wiring intervals different from each other, and a plurality of grooves in which a plurality of the gaps is formed has depths different from each other in accordance with the wiring intervals different from each other, the plurality of the gaps being each provided between the plurality of first wiring lines.

(4)

The imaging device according to (3), in which
the plurality of first wiring lines has a first interval and a second interval as the wiring intervals different from each other, the second interval being wider than the first interval, and
a first groove in which each of first gaps is formed is deeper than a second groove in which each of second gaps is formed, the first gaps being provided at the first interval, the second gaps being provided at the second interval.

(5)

The imaging device according to any one of (1) to (4), in which
the plurality of first wiring lines has wiring intervals different from each other, and
the second insulating film covers side surfaces and bottom surfaces of a plurality of grooves in which a plurality of the gaps is formed and has thicknesses different from each other in accordance with the wiring intervals different from each other, the plurality of the gaps being each provided between the plurality of first wiring lines.

(6)

The imaging device according to (5), in which
the plurality of first wiring lines has a first interval and a second interval as the wiring intervals different from each other, the second interval being wider than the first interval, and
a thickness of the second insulating film that covers the side surfaces and the bottom surface of a first groove in which each of first gaps is formed is less than a thickness of the second insulating film that covers the side surfaces and the bottom surface of a second groove in which each of second gaps is formed, the first gaps being provided at the first interval, the second gaps being provided at the second interval.

(7)

The imaging device according to any one of (1) to (6), in which the plurality of first wiring lines is formed at pitches that are substantially same as each other.

(8)

The imaging device according to any one of (1) to (7), in which tops of the gaps are formed at a substantially same height as a surface height of the plurality of first wiring lines.

(9)

The imaging device according to any one of (1) to (8), in which bottoms of the gaps are formed at a substantially same depth as a bottom surface depth of the plurality of first wiring lines.

(10)

The imaging device according to any one of (1) to (9), in which tops of the gaps are formed at positions higher than a surface height of the plurality of first wiring lines each having the gaps formed on both sides.

(11)

The imaging device according to any one of (1) to (10), in which bottoms of the gaps are formed at positions deeper than a bottom surface depth of the plurality of first wiring lines.

(12)

The imaging device according to any one of (1) to (11), in which a plurality of the gaps each formed between the plurality of first wiring lines has widened sections that expand below bottoms of the plurality of first wiring lines from regions between the plurality of first wiring lines.

(13)

The imaging device according to any one of (1) to (12), in which a plurality of the gaps each formed between the plurality of first wiring lines is continuous to each other at bottoms of the plurality of first wiring lines.

(14)

The imaging device according to any one of (1) to (13), further including a second wiring layer that is formed below the first wiring layer with a third insulating film interposed in between, the second wiring layer including a plurality of second wiring lines extending in the one direction, in which
a plurality of the gaps each formed between the plurality of first wiring lines is formed to continuously extend to regions between the plurality of respective second wiring lines in the second wiring layer through the third insulating film.

(15)

The imaging device according to any one of (1) to (14), in which the second insulating film has irregularities above the plurality of first wiring lines.

(16)

The imaging device according to any one of (1) to (15), in which the second insulating film is formed by using a low dielectric constant material having a relative dielectric constant k of 3.0 or less.

(17)

The imaging device according to any one of (1) to (16), further including a fourth insulating film that is stacked on the second insulating film and has a planar surface.

(18)

The imaging device according to (17), in which the fourth insulating film is formed by using a material having a higher polishing rate than a polishing rate of the first insulating film.

(19)

The imaging device according to (17) or (18), in which the fourth insulating film is formed by using silicon oxide ($SiO_x$), SiOC, SiOF, or SiON.

(20)

The imaging device according to any one of (17) to (19), further including: a first electrically conducive film that is right opposed to at least a portion of the first wiring lines with the first insulating film, the second insulating film, and the fourth insulating film interposed in between; and
a fifth insulating film that is stacked on the fourth insulating film, in which the first electrically conducive film is formed to be buried in the fifth insulating film and a surface of the first electrically conducive film forms a plane flush with a surface of the fifth insulating film.

(21)

The imaging device according to (20), further including:

a first substrate including a sensor pixel on a first semiconductor substrate, the sensor pixel performing photoelectric conversion;

a second substrate including a readout circuit on a second semiconductor substrate, the readout circuit outputting a pixel signal based on electric charge outputted from the sensor pixel; and a third substrate including at least one of a logic circuit or a memory circuit on a third semiconductor substrate, the logic circuit processing the pixel signal, the memory circuit holding the pixel signal, in which the first substrate, the second substrate, and the third substrate are stacked in this order.

(22)

The imaging device according to (21), in which the second substrate further includes a multilayer wiring layer on a side facing the third substrate, the multilayer wiring layer including the fifth insulating film in which the first electrically conductive film is formed to be buried, the third substrate further includes a multilayer wiring layer on a side facing the second substrate, the multilayer wiring layer including a second electrically conducive film that forms a plane flush with a surface facing the second substrate, and the second substrate and the third substrate are further electrically coupled to each other by joining the first electrically conducive film and the second electrically conducive film.

(23)

The imaging device according to (22), in which the second substrate and the third substrate are electrically coupled to each other by Cu—Cu junction.

This application claims the priority on the basis of Japanese Patent Application No. 2020-121737 filed with Japan Patent Office on Jul. 15, 2020, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. An imaging device, comprising:

a first wiring layer including a plurality of first wiring lines that extends in one direction, the plurality of first wiring lines each having a notch at at least one of ends of one surface in a cross section orthogonal to an extending direction;

a first insulating film that covers a surface of the first wiring layer; and a second insulating film that is stacked on the first insulating film, wherein the first insulating film forms a plurality of gaps between adjacent first wiring lines included in the plurality of first wiring lines, wherein at least some of the first wiring lines included in the plurality of first wiring lines have wiring intervals that are different from each other, wherein grooves included in a plurality of grooves in which the plurality of gaps is formed have depths different from each other in accordance with the different wiring intervals, and wherein each gap included in the plurality of gaps is between a different pair of first wiring lines.

2. The imaging device according to claim 1, wherein the ends of the plurality of first wiring lines have angles of more than 0° with respect to tangent lines on upper surfaces of the plurality of respective first wiring lines.

3. An imaging device, comprising:

a first wiring layer including a plurality of first wiring lines that extends in one direction, the plurality of first wiring lines each having a notch at at least one of ends of one surface in a cross section orthogonal to an extending direction;

a first insulating film that covers a surface of the first wiring layer; and a second insulating film that is stacked on the first insulating film, wherein the first insulating film forms a plurality of gaps between adjacent first wiring lines included in the plurality of first wiring lines, wherein at least some of the first wiring lines included in the plurality of first wiring lines have wiring intervals that are different from each other, wherein the second insulating film covers side surfaces and bottom surfaces of a plurality of grooves in which a plurality of the gaps is formed and has thicknesses different from each other in accordance with the wiring intervals different from each other, the plurality of the gaps being each provided between the plurality of first wiring lines, wherein the plurality of first wiring lines has a first interval and a second interval as the wiring intervals different from each other, the second interval being wider than the first interval, and wherein a thickness of the first insulating film that covers the side surfaces and the bottom surface of a first groove in which each of first gaps is formed is less than a thickness of the second insulating film that covers the side surfaces and the bottom surface of a second groove in which each of second gaps is formed, the first gaps being provided at the first interval, the second gaps being provided at the second interval.

4. The imaging device according to claim 1, wherein the plurality of first wiring lines has a first interval and a second interval as the wiring intervals different from each other, the second interval being wider than the first interval, and a first groove in which each of first gaps is formed is deeper than a second groove in which each of second gaps is formed, the first gaps being provided at the first interval, the second gaps being provided at the second interval.

5. The imaging device according to claim 1, wherein the first wiring lines included in the plurality of first wiring lines have wiring intervals that are different from each other, and wherein the first insulating film covers side surfaces and bottom surfaces of a plurality of grooves in which a plurality of the gaps is formed and has thicknesses different from each other in accordance with the wiring intervals different from each other, the plurality of the gaps being each provided between the plurality of first wiring lines.

6. The imaging device according to claim 1, wherein the plurality of first wiring lines is formed at pitches that are substantially same as each other.

7. The imaging device according to claim 1, wherein tops of the gaps are formed at a substantially same height as a surface height of the plurality of first wiring lines.

8. The imaging device according to claim 1, wherein bottoms of the gaps are formed at a substantially same depth as a bottom surface depth of the plurality of first wiring lines.

9. The imaging device according to claim 1, wherein tops of the gaps are formed at positions higher than a surface height of the plurality of first wiring lines each having the gaps formed on both sides.

10. The imaging device according to claim 1, wherein bottoms of the gaps are formed at positions deeper than a bottom surface depth of the plurality of first wiring lines.

11. The imaging device according to claim 1, wherein a plurality of the gaps each formed between the plurality of first wiring lines has widened sections that expand below bottoms of the plurality of first wiring lines from regions between the plurality of first wiring lines.

12. The imaging device according to claim 1, further comprising a second wiring layer that is formed below the first wiring layer with a third insulating film interposed in between, the second wiring layer including a plurality of second wiring lines extending in the one direction, wherein
a plurality of the gaps each formed between the plurality of first wiring lines is formed to continuously extend to regions between the plurality of respective second wiring lines in the second wiring layer through the third insulating film.

13. The imaging device according to claim 1, wherein the second insulating film has irregularities above the plurality of first wiring lines.

14. The imaging device according to claim 1, wherein the second insulating film is formed by using a low dielectric constant material having a relative dielectric constant k of 3.0 or less.

15. The imaging device according to claim 1, further comprising a fourth insulating film that is stacked on the second insulating film and has a planar surface.

16. The imaging device according to claim 15, wherein the fourth insulating film is formed by using a material having a higher polishing rate than a polishing rate of the first insulating film.

17. The imaging device according to claim 15, wherein the fourth insulating film is formed by using silicon oxide (SiO$_x$), SiOC, SiOF, or SiON.

18. The imaging device according to claim 3, wherein the first wiring lines included in the plurality of first wiring lines have wiring intervals that are different from each other, and
wherein grooves included in a plurality of grooves in which the plurality of the gaps is formed have depths different from each other in accordance with the different wiring intervals, wherein the gaps are each provided between the first wiring lines.

19. An imaging device, comprising:
a first wiring layer including a plurality of first wiring lines that extends in one direction, the plurality of first wiring lines each having a notch at at least one of ends of one surface in a cross section orthogonal to an extending direction;
a first insulating film that covers a surface of the first wiring layer; and
a second insulating film that is stacked on the first insulating film,
wherein the first insulating film forms a plurality of gaps between adjacent first wiring lines included in the plurality of first wiring lines, and wherein the gaps included in the plurality of gaps are continuous to each other at bottoms of the plurality of first wiring lines.

20. An imaging device, comprising:
a first wiring layer including a plurality of first wiring lines that extends in one direction, the plurality of first wiring lines each having a notch at at least one of ends of one surface in a cross section orthogonal to an extending direction;
a first insulating film that covers a surface of the first wiring layer;
a second insulating film that is stacked on the first insulating film;
a fourth insulating film that is stacked on the second insulating film and has a planar surface,
wherein the first insulating film forms a plurality of gaps between adjacent first wiring lines included in the plurality of first wiring lines;
a first electrically conducive film that is right opposed to at least a portion of the first wiring lines with the first insulating film, the second insulating film, and the fourth insulating film interposed in between; and
a fifth insulating film that is stacked on the fourth insulating film,
wherein the first electrically conducive film is buried in the fifth insulating film and a surface of the first electrically conducive film forms a plane flush with a surface of the fifth insulating film.

21. The imaging device according to claim 20, further comprising:
a first substrate including a sensor pixel on a first semiconductor substrate, the sensor pixel performing photoelectric conversion;
a second substrate including a readout circuit on a second semiconductor substrate, the readout circuit outputting a pixel signal based on electric charge outputted from the sensor pixel; and
a third substrate including at least one of a logic circuit or a memory circuit on a third semiconductor substrate, the logic circuit processing the pixel signal, the memory circuit holding the pixel signal, wherein
the first substrate, the second substrate, and the third substrate are stacked in this order.

22. The imaging device according to claim 21, wherein the second substrate further includes a multilayer wiring layer on a side facing the third substrate, the multilayer wiring layer including the fifth insulating film in which the first electrically conducive film is formed to be buried,
the third substrate further includes a multilayer wiring layer on a side facing the second substrate, the multilayer wiring layer including a second electrically conducive film that forms a plane flush with a surface facing the second substrate, and
the second substrate and the third substrate are further electrically coupled to each other by joining the first electrically conducive film and the second electrically conducive film.

23. The imaging device according to claim 22, wherein the second substrate and the third substrate are electrically coupled to each other by Cu—Cu junction.

* * * * *